(12) United States Patent
Burtsev et al.

(10) Patent No.: US 6,298,433 B1
(45) Date of Patent: Oct. 2, 2001

(54) DATA FLOW COMPUTER INCORPORATING VON NEUMANN PROCESSORS

(76) Inventors: Vsevolod Sergeevich Burtsev, 49, 4, Gubkina str., Moscow, 117333; Eduard V. Sizko, 506, 16/2, Zadonsky pr., Gubkina str., Moscow, 119666; Vladimir K. Erschov, 66, 1, Glavmosstoja str., Moscow, 119618; Lev A. Koslov, 53, 22/24, Loenaja str., Moscow, 124047; Vladimir P. Torchigan, 257, 82, Leninsky pr., Moscow, 117421; Vjacheslav B. Fyodorov, 113, 95/2, Vernadskogo pr., Moscow, 117296; Julia N. Nikolskaia, 138, 13, Leninsky pr., Moscow, 117071; Larisa G. Tarasenko, 422, 12, Tallinskaja str., Moscow, 123458, all of (RU)

( * ) Notice: Subject to any disclaimer, the term of this patent is extended or adjusted under 35 U.S.C. 154(b) by 0 days.

(21) Appl. No.: 09/252,278

(22) Filed: Feb. 18, 1999

(30) Foreign Application Priority Data

Feb. 20, 1998 (RU) .................................................. 98102944

(51) Int. Cl.$^7$ ...................................................... G06F 13/00
(52) U.S. Cl. .................... 712/201; 712/1; 712/18
(58) Field of Search ................... 712/18, 201, 1; 385/16

(56) References Cited

U.S. PATENT DOCUMENTS

| | | | | |
|---|---|---|---|---|
| 4,780,820 | * | 10/1988 | Sowa ........................................ 712/1 |
| 4,814,978 | * | 3/1989 | Dennis .................................... 712/201 |
| 5,241,635 | * | 8/1993 | Papadopoulos et al. ............ 712/201 |
| 5,771,320 | * | 6/1998 | Stone ..................................... 385/16 |

* cited by examiner

Primary Examiner—Zarni Maung
Assistant Examiner—Wen-Tai Lin
(74) Attorney, Agent, or Firm—John G. Costa

(57) ABSTRACT

The invention relates to computer science, in particular, to computer systems using data flow control over computations and to the further inclusion of processing means utilizing the von Neumann principle of computation resulting in an improvement of performance and a decrease in the volume (size) of associative memory.

2 Claims, 46 Drawing Sheets

| CC | | | | | | | A1 | A2 |
|---|---|---|---|---|---|---|---|---|
| COP | K | G | T | I | F | | | |
| | | | | | NB | NF | | |

Figure 44

DATA FLOW COMPUTER INCORPORATING VON NEUMANN PROCESSORS

This application claims priority of Russian Federation patent application 98102944 which was filed Feb. 20, 1998.

INTRODUCTION

The invention relates to computer science and, in particular, to computing devices that use dataflow control for information processing especially for use in high performance digital computing systems.

BACKGROUND OF THE INVENTION

There is a known computer system, which contains a processor and a group of processor devices, the inputs and outputs of which are connected with the corresponding inputs and outputs of a switching net. This system uses data flow control for the organization of the computation process. Effective loading of the processor devices is responsible for the level of performance. This is achieved by use of parallel instruction processing on all parts of the routine and is supported by a programmed organization of computations wherein the initial routine is mapped as a graph in which each node represents the functional dependence of one instruction on the performance of another instruction and the arcs define the directions of result transmission. Each of a set of processor devices, connected among themselves by a switching net, process the fixed local part of a routine. The processor devices work in parallel and the necessary synchronization between the parts of the processed routine is performed by means of data transmitted between the devices through the switching net. The absence of access of each of the processor devices to the entire routine and the necessity of mutual synchronization of its locally processed parts leads to inefficient losses of working time of the processor devices and hence to a reduction in performance of the system. (U.S. Pat. No. 4,814,978)

The known computer system that is closest to the invention disclosed in this application contains N processors, first and second switches, N modules of associative memory, a buffering block, first to third information inputs, control input and first and second information outputs. The first control outputs and address outputs of the i-th processor are connected correspondingly with the i-th input of the first group of control inputs and with the i-th input of the first group of address inputs of the first switch. The first and second information outputs of the i-th processor unit are connected with the corresponding i-th input of the first group of information inputs of the first switch. The first information, address, control and the second information, address and control inputs of the i-th processor are connected with the first and second information inputs of the system. The control input of the system is connected with the control input of the first switch and with the third control input of the i-th processor. The control output of the first switch is connected with the fourth control input of the i-th processor. The third information output of the processor is connected with the first information output of the system. The first control, first information, second control and second information outputs of the i-th group of exchange outputs of the second switch are connected correspondingly with the fifth control, third information, sixth control and fourth information inputs of the i-th processor. The first group of control outputs of the second switch is connected with the first group of control inputs of the buffering block. The second group of control outputs of the second switch is connected with the second group of control inputs of the buffering block. The control inputs of the second switch and of the buffering block and the first control input of each module of associative memory are connected with the control input of the system. The i-th inputs of the first and second groups of control inputs of the second switch are connected correspondingly with the second and third control outputs of the i-th processor. The seventh and eighth control inputs of the i-th processor are connected correspondingly with the i-th outputs of the first and second groups of control outputs of the buffering block. The third group of control outputs and the first group of information outputs of the buffering block are connected correspondingly with the third group of control inputs and the first group of information inputs of the second switch. The second group of information outputs of the buffering block is connected with the second information output of the system. The fourth group of control inputs of the second switch is connected with the fourth group of control outputs of the buffering block. The i-th input of the first group of information inputs of the buffering block is connected with the fourth and fifth information outputs of the i-th processor. The fourth control output of i-th processor is connected with the i-th input of the third group of control inputs of the buffering block. The third group of information outputs of the buffering block is connected with the second group of information inputs of the second switch. The first control output of the i-th module of associative memory is connected with the i-th input of the second group of control inputs of the first switch. The i-th output of the group of information outputs of the first switch is connected with the information input of the i-th module of associative memory. The information and second control outputs of the i-th module of associative memory are connected with the i-th inputs of the second group of information inputs and the fourth group of control inputs of the buffering block. The third group of information inputs of the buffering block is connected with the third information input of the system. And, the i-th output of the group of control outputs of the first switch is connected with the second control input of the i-th module of associative memory. (PCT/RU 96/00347)

This system provides information processing without any inter-processor exchange, hence, decreasing the time for program processing. Furthermore, this system allows the failure of one or more of the processors without interrupting the work of the system on the whole. A high level of performance is achieved due to the increased loading of the processors which results in a decrease in the time required for running routines. A high degree of parallelism is achieved automatically and the need to distribute groups of parallel processes from each routine among the processors is obviated.

However, this system fails to provide high performance in running routines, or parts of routines, which have a low level of inner parallelism. For example, the sequential performance of routine instructions is not executed as efficiently with this system as it is with a system that utilizes the traditional von Neumann principle of data processing.

Moreover, this device uses dataflow for control of the computation process and associative memory hardware for storage of data and results. The associative memory simultaneously performs the function of control means hardware. Accordingly, since there is no loss of time on the processes of memory distribution, performance increases.

However, the performance of the system depends directly on the associative memory and is defined by the rate of data output from associative memory in a unit of time. The number of operands output and ready for processing in a unit of time is defined by N=1/Tam, where Tam=time of work of associative memory from the moment of inquiry to the output of data.

The value Tam depends directly on the volume (or size) of associative memory. Since Tam, measured from the time of inquiry from a running routine, increases as the size of the associative memory increases, the performance of the device decreases as the size of the associative memory increases.

Thus, the device fails to achieve a high level of performance when large volumes of running routines with low levels of inner parallelism are processed.

SUMMARY OF THE INVENTION

It is an object of the invention to increase performance by decreasing the volume of associative memory while at the same time introducing the local use of data processing according to von Neumann principals of computation without violating the common idea of dataflow control of computation.

The problem is solved this way. The computer system contains N processor units, a first switch, an second switch, N modules of associative memory, a buffering block, first to third information inputs, control input and first and second information outputs. The first control output and address output of the i-th processor unit (i=1 . . . N) are connected correspondingly with the i-th input of the first group of control inputs and with the i-th input of the group of address inputs of the first switch. The first and second information outputs of the i-th processor unit are connected with the corresponding i-th input of the first group of information inputs of the first switch. The first information, address, and control inputs and the second information, address, and control inputs of the i-th processor unit are connected with the first and second information inputs of the system. The first control input of the system is connected with the control input of the first switch and with the third control input of the i-th processor unit. The control output of the first switch is connected with the fourth control input of the i-th processor unit. The third information output of the i-th processor unit is connected with the first information output of the system.

The first control, first information, second control and second information outputs of the i-th group of exchange outputs of the second switch are connected correspondingly with the fifth control, third information, sixth control and fourth information inputs of the i-th processor unit. The first group of control outputs of the second switch is connected with the first group of control inputs of the buffering block. The second group of control outputs of the second switch is connected with the second group of control inputs of the buffering block. The control inputs of the second switch and of the buffering block and the first control input of each module of associative memory are connected with the control input of the system. The i-th inputs of the first and second groups of control inputs of the second switch are connected correspondingly with the second and third control outputs of the i-th processor unit. The seventh and eighth control inputs of the i-th processor unit are connected correspondingly with the i-th outputs of the first and second groups control outputs of the buffering block. The third group of control outputs and the first group of the information outputs of the buffering block are connected correspondingly with the third group of control inputs and the first group of information inputs of the second switch. The second group of information outputs of the buffering block is connected with the second information output of the system. The fourth group of control inputs of the second switch is connected with the fourth group of control outputs of the buffering block. The i-th input of the first group of information inputs of the buffering block is connected with the fourth and fifth information outputs of the i-th processor unit. The fourth control output of i-th processor unit is connected with the i-th input of the third group of control inputs of the buffering block. The third group of information outputs of the buffering block is connected with the second group of information inputs of the second switch. The first control output of the i-th module of associative memory is connected with the i-th input of the second group of control inputs of the first switch. The i-th output of the group of information outputs of the first switch is connected with the information input of the i-th module of associative memory. The information and the second control outputs of the i-th module of associative memory are connected with the i-th inputs of the second group of information inputs and the fourth group of control inputs of the buffering block. The third group of information inputs of the buffering block is connected with the third information input of the system. And, the i-th output of the group of control outputs of the first switch is connected with the second control input of the i-th module of associative memory.

There are N fragment routine processing units, a first additional switch and a second additional switch, and an additional buffering block. A control unit of the first switch is connected with the first control input of the i-th fragment routine processing unit. The first information input of the i-th fragment routine processing unit is connected with the first information input of the system.

The control input of the system is connected with control inputs of the first and second additional switches, of the additional buffering block, and of the second control unit of the i-th fragment routine processing unit.

The third control input of i-th fragment routine processing unit is connected with the i-th output of the group of control outputs of the second additional switch. The i-th output of the group of information outputs of the second additional switch is connected with the second information input of the i-th fragment routine processing unit. The third information input of the i-th fragment routine processing unit is connected with the information output of the i-th group of exchange outputs of the first additional switch. The control input of the i-th group of exchange outputs of the first additional switch is connected with the fourth control input of the i-th fragment routine processing unit. The first control output of the i-th fragment routine processing unit is connected with the i-th input of the first group of control inputs of the second additional switch and with the i-th input of the first group of control inputs of the first additional switch. The second group of control inputs of the first additional switch is connected with the first group of control outputs of the additional buffering block. The first group of information outputs of the additional buffering block is connected with the group of information inputs of the first additional switch. The group of control outputs of the first additional switch is connected with the first group of control inputs of the additional buffering unit. The second group of control outputs of the additional buffering unit is connected with the second group of control inputs of the second additional switch. The group of address inputs and the group of information inputs of the second additional switch are connected with the second group of information outputs of the additional buffering block. The second group of control inputs of the additional buffering block is connected with the control output of the second additional switch. The information output and second control output of the i-th module of associative memory are connected correspondingly with the i-th inputs of the group of information inputs and of the third group of control inputs of the additional buffering block. And, the second control, address and information outputs of the i-th fragment routine processing unit are connected correspondingly with the i-th inputs of the third group of control, second group of address and second group of information inputs of the first switch.

More over, the fragment routine processing unit contains executive unit, output register unit, loading register unit, input register unit, control unit and first switch. The information output of executive unit is connected with the information input of the output register unit. The first control input of the output register unit is connected with the first control input of the fragment routine processing unit. The second control input of the fragment routine processing unit is connected with the first control input of executive unit, the second control input of output register unit, the first control input of the control unit, the first control input of loading register unit and with the first control input of input register unit. The first control output of the input register unit is connected with the second control input of the control unit and with the first control output of the fragment routine processing unit. The first information input of the fragment routine processing unit is connected with the information input of the loading register unit. The information output of the loading register unit and the information output of the input register unit are connected with the information input of the executive unit. The second control input of the executive unit is connected with the first control output of the output register unit, the first control output of loading register unit and the second control output of the input register unit. The third control output of the input register unit, the second control output of the loading register unit, and the second control output of output register unit are connected with the third control input of the executive unit. The first control output of the executive unit is connected with the second control input of the loading register unit, the second control input of the input register unit and the third control input of the output register unit. The third control output of the output register unit is connected with the second control output of the fragment routine processing unit. The second information input of the fragment routine processing unit is connected with the first information input of the first switch. The information output of the first switch is connected with the information input of the input register unit. The third control input of the input register unit, the third control input of the loading register unit and the fourth control input of the output register unit are connected with the second control output of the executive unit. The third control output of the executive unit is connected with the fourth control input of input register unit, with the fourth control input of the loading register unit and the fifth control input of the output register unit. The address and information outputs of the output register unit are connected correspondingly with the address and information outputs of the fragment routine processing unit. The third control input of the fragment routine processing unit is connected with the third control input of the control unit. The fourth control input of the control unit is connected with the fourth control input of the fragment routine processing unit. The third information input of the fragment routine processor is connected with the second information input of the first switch. The first and second control inputs of the first switch are connected correspondingly with the first and second control outputs of the control unit. The third control output of the control unit is connected with fifth control input of the input register unit. The sixth control input of the input register unit, the fifth control input of the loading register unit, and the sixth control input of the output register unit are connected with the fourth control output of the executive unit. The fifth control output of the executive unit is connected with the seventh control input of the output registers. The essence of the invention is that the inclusion of the fragment routine processing unit, the first and second additional switches, and the additional buffering block and the organization of the corresponding connections provide an increased performance of the computer in processing main routines by means of increasing the speed of exchange of associative memory through a decrease in its working volume and in processing fragment routines (routines with a low level of inner parallelism) by means of the von Neumann principle of computation and results in a significant improvement in the number of efficiently processed routines.

The dataflow control principle of computation is used for running the overall program being executed. The main routines are processed using the principles of data flow control over the computation process. Fragment routines, which have a low level of inner parallelism, are extracted. Fragments having a local character of computation and low parallelism, such as fragments in the form of trigonometric or other functions not directly connected with analogous fragments are processed using the von Neumann principles of computation. Processing of the fragment routines is performed without participation of associative memory, which contributes to the decrease in the size of the associative memory. The expenditure of working time for task (or fragment routine) distribution among the processor units is minimized. In contrast to traditional multiprocessor systems that use only the von Neumann principles of computation, the disclosed system does not require a corresponding operational system for the distribution of tasks.

BRIEF DESCRIPTION OF THE FIGURES

The invention is illustrated by an example of its application and the attached figures, where:

FIG. 44 represents an information package structure.

DETAILED DESCRIPTION OF THE INVENTION

This application introduces a new architecture for a computing system that utilizes the principle of data flow processing. In particular, the system utilizes data flow control processing to processes the main routines of a program being executed and the von Neumann principle of data processing to process fragment routines.

The dataflow control principle of computation is used for running the overall program being executed. The main routines are processed using the principles of data flow control over the computation process. Fragment routines, which have a low level of inner parallelism, are extracted. Fragments having a local character of computation and low parallelism, such as fragments in the form of trigonometric or other functions not directly connected with analogous fragments are processed using the von Neumann principles of computation. Processing of the fragment routines is performed without participation of associative memory.

The program scheme of a dataflow system is described as a graph consisting of nodes and arcs connecting the nodes. The nodes represent operations and the arcs represent the path of tokens through the system. The information represented by a node is assembled into packets.

Tokens of information are words that are subdivided into a number of fields. Fields may include an opcode field to represent the operation to be performed on the data, one data field to represent the information to be processed, one or two destination fields to represent one or more destinations or nodes to which the results of processing are directed, and other fields to represent the context of program execution, tags or keys to be used for identification during processing, etc. Keys or tags are used to identify the iteration being performed, the individual tokens of a pair destined for the same node, etc.

Packets of information also are words that are subdivided into a number of fields. A packet a may contain one or two data fields.

Thus, a program written according to a dataflow graph will indicate the direction in which the data is transferred during processing. Each node processes the input data and yields one or more results destined to a system output or to one or more other nodes.

Figure 1:
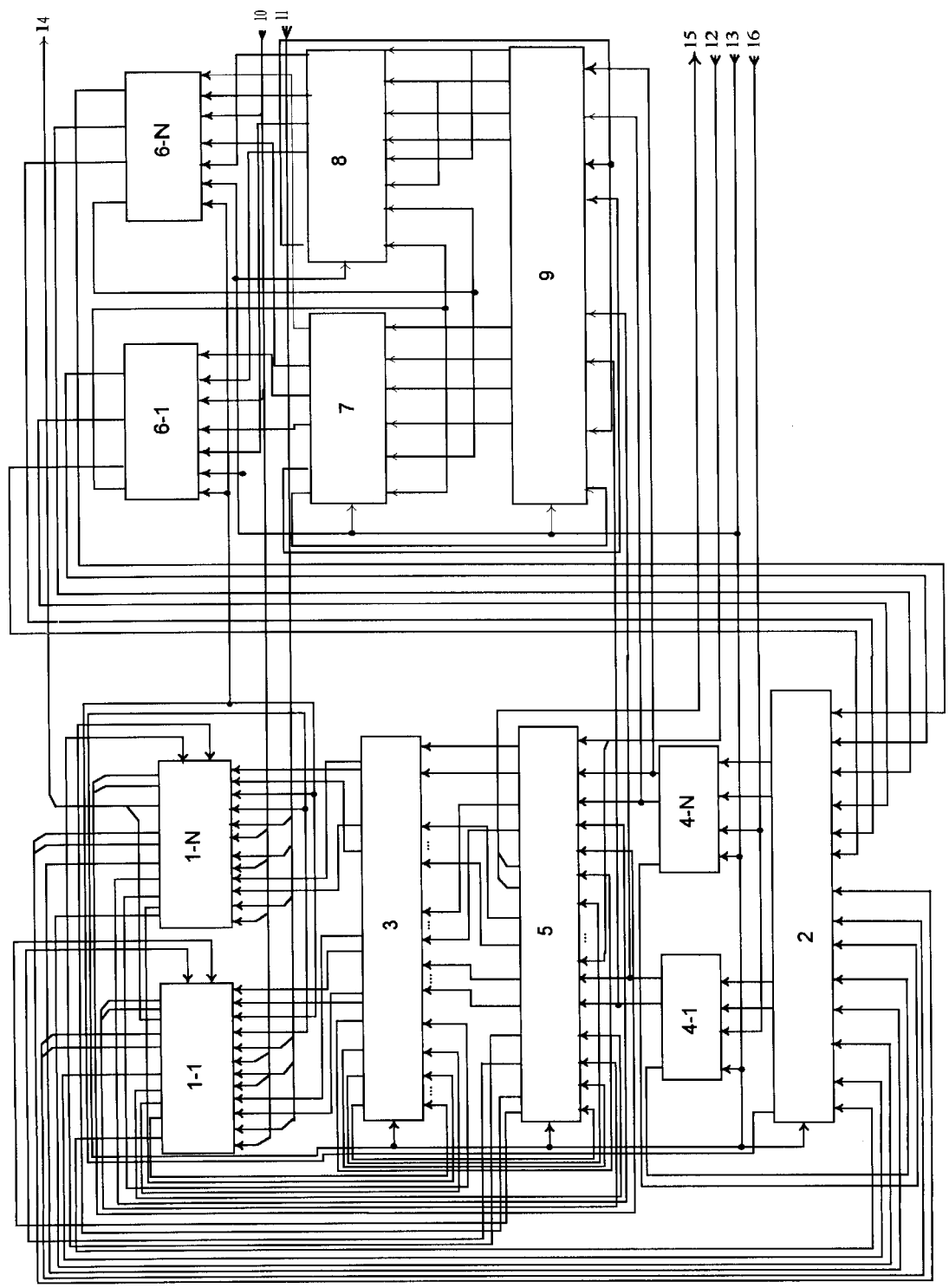
FIG. 1 is a diagram of a system of the invention.
Figure 45:
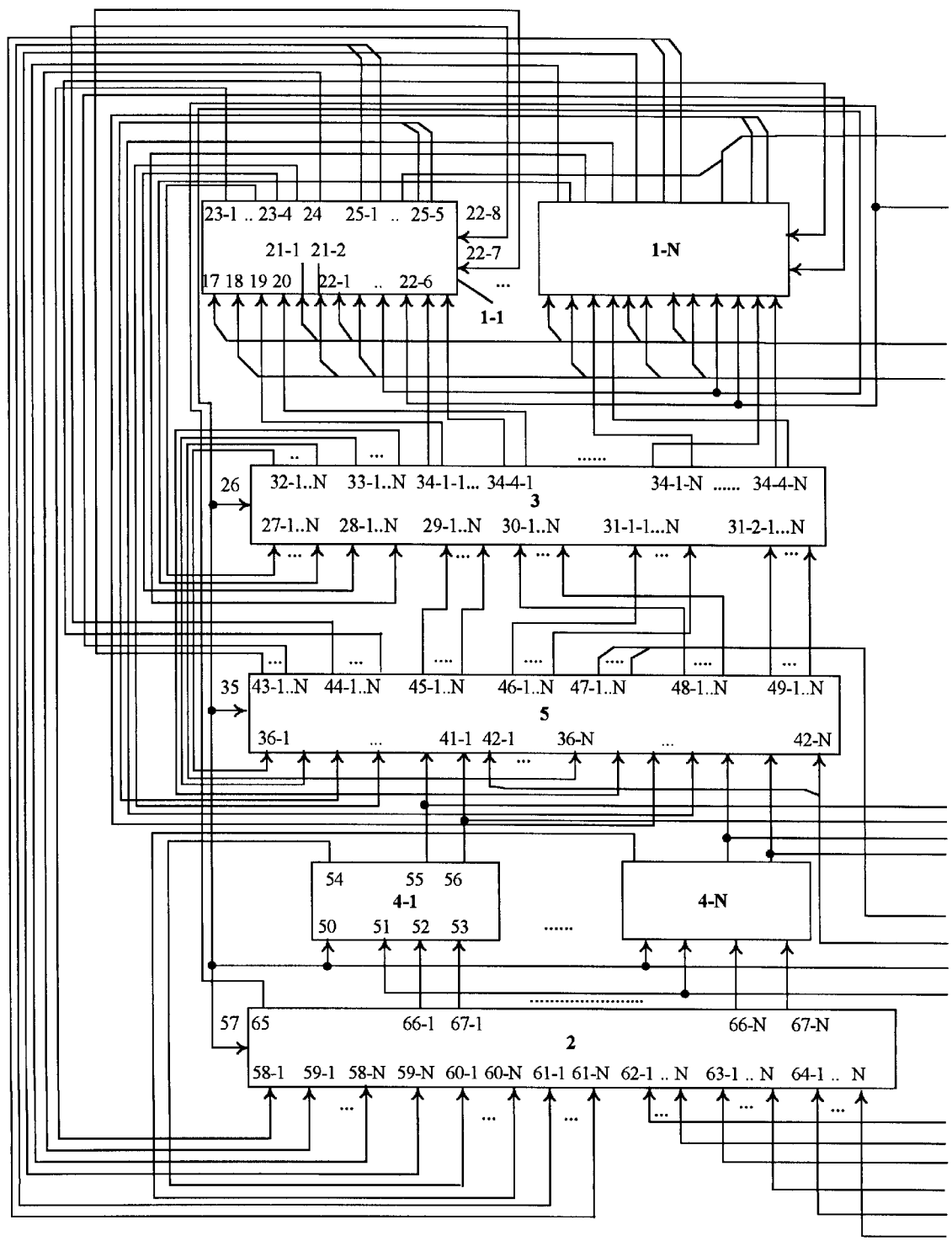
FIG. 45 is a schematic of the data flow processor portion of a system of the invention.

Referring to FIGS. 1 and 45, the data flow portion of the system disclosed comprises N processor units 1-i where N is a positive integer (i=1, ... N), first switch 2, second switch 3, buffering block 5, and M associative memory modules 4-i where M is a positive integer (i=1, M).

Buffering block 5 is used to smooth peaks of the input queries on the inputs of the second switch 3. The use of buffering block 5 in the starting process is its additional function.

In general, the data flow portion of the system comprises at least one processor unit, at least one associative memory module at least one first switch and at least one second switch. The functions of the buffering block may be carried out by separate buffering means, such as, for example, buffering block (5), or by buffering means incorporated in other units of the system, such as, for example, a second switch.

In a system with more than one processor unit, the design and configuration of each processor unit is preferably the same as the design and configuration of every other processor unit. This affords certain advantages. For example, if one or several processors in a system fail, the system will still operate without need for adjustment by the user or programmer. Each processor unit comprises local or command instruction memory units, which may be subdivided into smaller subunits, which in turn may be dedicated to a particular executive device. A processor unit may comprise any number of executive devices. Preferably, in a given processor unit, each executive device is best suited to processing a particular type of information. For example, each processor unit may comprise two executive devices and local command instruction memory subunits dedicated to each executive device, wherein one executive device is best suited to processing control instructions and the other executive unit is best suited to processing operands.

The entire command instruction set of the program being executed is loaded into each processor unit. Preferably, in a processor unit with more than one executive device and with a local memory subunit dedicated to each executive device, those instruction used only by a given executive device are loaded only into the memory subunit dedicated to that executive device.

Packets destined for processing in the processor units are directed through the buffering block to the second switch. The buffering block identifies each packet on the basis of the type of data contained in the packet. Identified packets are directed to the second switch, either immediately, or after storage in a buffer until later forwarding. For example, the buffering block may distinguish packets containing operands from packets containing control instructions. In another example, the buffering block may comprise at least one buffer dedicated to receiving operand packets and at least one buffer dedicated to receiving control instructions.

The second switch sequentially distributes each packet received to the next available processor unit. Preferably, each packet is directed not only to the next available processor unit but also is directed specifically to the executive device best adapted for the processing of the packet on the basis of packet type. Transmission from the second switch to a processor unit is determined by a "free address" switching regime. That is, control signals direct transmission of information from the second switch to a free processor unit. That is, the system comprises free address switching means to transmit information from a second switch to a free processor unit. For example, the transmission may be directed by the presence of a free register.

Packets received in an executive device are processed and the results of processing are obtained. If a result is a final result, that is, it is not destined for another node, the result is directed to an output of the system. If the result is a single input result, that is, it is destined to be the only input in a subsequent node, the result is sent directly to the buffering block for further processing. If the result is a double input result, that is, it is destined to be one of two inputs in a subsequent node, the result is sent indirectly to the buffering block, through the first switch and the associative memory, for further processing.

Each token received by the first switch must be matched with its pair for further processing. The first switch utilizes a key on each token received to determine if the token's pair is already stored in associative memory. If the pair is found, the two tokens are paired together into a packet. Packets are directed to the buffering block, either immediately, or after storage in associative memory until later forwarding. If the received tokens pair is not found, the token is directed to and stored in associative memory to await the arrival of its pair. The transmission of a token from a processor unit to an associative memory module is determined by a "fixed address" switching regime. That is, the system comprises fixed address switching means to transmit information from a processor unit to an associative memory module.

For example, an associative memory unit may comprise more than one module of associative memory. In this instance, a token is directed to a specific module or location of associative memory on the basis of a key encoded in the token. Each token of a pair is encoded with the same key in order to facilitate the pairing of tokens. Preferably, the number of the module is determined from the key encoded on the token utilizing a hashing function. Also, preferably, the hashing function is implemented in hardware and applied in the processor unit.

Preferably, the second switch and/or the first switch utilize an optical system, such as a dimensional or spatial optical system, to facilitate switching. That is, preferably, the system comprises at least one optical system to facilitate switching. For example, each first switch comprises a dimensional optical system. The dimensional optical system comprises a transformer-transmitter, a laser emitter, a photo-receiver, and a transformer-receiver. The optical system may also comprise a controlled deflector, a first group of lens rasters, a controlled optical transparency, and a second group of optical lens rasters. A packet or token is transmitted to an input register. Parallel code from the input register is transmitted to a transformer-transmitter in which the parallel code is transformed to serial code that is transmitted to the laser emitter. A laser signal corresponding to the serial code is transmitted through an optical system to a photo-receiver, and from the photo-receiver to a transformer-receiver in which the serial code is transformed to a parallel code corresponding to the packet or token received at the input register.

Figure 46:
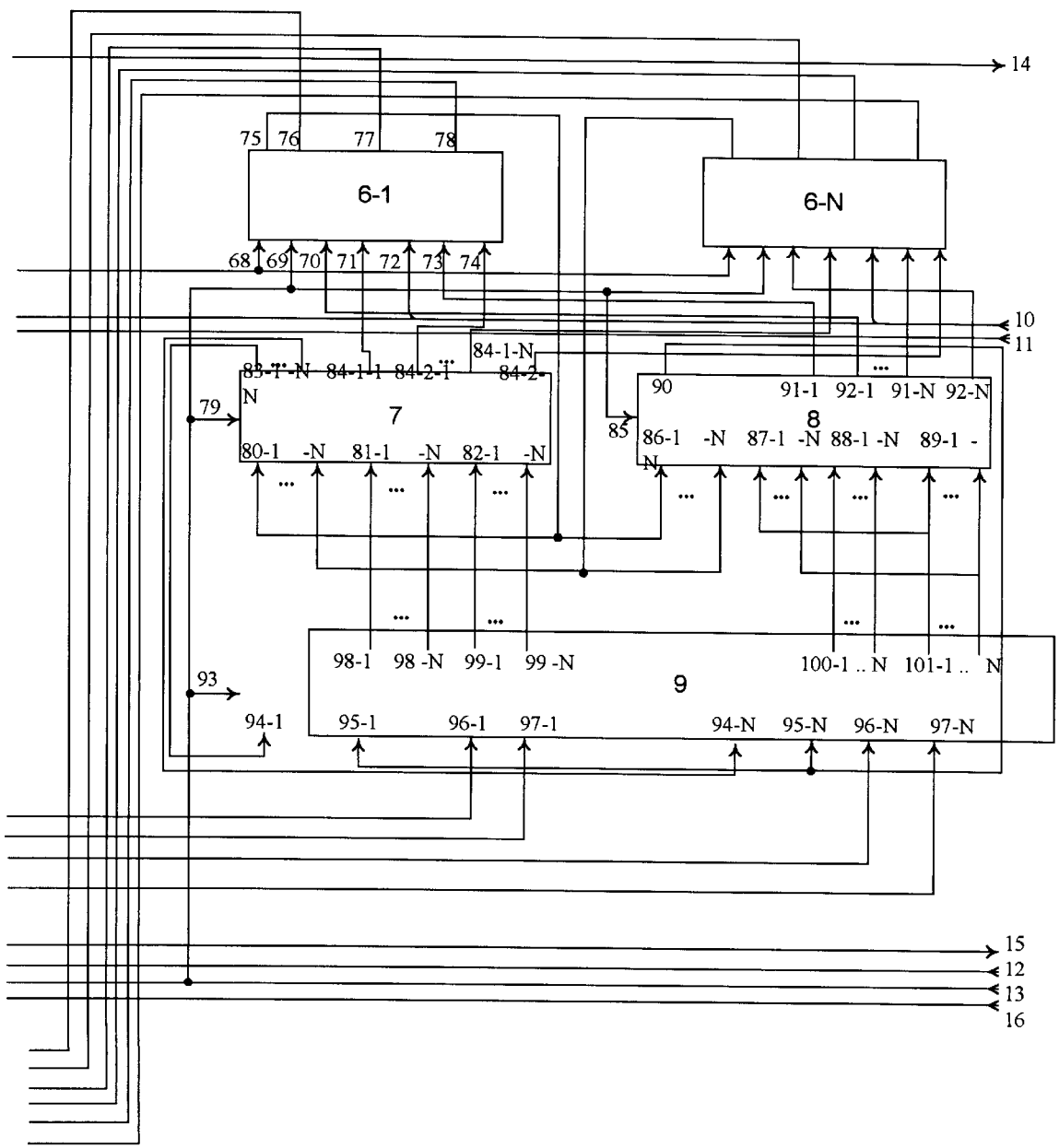
FIG. 46 is a schematic of the fragment routine processing unit portion of a system of the invention.

Referring to FIGS. 1 and 46, the fragment routine processing unit portion of the system disclosed comprises a group of fragment routine processor units 6-1 . . . 6-N, first additional switch 7, second additional switch 8, and additional buffering block 9.

In general, the fragment routine processing unit potion of the system disclosed comprises at least one fragment routine processor unit, at least one first additional switch, at least one second additional switch 8, and at least one additional buffering block.

When a packet output from associative memory is a starting package for the processing of a fragment routine the bits of the functional fields are transmitted to buffer unit 9. In all other respects the further work of transmission of the starting package for fragment F is carried out according to the above mentioned transmission of a package from an output of buffer unit 5 through first additional switch 7 to fragment routine processing unit 6-i.

The first additional switch 7 functions to select the first free unit 6-k from the group of fragment routine processing units (6-1 . . . 6-N).

In contrast to the processor units 1-1 . . . 1-N, where each package processed is addressed to the associative memory modules 4-1 . . . 4-N, in each fragment routine processing unit definite parts (fragments) of the main routine are completely processed and only final results are transmitted to the associative memory modules 4-1 . . . 4-N.

Loading of routines (corresponding to the von Neumann principles of processing) is performed at the time of initial loading of the computer system. Instructions and data of fragments of running routines are loaded in memory 495.

The result of processing of the fragment F is transmitted from unit 6-k to first switch 2 and then back to the associative memory module 4-j where the starting instruction for the processing of fragment F originated.

The format of the output of unit 6-k is the same as that of a half-package resulting from the processing of instructions in processor device 1-i. This permits the combining of the data resulting from the processing of fragment F with the common fields of the running routine.

THE BEST WAY TO IMPLEMENT THE INVENTION

The computer system (FIG. 1) contains a group of processor units 1-1 . . .1-N, a first switch 2, an second switch 3, a group of associative memory modules 4-1 . . . 4-N, buffering block 5, a group of fragment routine processor units 6-1 . . . 6-N, first additional switch 7, second additional switch 8, and additional buffering block 9.

The computer system also contains the first, second and third information inputs 10, 11 and 12, control input 13, the first and second information outputs 14–15 and memory zeroizing input 16.

Referring to FIG. 45, each processor unit 1-i contains the first, second, third and fourth information inputs 17, 18, 19 and 20, the first and second address inputs 21-1 and 21-2, the first to the eighth control inputs 22-1 . . . 22-8 respectively, the first to the fourth control outputs 23-1 . . . 23-4, an address output 24 and the first to the fifth information outputs 25-1 . . . 25-5.

Second switch 3 contains control input 26, the first to the fourth groups of control inputs 27-1 . . . 27-N, 28-1 . . . 28-N, 29-1 . . . 29-N, 30-1 . . . 30-N, the first and second groups of information inputs 31-1-1 . . . 31-1-N and 31-2-1 . . . 31-2-N, the first and the second groups of control outputs 32-1 . . . 32-N and 33-1 . . . 33-N; N groups of exchange outputs, each of which includes the first control, first information, the second control and the second information outputs 34-1-i, 34-2-i, 34-3-i, and 34-4-i respectively.

Buffering block 5 contains control input 35, the first and the second groups of control inputs 36-1 . . . 36-N and 37-1 . . . 37-N, the first group of information inputs 38-1 . . . 38-N, the third group of control inputs 39-1.39-N, the second group of information inputs 40-1 . . . 40-N, the fourth group of control inputs 41-1 . . . 41-N, and the third group of information inputs 42-1 . . . 42-N. Buffering block 5 also contains the first to the third groups of control outputs 43-1 . . . 43-N, 44-1 . . . 44-N, 45-1 . . . 45N, the first and the second groups of information outputs 46-1 . . . 46-N and 47-1 . . . 47-N, the fourth group of control outputs 48-1 . . . 48-N and the third group of information outputs 49-1 . . . 49-N.

Each associative memory module 4-i contains first control input 50, zeroizing input 51, information input 52, second control input 53, first control output 54, information output 55 and second control output 56.

First switch 2 contains control input 57, the first group of control inputs 58-1 . . . 58-N and the first group of address inputs 59-1 . . . 59-N. First switch 2 also contains the second group of control inputs 60-1 . . . 60-N, first group of information inputs 61-1 . . . 61-N, third group of control inputs 62-1 . . . 62-N, second group of address inputs 63-1 . . . 63-N, second group of information inputs 64-1 . . . 64-N, control output 65, the group of information outputs 66-1 . . . 66-N and the group of control outputs 67-1 . . . 67-N.

Referring to FIG. 46, each fragment routine processing unit 6-i contains first control input 68, second control input 69, third control input 70, fourth control input 71, first information input 72, second information input 73, third information input 74, first control output 75, second control output 76, address output 77, and information output 78.

First additional switch 7 includes control input 79, first group of control inputs 80-1 . . . 80-N, second group of control inputs 81-1 . . . 81-N, group of information inputs 82-1 . . . 82-N, group of control outputs 83-1 . . . 83-N, and N groups of output exchange. Each group i (i=1 . . . N) of output exchange contains control output 84-1-i and information output 84-2-i.

Second additional switch 8 contains control input 85, first group of control inputs 86-1 . . . 86-N, group of address inputs 87-1 . . . 87-N, second group of control inputs 88-1 . . . 88-N, group of information inputs 89-1 . . . 89-N, control output 90, group of information outputs 91-1 . . . 91-N, and group of control outputs 92-1 . . . . 92-N.

Additional buffering block 9, includes control input 93, first group of control inputs 941 . . . 94-N, second group of control inputs 95-1 . . . 95-N, group of information inputs 96-1 . . . 96-N, and third group of control inputs 97-1 . . . 97-N. Moreover, additional buffering block 9, includes first group of control outputs 98-1 . . . 98-N, first group of information outputs 99-1 . . . 99-N, second group of control outputs 100-1 . . . 100-N, second group of information outputs 101-1 . . . 101-N. Synchronization and energy supply circuits are not shown.

Each processor unit 1-i (FIG. 2) includes the first and the second switches 102 and 103, the first and the second switch control units 104 and 105 for the first and the second switches respectively, executive device for instruction processing 106 and executive device for operand processing 107.

Switch 102 contains the first and the second control inputs 108-1 and 108-2, the first to the fourth information inputs 109-1, 109-2, 110-1, 110-2, and the first and the second information outputs, connected with the outputs 25-4 and 25-5 of the processor unit.

Switch 103 contains the first and the second control inputs 111-1 and 111-2, the first to the sixth information inputs 112-1, 112-2, 112-3, 113-1, 113-2, 113-3, and the first to the third information outputs, connected with the outputs 24, 25-1, 25-2 of the processor unit respectively.

First switch control unit 104 contains the first and the second control inputs 114, 115, the first to the fourth control outputs 116-1, 116-2, 117-1, 117-2, the third and the fourth control inputs which are connected with inputs 22-7 and 22-8 of the processor unit, and the fifth control output which is connected with output 23-4 of the processor unit.

Second switch control unit 105 contains the first and the second control inputs 118 and 119, the first to the fourth control outputs 120-1, 120-2 and 121-1, 121-2, the third control input which is connected with input 22-4 of the processor unit, and the fifth control output which is connected with output 23-1 of the processor unit.

Executive device for instruction processing 106 includes the first and the second control inputs 122 and 123, the first and the second control outputs 124 and 125, the third control output 126, address output 127, the first and the second information outputs 128 and 129, the third information output which is connected with the output 25-3 of the processor unit, the first and the second information inputs which are connected with inputs 17 and 19 of the processor unit respectively, the third to the fifth control inputs which are connected with inputs 22-1, 22-3, and 22-5 of the processor unit respectively, and an address input connected with input 21-1 of the processor unit.

Executive device for operand processing 107 contains the first and the second control inputs 130 and 131, the first to the third control outputs 132, 133, 134, address output 135, the first and the second information outputs 136 and 137, the third information output which is connected with the output 25-3 of the processor unit, the first and the second information inputs which are connected with inputs 18 and 20 of the processor unit respectively, the third to the fifth control inputs which are connected with inputs 22-2, 22-3, and 22-6 of the processor unit respectively, and an address input connected to input 21-2 of the processor unit.

Figure 3:
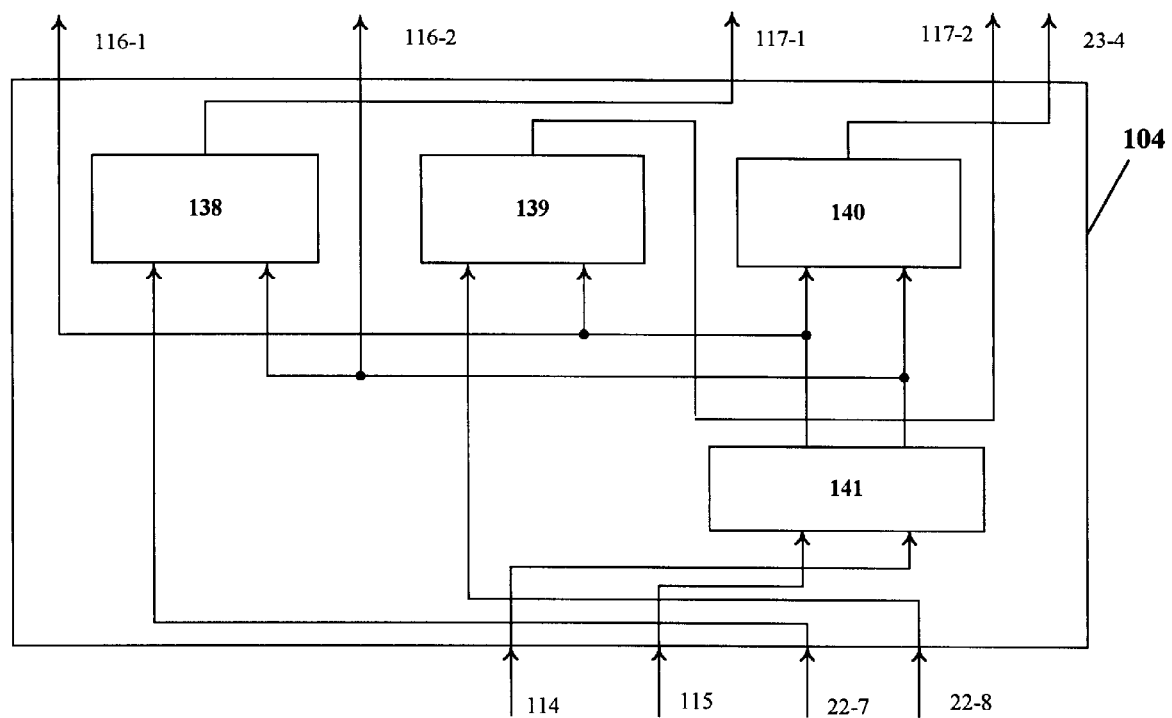
FIG. 3 is a diagram of the first switch control unit of the processor unit in FIG. 2.
Figure 4:
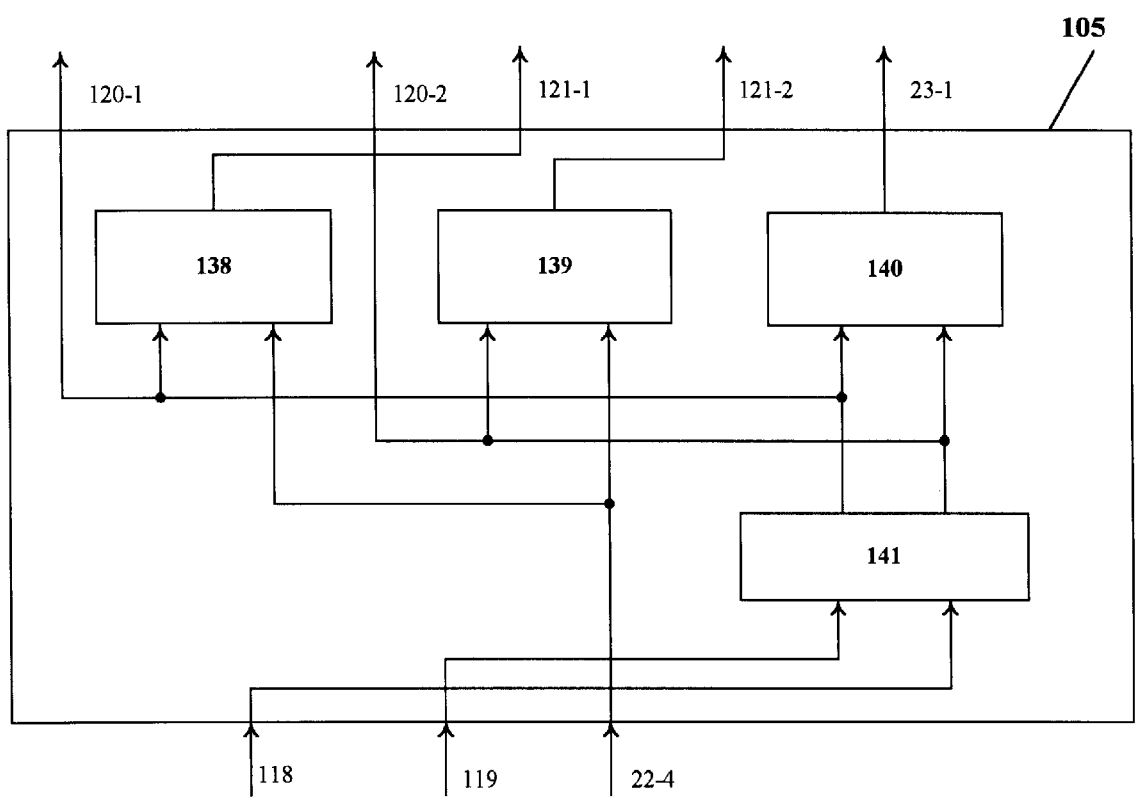
FIG. 4 is a diagram of the second switch control unit of the processor unit in FIG. 2.

Each switch control unit 104 (FIG. 3) and 105 (FIG. 4) contains "AND" elements 138 and 139, "OR" element 140 and priority coder 141.

Executive device for instruction processing 106 (FIG. 5) contains control unit 142, output switch 143, switching block 144, instruction register unit 145, instruction memory 146, arithmetic-logical unit (ALU) 147, loading switch 148 and input register unit 149.

Control unit 142 contains input 150-1 for zeroizing, the first and the second inputs 150-2 and 150-3 for control of result transmission, starting control input 150-4, input 150-5 for instruction type bits, input 150-6 for memory readiness signal, input 150-7 for the ALU result significance signal, input 150-8 for the ALU readiness signal, input 150-9 for the instruction code, the first and the second outputs 151-1 and 151-2 for the data readiness signal, output 151-3 for the control of field switching, control outputs 152-1 . . . 152-3, output 152-4 for the control of data reception, ALU starting control output 152-5 and output 152-6 for the control of instruction access.

Output switch 143 contains the first and the second control inputs 153-1 and 153-2, the first and the second information inputs 153-3 and 153-4 and an information output connected with the outputs 127 and 129 of the executive device 106.

Switching block 144 contains control inputs 154-1 . . . 154-12, information inputs 155-1 . . . 155-10 and 156-1 . . . 156-4, and information outputs connected with the output 128 of executive device 106 and with inputs 153-3 and 153-4 of switch 143.

Instruction register unit 145 contains information input 157-1, control input 157-2, and information outputs connected with the inputs 156-1 . . . 156-4 of block 144.

The instruction memory 146 contains loading control input 158-1, information input 158-2, address input 158-3, reading control input 158-4, and information and control outputs connected with the corresponding inputs 157-1 and 157-2 of the instruction register unit 145 and with the corresponding inputs 150-5 and 150-6 of the control unit 142.

Arithmetic-logical unit (ALU) 147 (made analogously to the device disclosed in USSR Patent No. 1367012) contains instruction control input 159-1, first and second operand inputs 159-2 and 159-3, starting control input 159-4, first and second information outputs 160-1 and 160-2, and control output 160-3.

Loading switch 148 contains first and second information inputs 161-1 and 161-2, first and second control inputs 161-3 and 161-4, and an information output connected with address input 158-3 of instruction memory 146.

Input register unit 149 contains control input 162-1, information input 162-2, information outputs 163-1 . . . 163-11.

Figure 6:
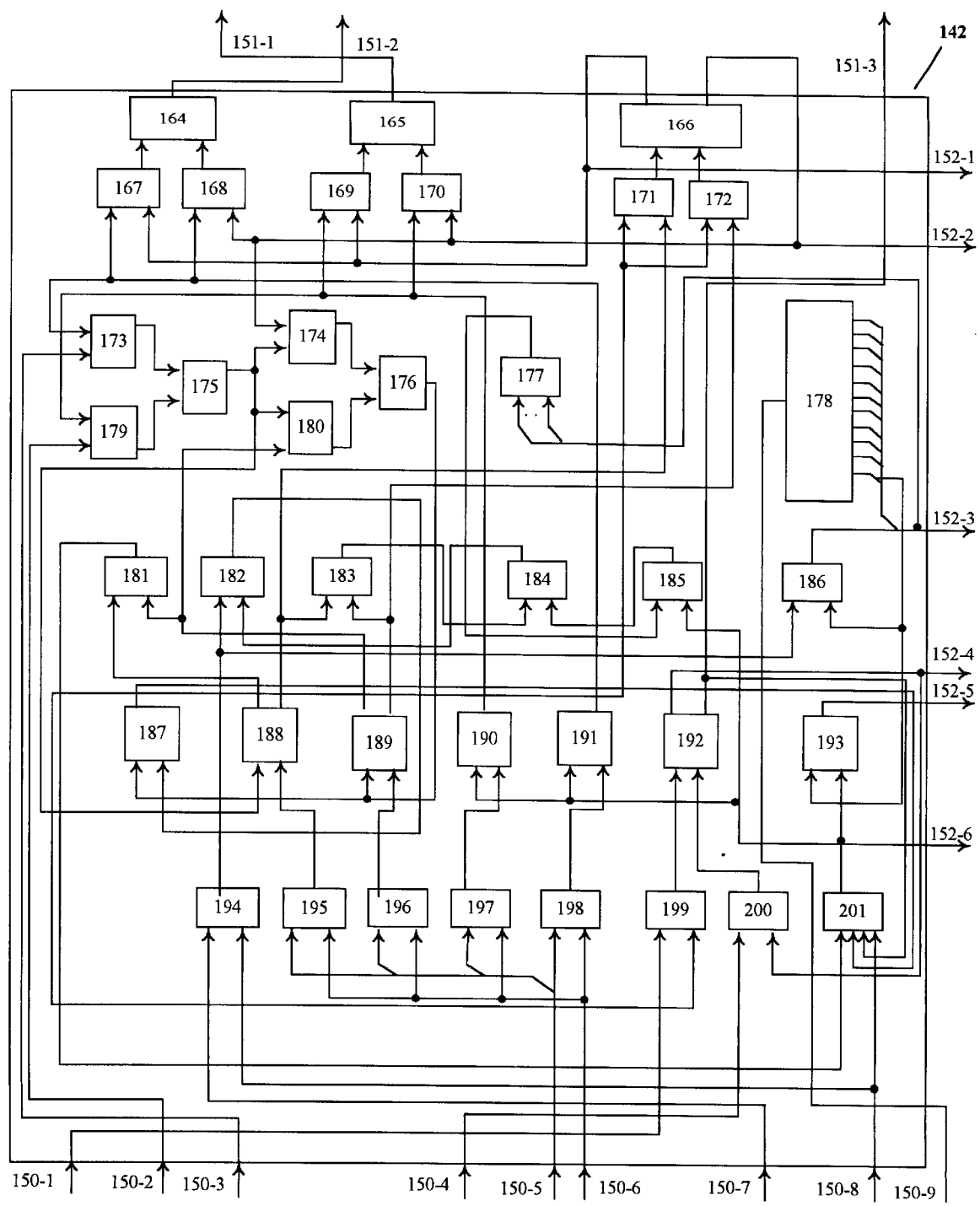
FIG. 6 is a diagram of the control unit of the device in FIG. 5.

Control unit 142 (FIG. 6) contains "AND" elements 164 and 165, priority coder 166, "AND" elements 167 . . . 174, "OR" elements 175 . . . 177, decoder 178, "AND" elements 179 . . . 181, "OR" elements 182 and 183, "AND" elements 184 . . . 186, control triggers 187 . . . 192, "AND" elements 193 . . . 198, "OR" element 199, and "AND" elements 200 and 201.

Switching block 144 (FIG. 7) contains registers 202 . . . 212, control unit 213, and switches 214 . . . 219.

Figure 8:
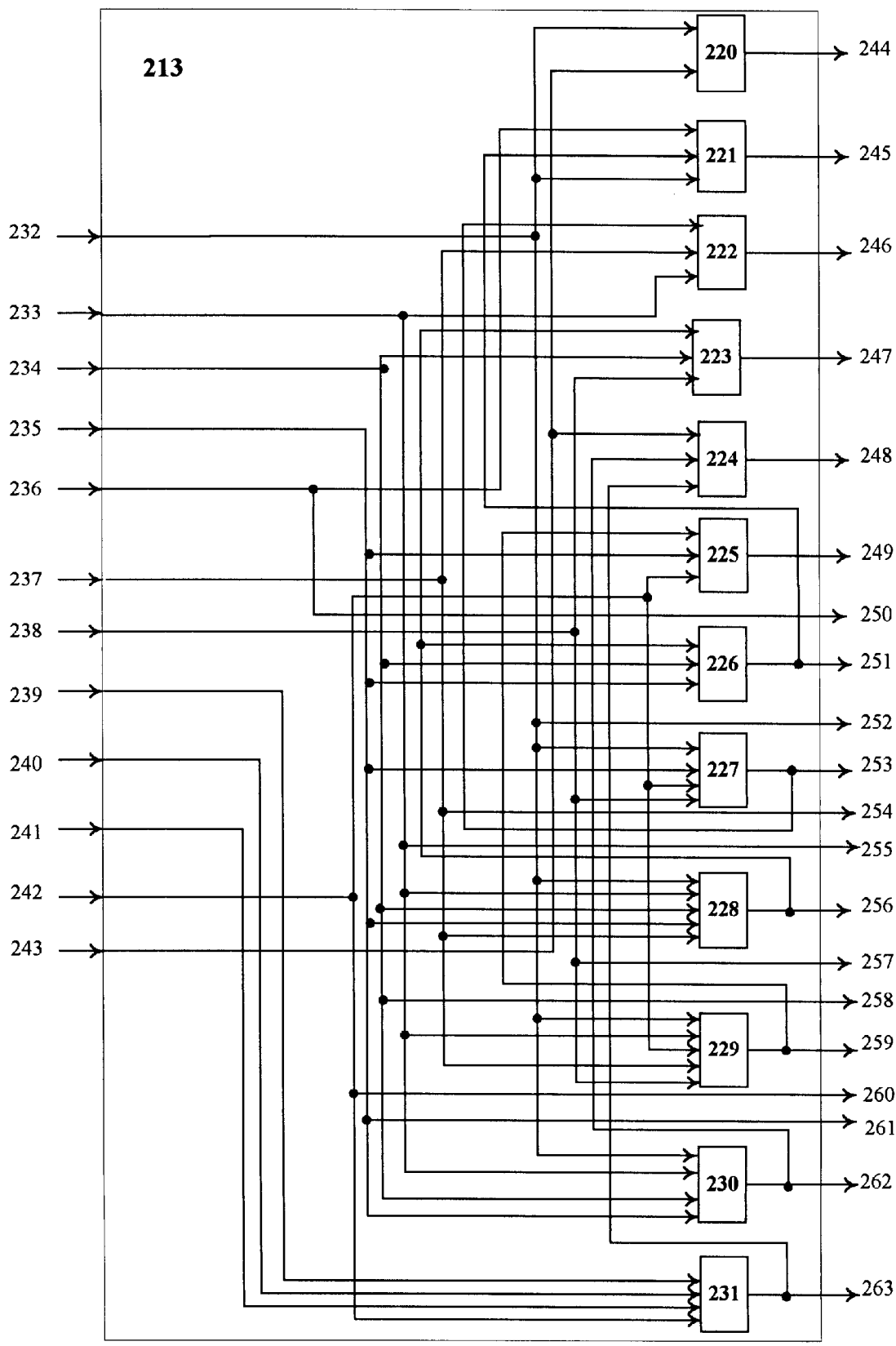
FIG. 8 is a diagram of the control unit of the switching block in FIG. 7.

Control unit 213 (FIG. 8) contains "OR" elements 220 . . . 231, control inputs 232 . . . 243, and control outputs 244 . . . 263.

Figure 9:
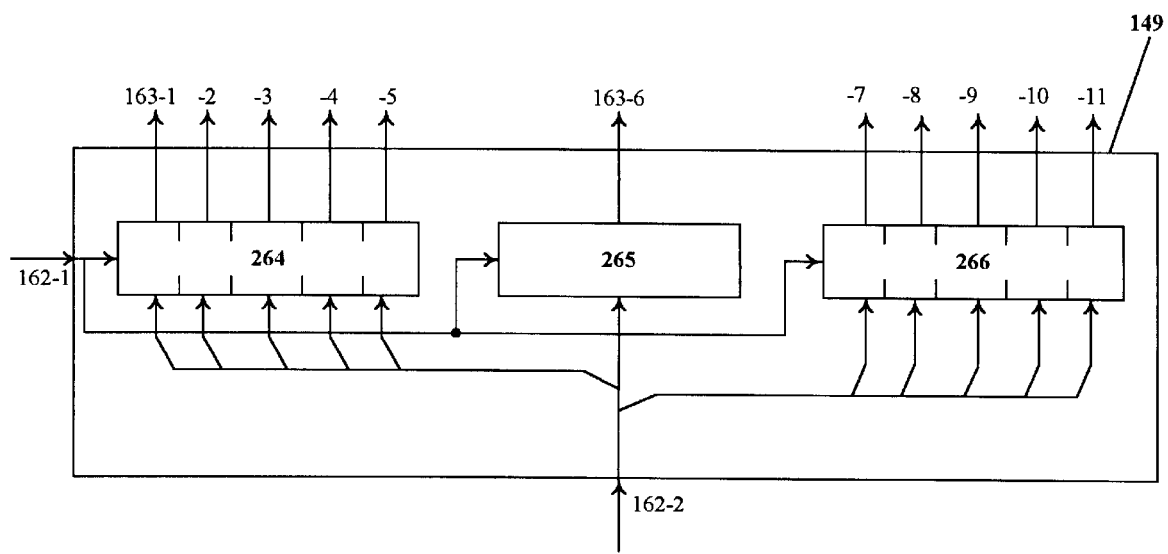
FIG. 9 is a diagram of the input register unit of the device in FIG. 5.

Input register unit 149 (FIG. 9) contains status word register 264, first data word register 265 and second data word register 266.

Figure 10:
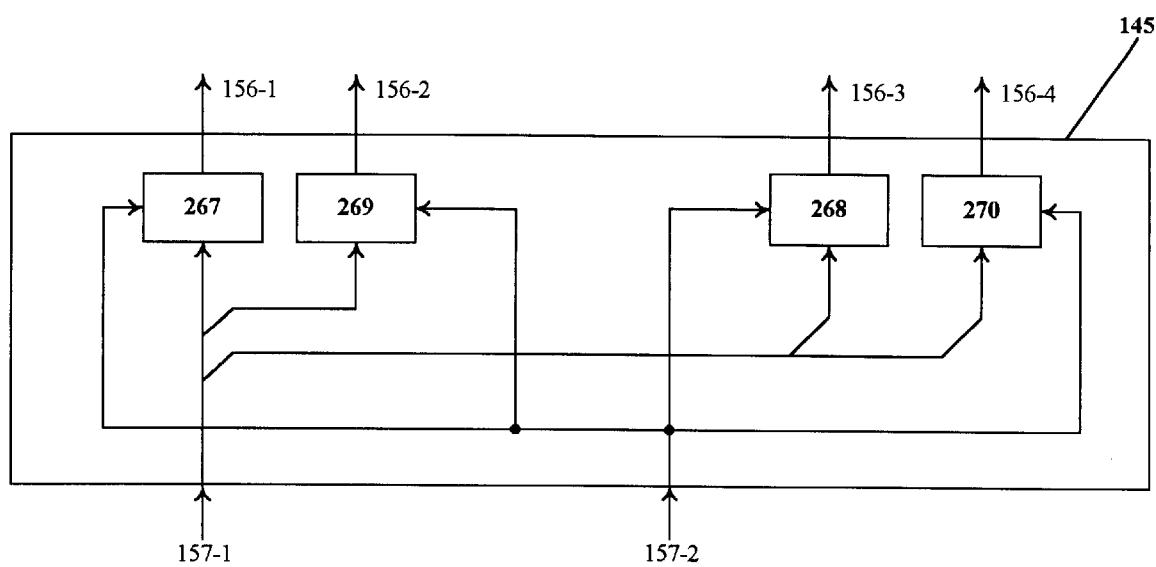
FIG. 10 is a diagram of the instruction register unit of the device in FIG. 5.

Instruction register unit 145 (FIG. 10) contains first and second operation code registers 267 and 268, and first and second instruction number registers 269 and 270.

Executive device 107 (FIG. 11) contains control unit 271, output switch 272, output register unit 273, instruction memory 274, ALU 275, loading switch 276 and input register unit 277.

Control unit 271 contains zeroizing input 278-1, first and second inputs for result transmission 278-2 and 278-3, starting control input 278-4, input for instruction type bits 278-5, input for the memory readiness signal 278-6, input 278-7 for the data significance signal, input 278-8 for the ALU readiness signal, first and second outputs for the control of output switching 279-1 and 279-2, output for transmission control 279-3, output for reception control 279-4, output for starting control 279-5, and the first to the third control outputs connected with the outputs 132 . . . 134 of the executive device 107.

Output register unit 273 contains control inputs 280-1, 280-2 and 280-3, information inputs 280-4, 280-5 and 280-6, and information outputs 281-1, 281-2 and 281-3.

Switch 272 contains an information output connected with outputs 135 and 137 of executive device 107, first and second control inputs connected with outputs 279-1 and 279-2 of unit 271, and first and second information inputs connected with outputs 281-2 and 281-3 of output register unit 273.

Figure 5:
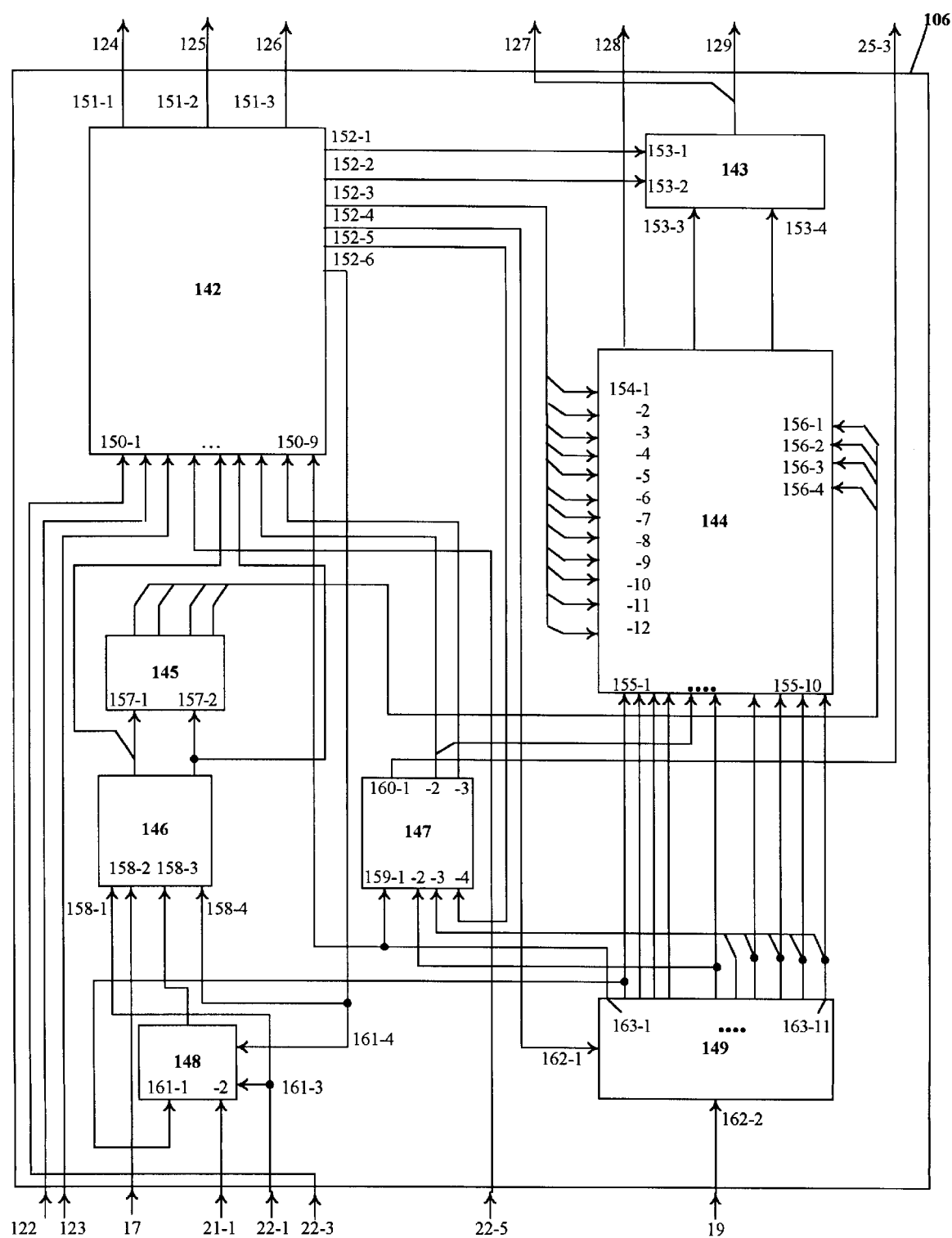
FIG. 5 is a diagram of the executive device for instruction processing of the processor unit in FIG. 2.

Instruction memory 274, ALU 275 and loading switch 276, and their connections, are analogous to the corresponding devices 146, 147 and 148 in executive device 106, which are illustrated in FIG. 5.

Figure 12:
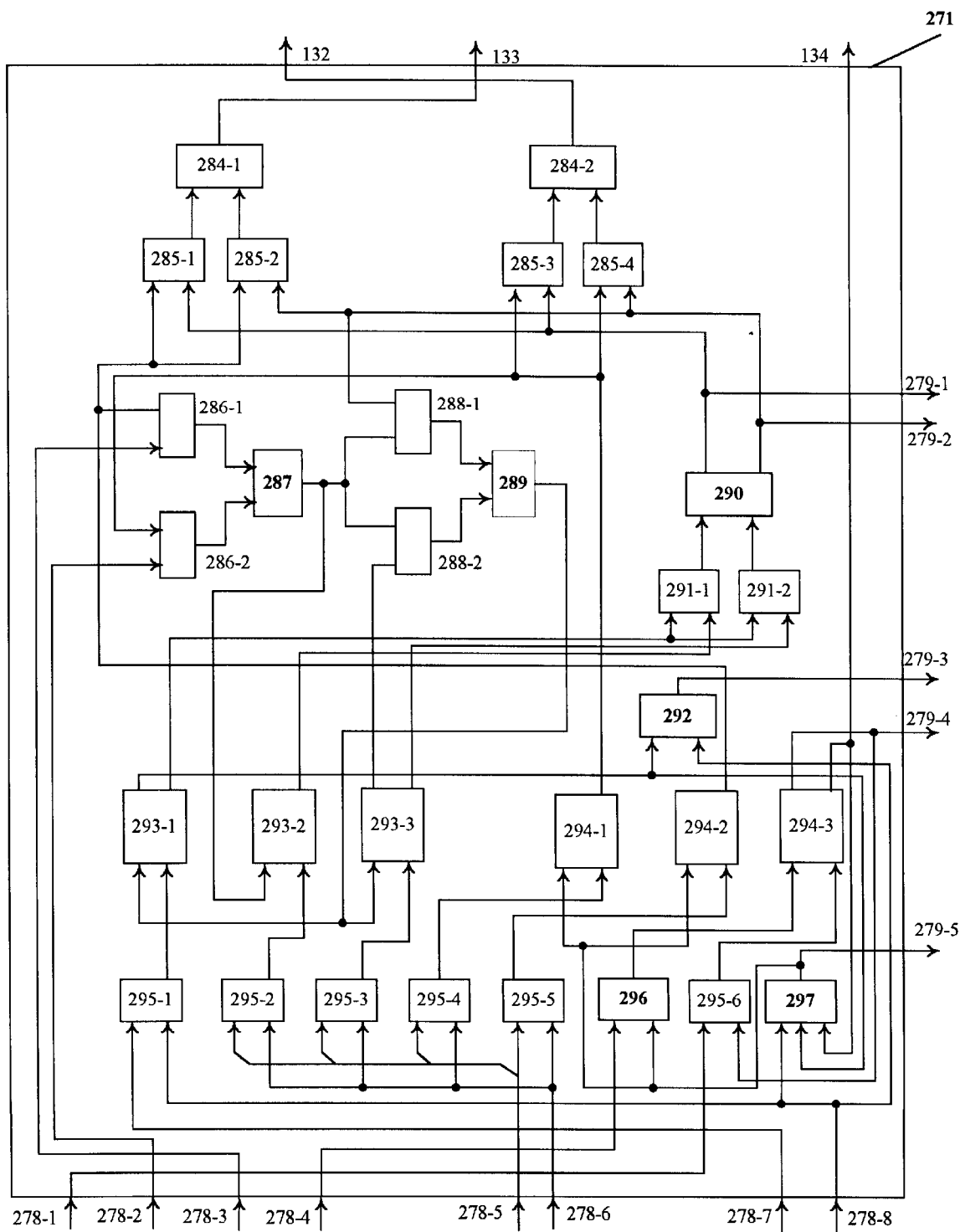
FIG. 12 is a diagram of the control unit of the device in FIG. 11.

Input register unit 277 contains control and information inputs 282-1 and 282-2, and information outputs 283-1 . . . 283-5. Control unit 271 (FIG. 12) contains "OR" elements 284-1 and 284-2, "AND" elements 285-1 . . . 285-4, "AND" elements 286-1 288-2, "OR" element 289, priority coder 290, "AND" elements 291-1 and 291-2, "AND" element 292, triggers 293-1 . . . 293-3 and 294-1 . . . 294-3, "AND" elements 295-1 . . . 295-6, "OR" element 296, and "AND" element 297.

Figure 13:
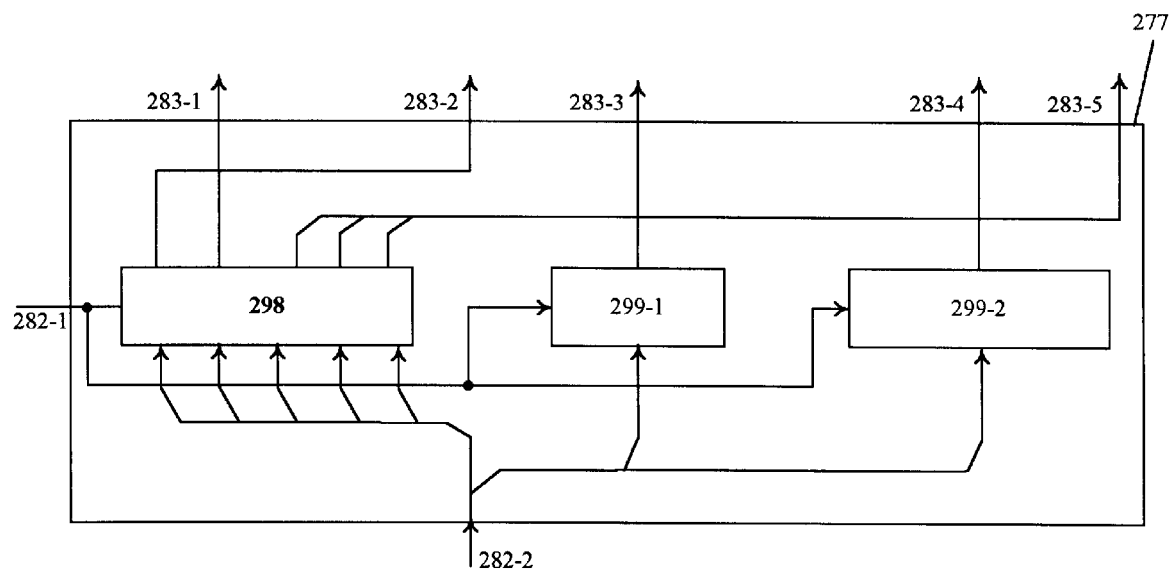
FIG. 13 is a diagram of the input register unit of the device in FIG. 11.

Input register unit 277 (FIG. 13) contains registers 298, 299-1 and 299-2 for the status word bits of the first and the second operands.

Figure 14:
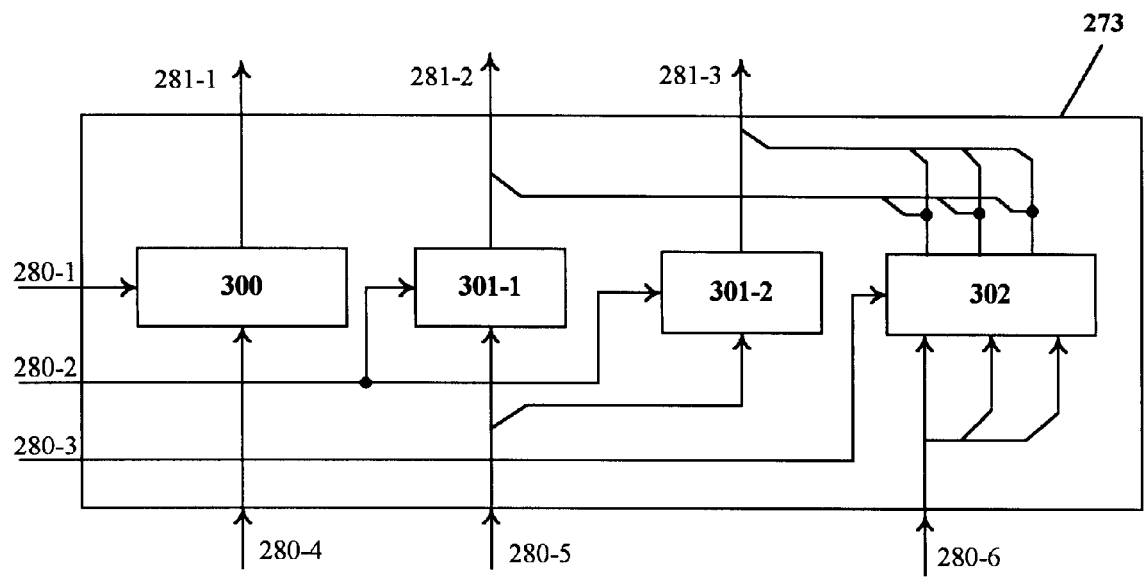
FIG. 14 is a diagram of the output register unit of the device in FIG. 11.

Output register unit 273 (FIG. 14) contains result register 300, first and second registers of instruction number and operation code 301-1 and 301-2, and status attribute register 302.

Second switch 3 (FIG. 15) contains first and second control units 303-1 and 303-2, and first and second switching units 304-1 and 304-2.

Each control unit 303-1 and 303-2 contains control input 305; the first to the third groups of control inputs 306-1 . . . 306-N, 307-1 . . . 307-N, 308-1 . . . 308-N respectively; and the first to the fourth groups of control outputs 309-1 . . . 309-N, 310-1 . . . 310-N, 311-1-1 . . . 311-N-N and 312-1 . . . 312-N.

Each switching unit 304-1 and 304-2 contains the first and the second groups of control inputs 313-1-1 . . . 313-N-N and 314-1 . . . 314-N, a group of information inputs 315-1 . . . 315-N, a group of information outputs 316-1 . . . 316-N, and a group of control outputs 317-1 . . . 317-N.

Each control unit 303-1 and 303-2 (FIG. 16) contains a group of readiness signal formation triggers 318-1 . . . 318-N, readiness set control unit 319 and switching control block 320.

Readiness set control unit 319 contains N pairs of first and second control outputs 321-1-1 and 321-2-1 to 321-1-N and 321-2-N, zeroizing input 322, the first to the third groups of control inputs 323-1 . . . 323-N, 324-1 . . . 324-N, and 325-1 . . . 325-N, N groups of outputs 326-1-1 . . . 326-1-N to 326-N-1 . . . 326-N-N of switch channel number bits, and N groups of inputs 327-1-1 . . . 327-1-N to 327-N-1 . . . 327-N-N of switch channel number bits.

Switching control block 320 contains N groups of outputs 328-1-1 . . . 328-1-N to 328-N-1 . . . 328-N-N of switch channel number setting, the first and the second groups of control outputs 329-1 . . . 329-N and 330-1 . . . 330-N, zeroizing input 331, N pairs of first and second control inputs 332-1-1 and 332-2-1 to 332-1-N and 332-2-N, a group of control inputs 333-1 . . . 333-N, N groups of switching element control inputs 334-1-1 . . . 334-1-N to 334-N-1 . . . 334-N-N, N groups of inputs 335-1-1 . . . 335-1-N to 335-N-1 . . . 335-N-N of switch channel setting, and the third group of control outputs 336-1 . . . 336-N.

Each switching unit 304-1 (304-2) (FIG. 17) contains high frequency impulse generator 337, a group of output registers 338-1 . . . 338-N, a group of transformer-receivers 339-1 . . . 339-N, a group of "OR" elements 340-1 . . . 340-N, a group of photo-receivers 341-1 . . . 341-N, the first group of the optical lens rasters 342-1 . . . 342-N, controlled optical transparency 343, the second group of optical lens rasters 344-1 . . . 344-N, a group of deflectors 345-1 . . . 345-N, a group of laser oscillators 346-1 . . . 346-N, a group of transformer-transmitters 347-1 . . . 347-N, and a group of input registers 348-1 . . . 348-N.

Figure 18:
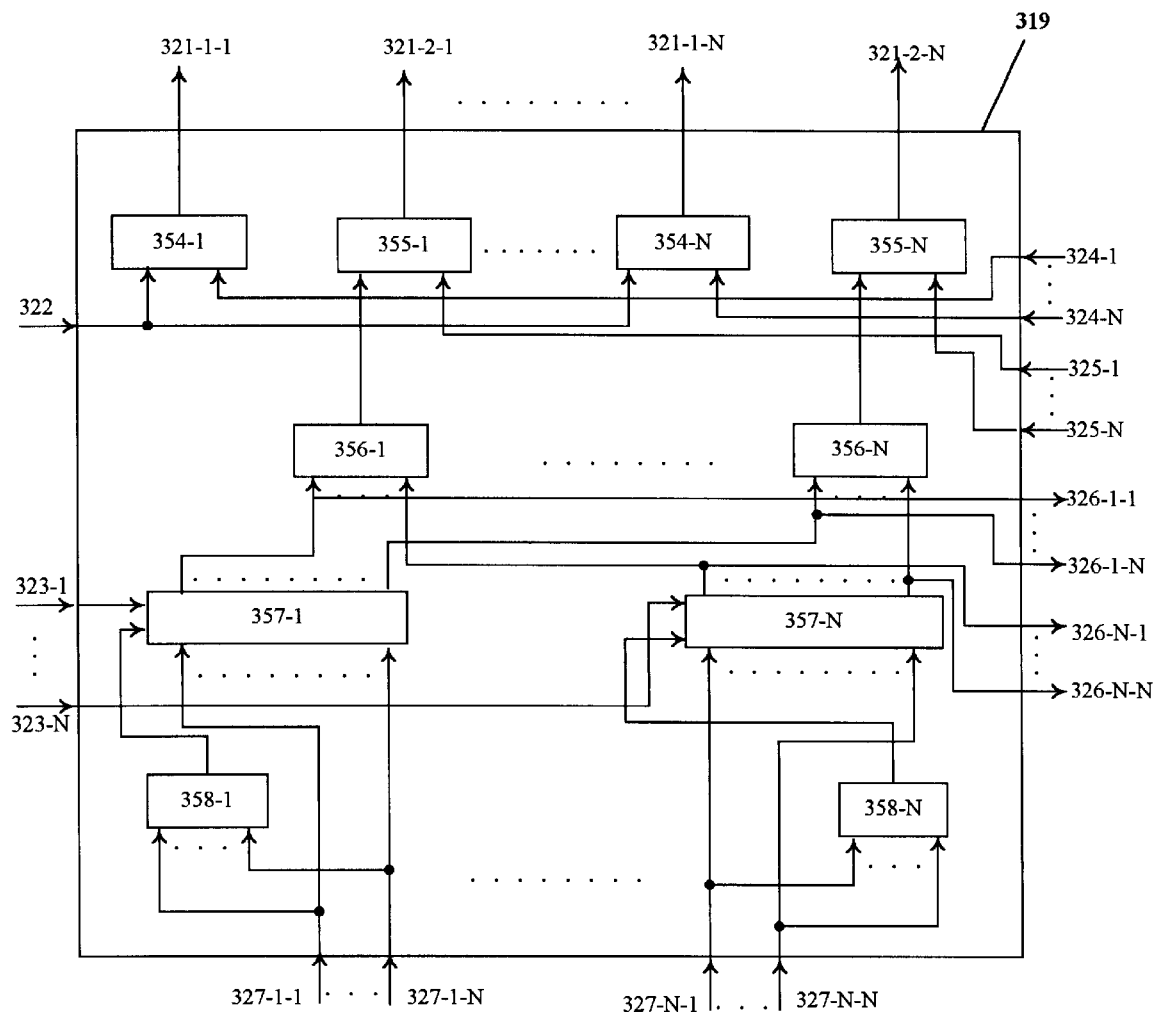
FIG. 18 is a diagram of the readiness set control unit of the unit in FIG. 16.

Readiness set control unit 319 (FIG. 18) contains first group of "OR" elements 354-1 . . . 354-N, group of "AND" elements 355-1 . . . 355-N, second group of "OR" elements 356-1 . . . 356-N, a group of registers 357-1 . . . 357-N, and third group of "OR" elements 358-1 . . . 358-N.

Figure 19:
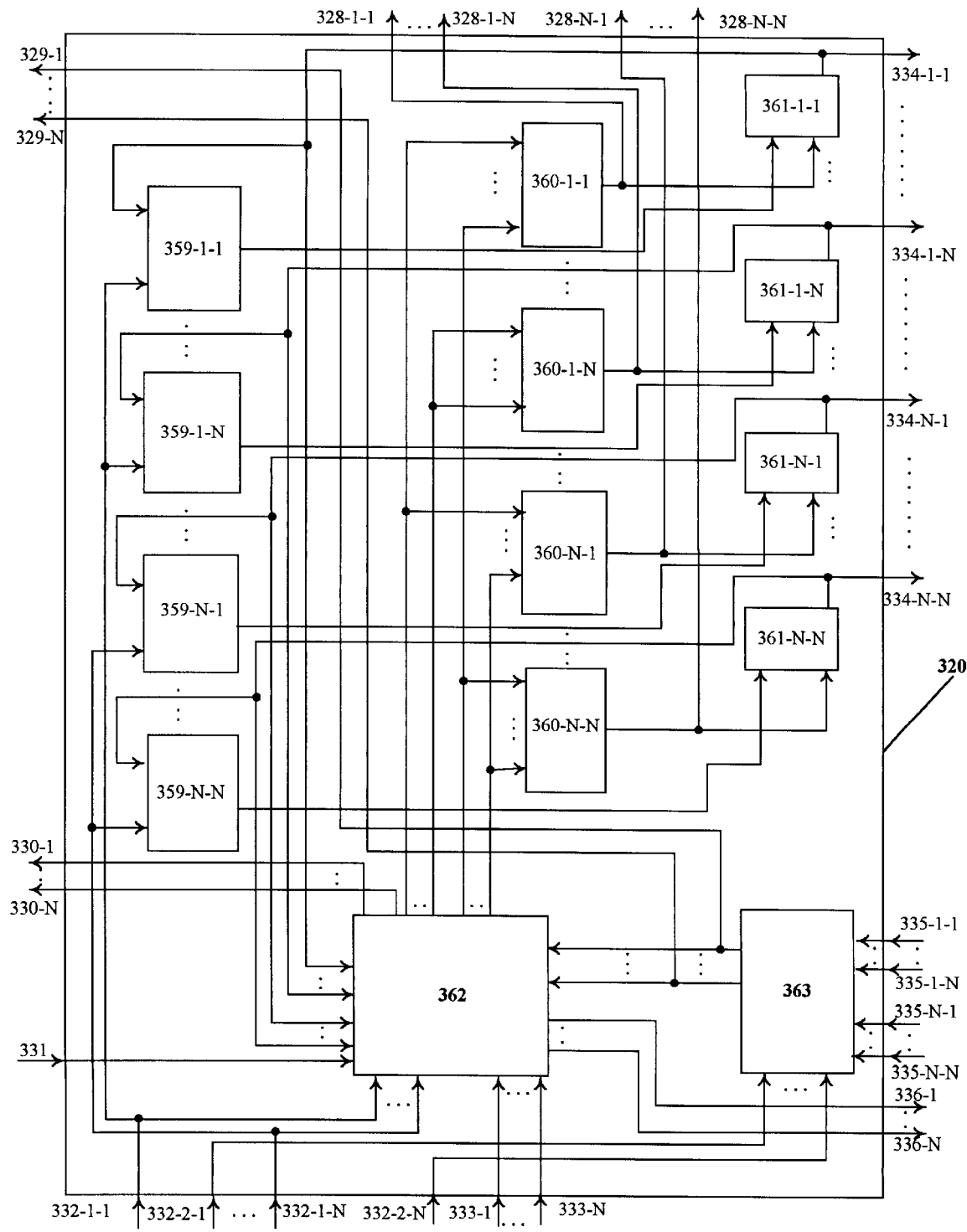
FIG. 19 is a diagram of the switching control block of the unit in FIG. 16.

Switching control block 320 (FIG. 19) contains N groups of double-input "AND" elements 359-1-1 . . . 359-1-N to 359-N-1 . . . 359-N-N, N groups of N-input "AND" elements 360-1-1 . . . 3601-N to 360-N-1 . . . 360-N-N, N groups of triggers 361-1-1 . . . 361-1-N to 361-N-1 . . . 361-N-N, priority control unit 362 and input query receiving unit 363.

Figure 20:
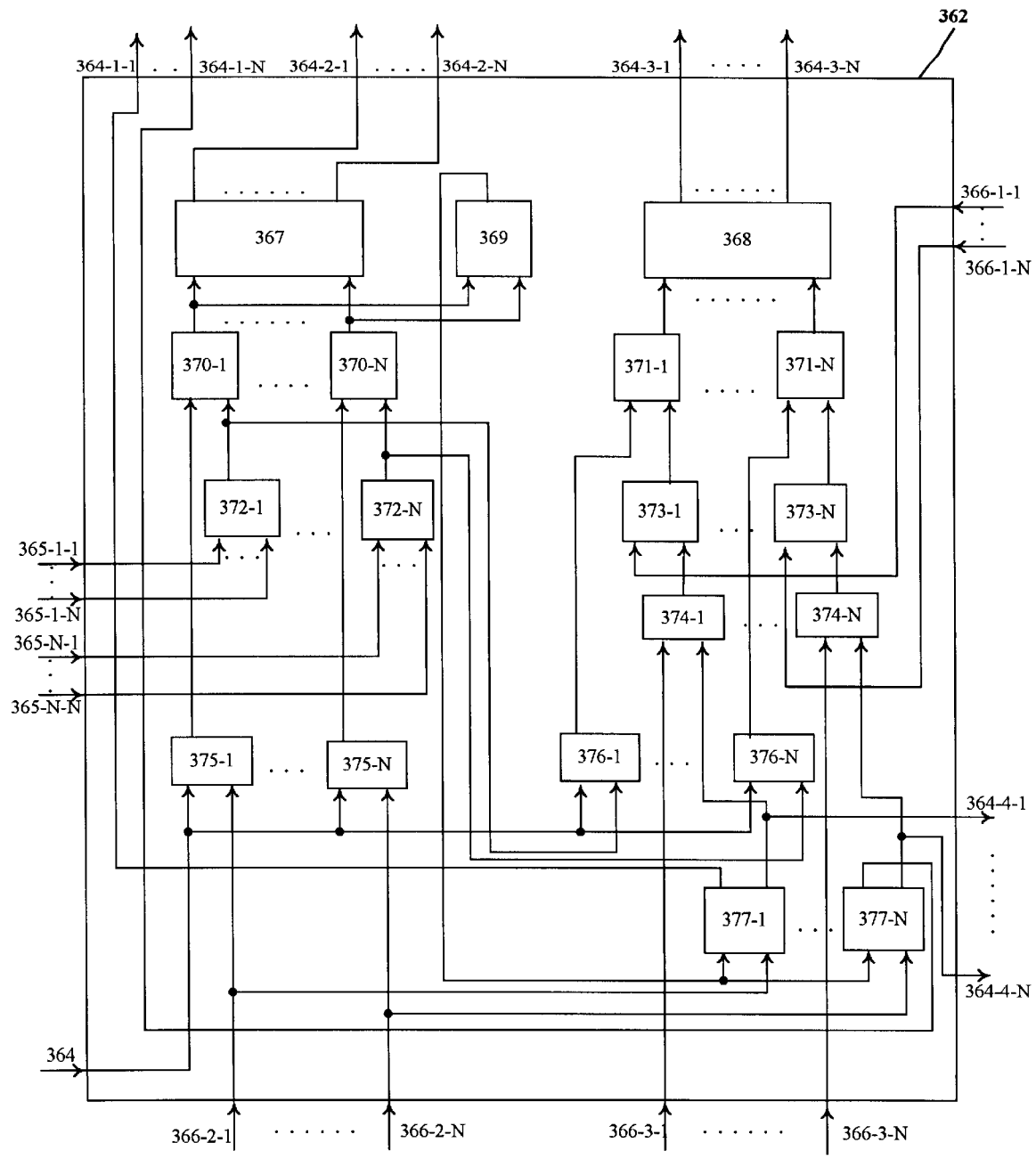
FIG. 20 is a diagram of the priority control unit of the block in FIG. 19.

Referring to FIG. 20, priority control unit 362 contains zeroizing input 364, the first to the fourth groups of control outputs 364-1-1 . . . 364-1-N, 364-2-1 . . . 364-2-N, 364-3-1 . . . 364-3-N and 364-4-1 . . . 364-4-N, N groups of inputs 365-1-1 . . . 365-1-N to 365-N-1 . . 365-N-N of output channel access control, and the first to the third groups of control inputs 366-1-1 . . . 366-1-N, 3662-1 . . . 366-2-N, 366-3-1 . . . 366-3-N.

Priority control unit 362 (FIG. 20) contains the first and the second priority coders 367 and 368, "OR" element 369, the first and the second groups of status triggers 370-1 . . . 370-N and 371-1 . . . 371-N, the first group of "OR" elements 372-1 . . . 372-N, a group of query triggers 373-1 . . . 373-N, the first group of "AND" elements 374-1 . . . 374-N; the second and the third groups of "OR" elements 375-1 . . . 375-N and 376-1 . . . 376-N, and the second group of "AND" elements 377-1 . . . 377-N.

Figure 21:
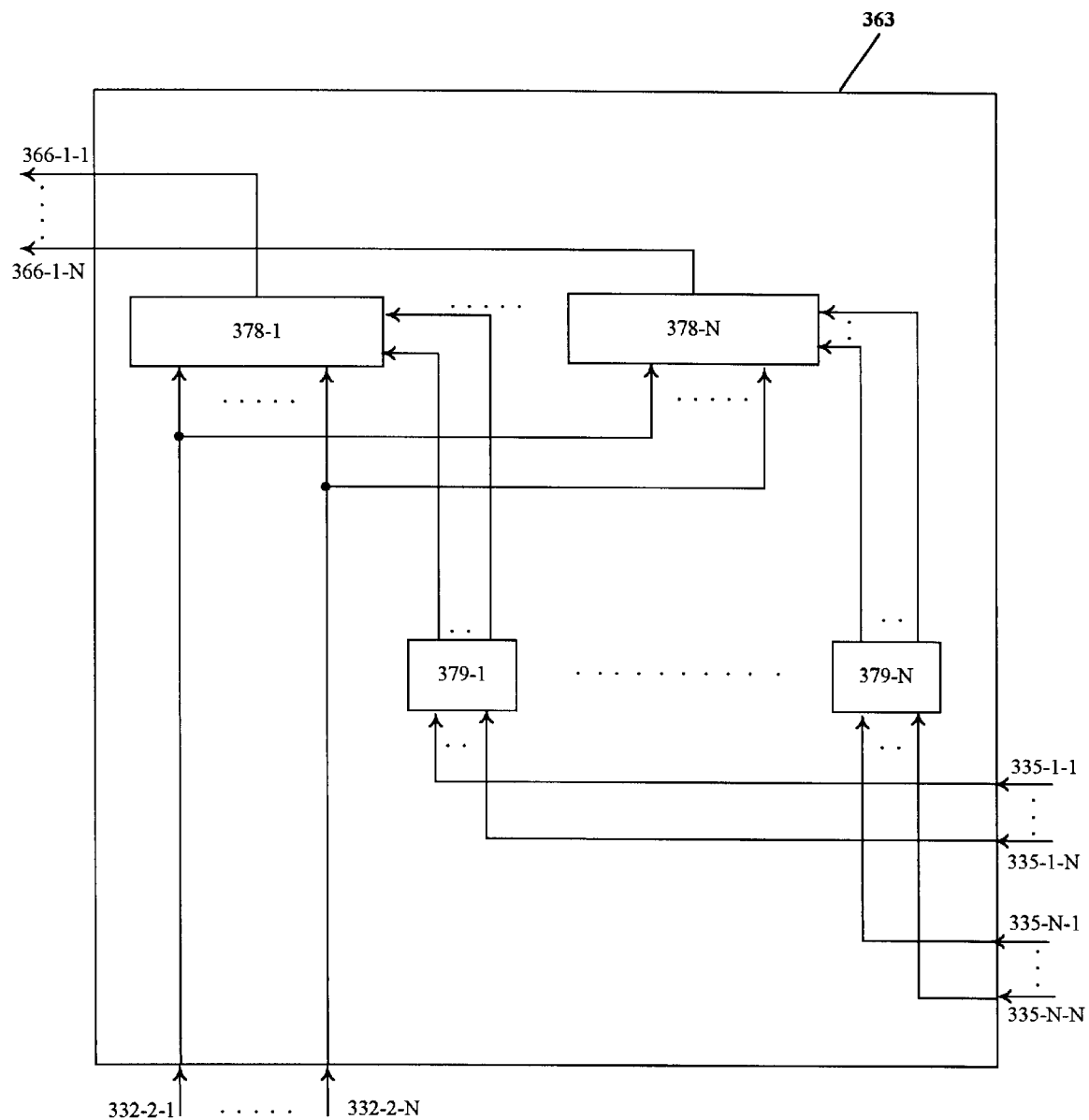
FIG. 21 is a diagram of the input query receiving unit of the block in FIG. 19.

The unit 363 (FIG. 21) contains a group of switches 378-1 . . . 378-N and a group of decoders 379-1 . . . 379-N.

Input query receiving unit 363 (FIG. 21) contains a group of control inputs connected with inputs 332-2-1 . . . 332-2-N of the switching control block 320, N groups of inputs of output channel number bits connected with inputs 335-1-1 . . . 335-N-N of the switching control block 320, and a group of control outputs connected with inputs 366-1-1 . . . 366-1-N of priority control unit 362.

Figure 22:
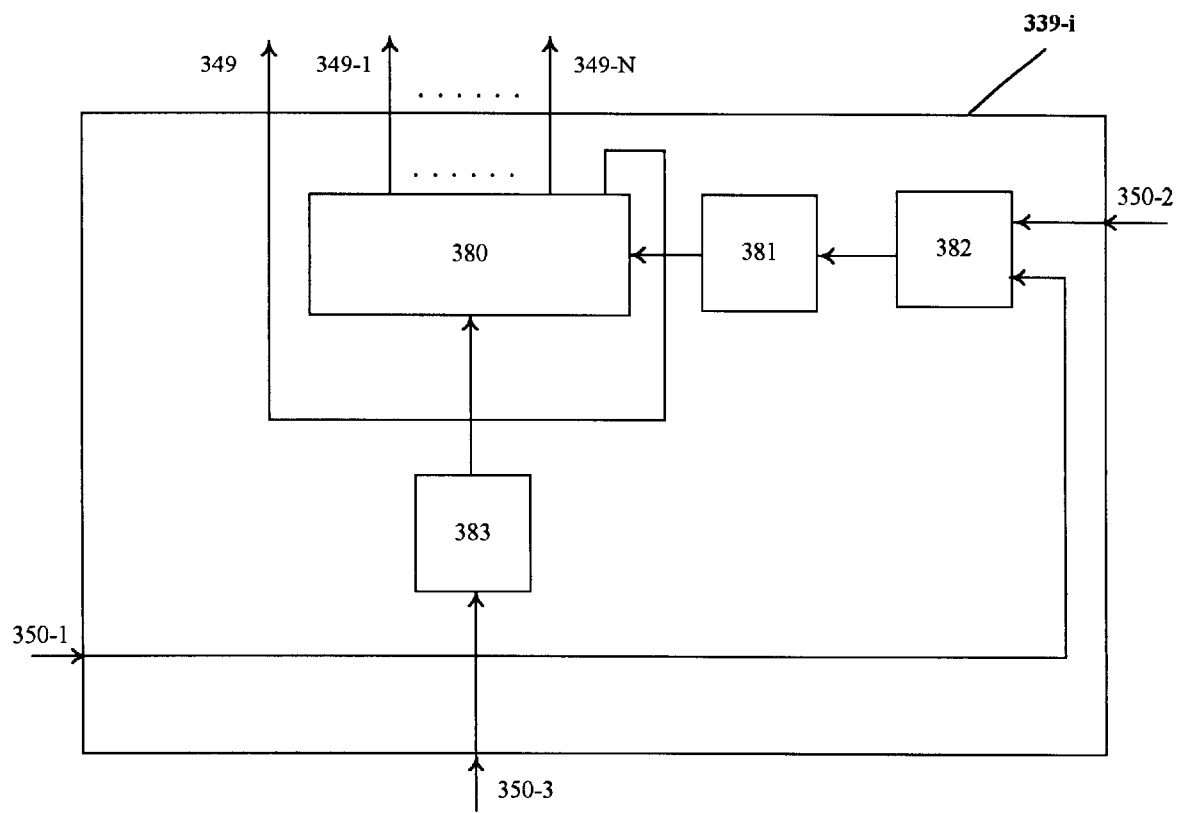
FIG. 22 is a diagram of the transformer-receiver of the switching unit in FIG. 17.

Each transformer-receiver 339-i (FIG. 22) contains decoder 380, counter 381, "OR" element 382 and amplifier-former 383.

Each transformer-receiver 339-i (FIG. 22) contains control output 349, information outputs 349-1 . . . 349-N of parallel code, first and second control inputs 350-1 and 350-2, and information input of serial code 350-3.

Figure 23:
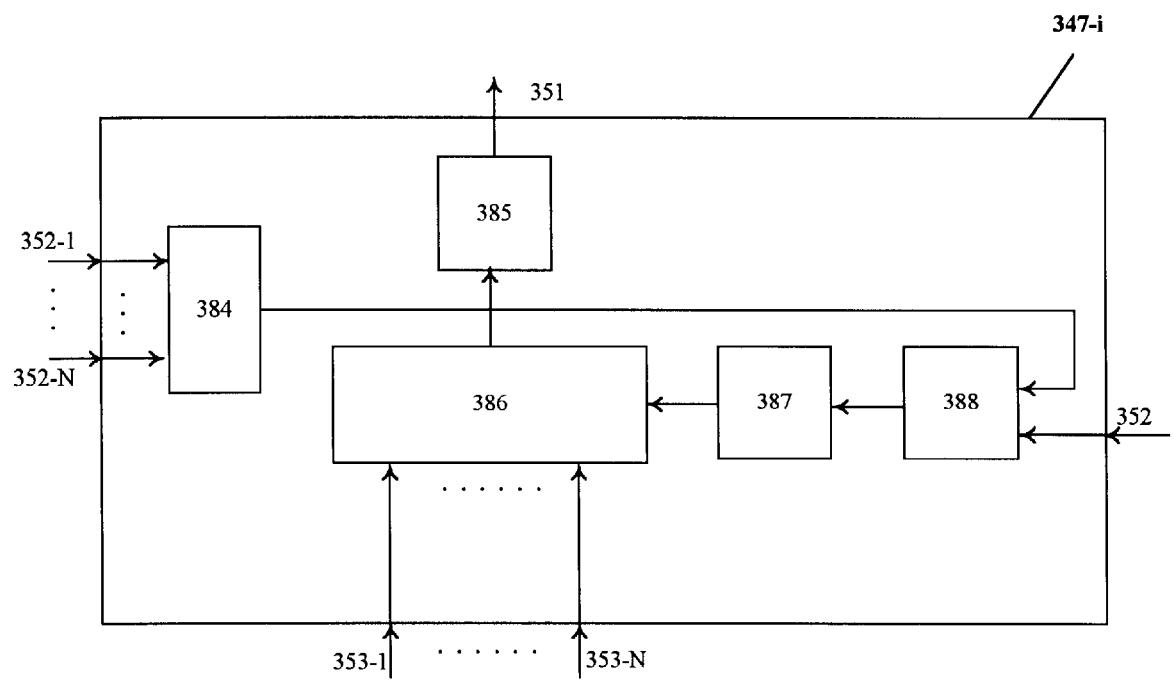
FIG. 23 is a diagram of the transformer-transmitter of the switching unit in FIG. 17.

Each of the transformer-transmitters 347-i (FIG. 23) contains "OR" element 384, amplifier-former 385, coder 386, counter 387 and "AND" element 388.

Each transformer-transmitter 347-i (FIG. 23) contains information output of serial code 351, control input 352, a group of inputs of transforming control 352-1 . . . 352-N and a group of information inputs of parallel code 353-1 . . . 353-N.

Figure 24:
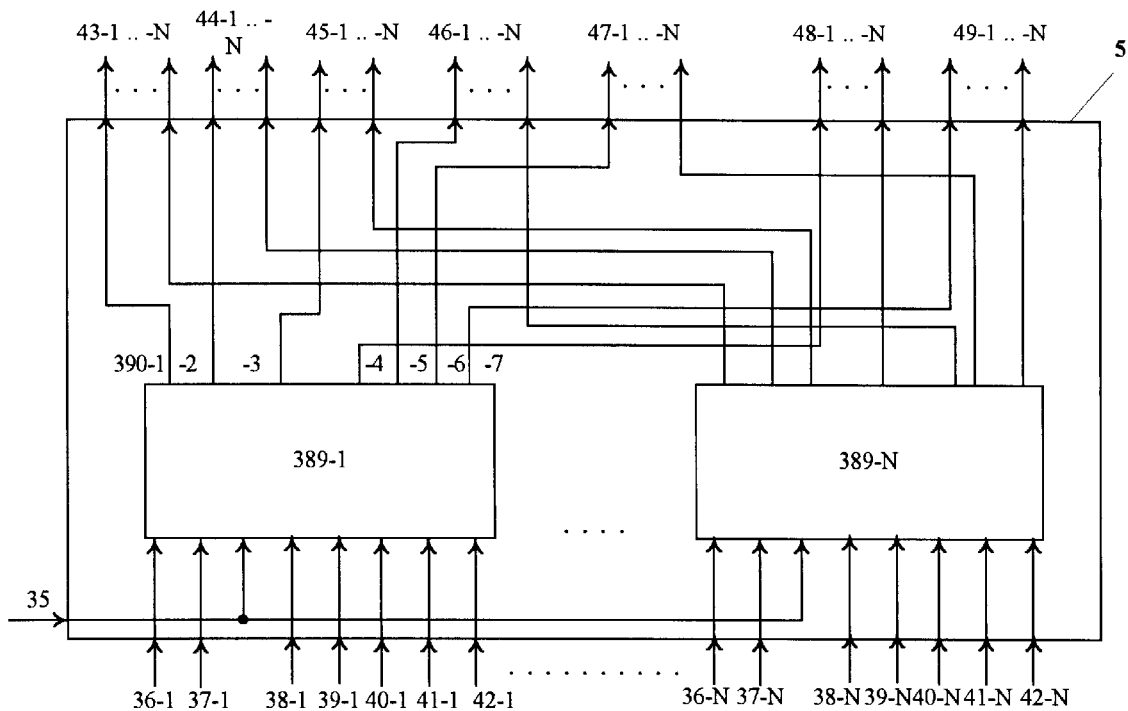
FIG. 24 is a diagram of a buffering block of the system in FIG. 1.

Buffering block 5 (FIG. 24) contains group of buffering units 389-1 . . . 389-N. Each buffering unit 389-i (FIG. 25) contains the first to the fourth control outputs 390-1 . . . 390-4, the first to the third information outputs 390-5 . . . 390-7, the first and second control inputs connected with the corresponding inputs of the first and second groups of control inputs 36-1 . . . 36-N and 37-1 . . . 37-N, the third control input connected with control input 35, the fourth and fifth control inputs connected with the corresponding inputs of the third and the fourth groups of control inputs 39-1 . . . . 39-N and 41-1 . . . 41-N, and the first to the third information inputs connected with the corresponding inputs of the first, the second and the third groups of information inputs 38-1 . . . 38-N, 40-1 . . . 40-N and 42-1 . . . 42-N.

Each buffering unit 389-i contains the first and the second buffers 391-1 and 391-2. Buffer 391-1 is used for temporary storage and transmission of instruction words, and buffer 391-2 is used for temporary storage and transmission of operand packets. Both buffers have the same structure and configuration, being different only in internal logic of means of identification of input packet type.

Each buffer 391-1 and 391-2 (FIG. 26) contains the first and the second control inputs 392-1 and 392-2, the first and the second information inputs 392-3 and 392-4, the third and the fourth control inputs 392-5 and 392-6, external exchange input 392-7, the first and the second transmission control outputs 393-1 and 393-2, information output 393-3, and external exchange output 393-4.

Each buffer 391-1 and 391-2 contains output switch 394, group of "OR" element 394-1 . . . 394-5, group of "AND" elements 395-1 . . . 395-4, the register memorizing unit (RMU) 396 and the corresponding control unit 397-1 (397-2), input switch 398, and the first and the second input registers 399-1 and 399-2.

Each control unit 397-1 and 397-2 contains control outputs 400-1 ... 400-12, zeroizing input 401-1, the first input of packet code 401-2, the first control input of receiving 401-3, the second input of packet code 401-4, the second and the third control inputs of receiving 401-5 and 401-6, and the first to the fifth control inputs 402-1 ... 402-5.

Each of the control units 397-1 and 397-2 (FIG. 27) contains priority coder 403, counters 403-1 and 403-2, logical "AND" elements 404-1 ... 404-4, triggers 405-1 ... 405-3, logical "OR" element 406, and the corresponding group of decoders 406-1-1 ... 406-1-3 (or 406-2-1 ... 406-2-3). The mentioned groups of decoders carry out the function of identification of input packet type and they are different only in the functioning of the internal logic: the group of decoders 406-1-1 ... 406-1-3 is used for identification of instruction words packets, and the group of decoders 406-2-1 ... 406-2-3 is used for identification of operand packets.

Figure 28:
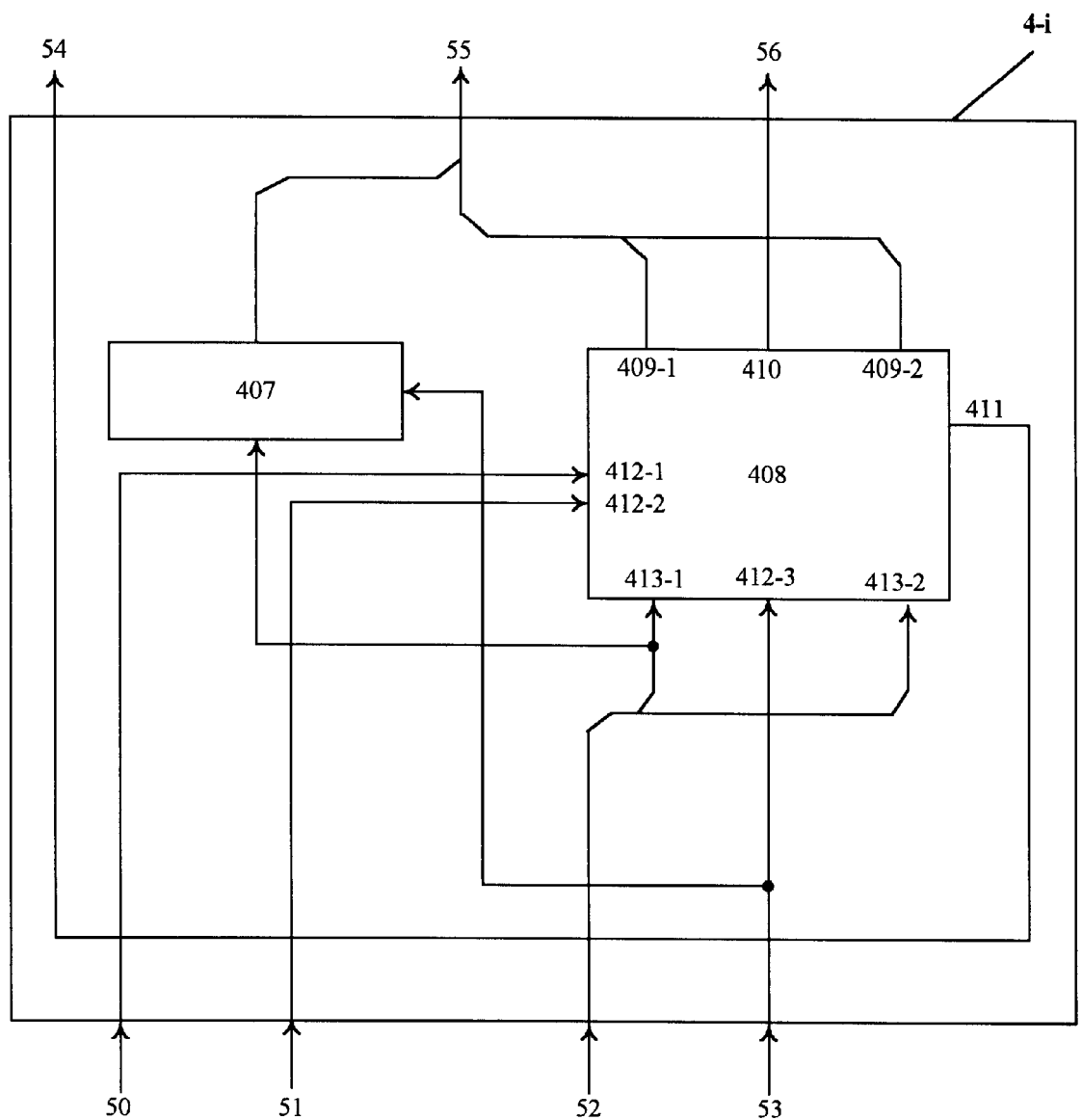
FIG. 28 is a diagram of an associative memory module of the system in FIG. 1.

Each associative memory module 4-i (FIG. 28) contains buffer register 407 and associative memorizing unit (AMU) 408, built in analogy with the device disclosed in Russian Federation Patent No. 2035069.

AMU 408 contains the first and the second information outputs 409-1 and 409-2, the first and the second control outputs 410 and 411, the first to the third control inputs 412-1 ... 412-3, and the first and the second information inputs 413-1 and 413-2.

First switch 2 (FIG. 29) contains control unit 414 and switching unit 415, built in analogy with switching unit 304-1 (304-2) included in second switch 3.

Control unit 414 contains exchange control output 416, a group of control outputs 416-1 ... 416-N, 2N groups of N control outputs 417-1-1 ... 417-1-N to 417-2N-1 ... 417-2N-N of channel switching, receiving control output 418, zeroizing input 419, first and second groups of control inputs 420-1 ... 420-N and 421-1 ... 421-N and 2N pairs of inputs. Each of the 2N pairs of inputs contains control input 419-1-i and address input 419-2-i.

Switching unit 415 contains a group of information outputs 422-1 ... 422-N, a group of information inputs 423-1 ... 423-2N, 2N groups of N inputs 424-1-1 ... 424-1-N to 424-2N-1 ... 424-2N-N of switching control, a group of control outputs 425-1 ... 425-N and a group of in puts 426-1 ... 426-N of receiving control.

Control unit 414 (FIG. 30) contains a group of output query forming triggers 427-1 ... 427-N, transmission control unit 428, receiving control unit 429, switching control unit 430, a group of query receiving triggers 431-1 ... 431-2N, a group of decoders 432-1 ... 432-2N, a group of input registers 433-1 ... 433-2N and a group of "AND" elements 434-1 ... 434-2N.

Figure 31:
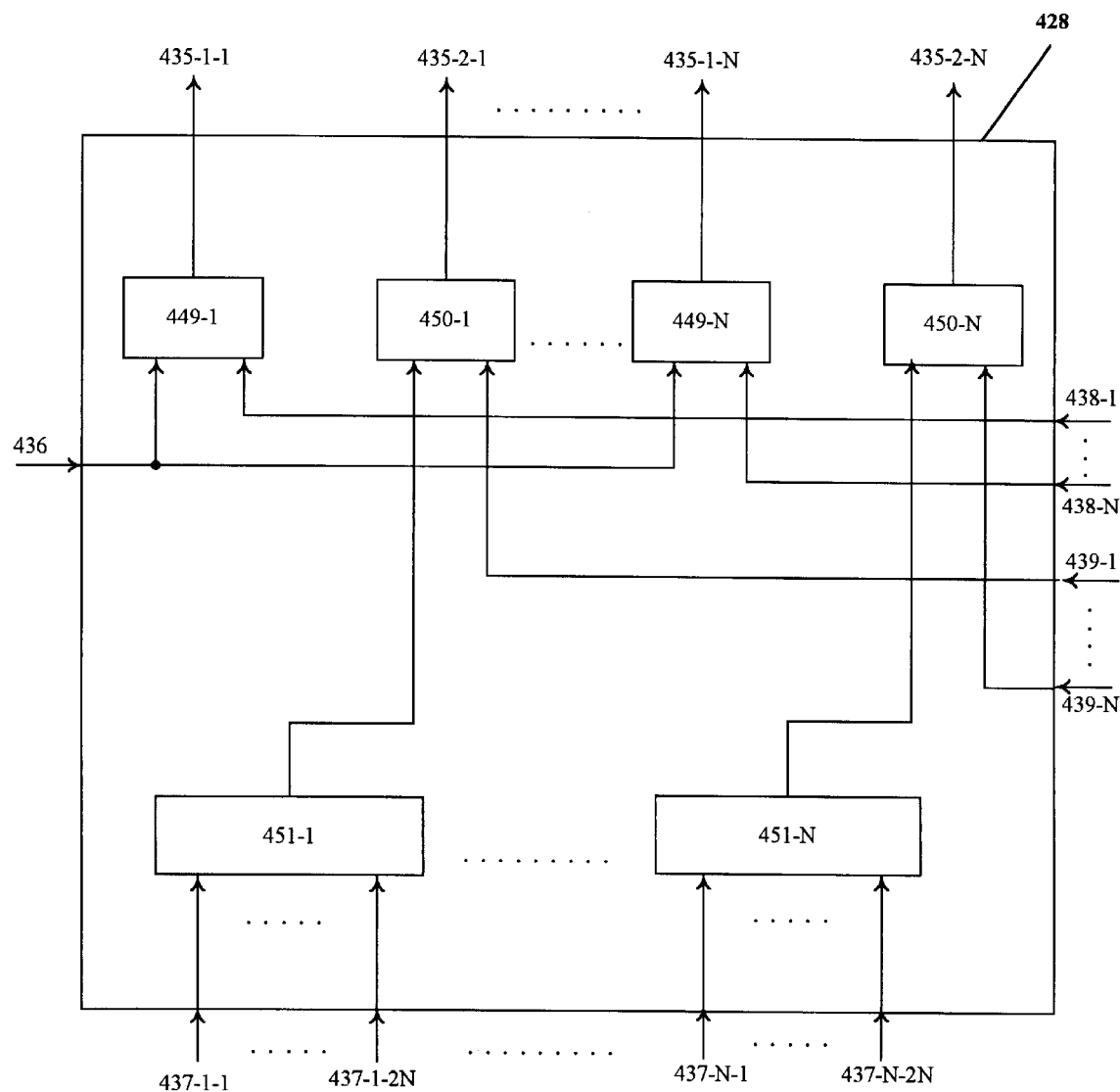
FIG. 31 is a diagram of a transmission control unit of the control unit in FIG. 30.

Transmission control unit 428 (FIG. 31) contains the first group of "OR" elements 449-1 ... 449-N, a group of "AND" elements 450-1 ... 450-N, and the second group of "OR" elements 451-1 ... 451-N.

Transmission control unit 428 (FIG. 31) contains N pairs of control outputs, each of which contains the first and the second query set outputs 435-1-1 to 435-1-N and 435-2-1 to 435-2-N, zeroizing input 436, N groups of 2N query control inputs 437-1-1 ... 437-1-2N to 437-N-1 ... 437-N-2N, and the first and the second groups of control inputs 438-1 ... 438-N and 439-1 ... 439-N.

Figure 32:
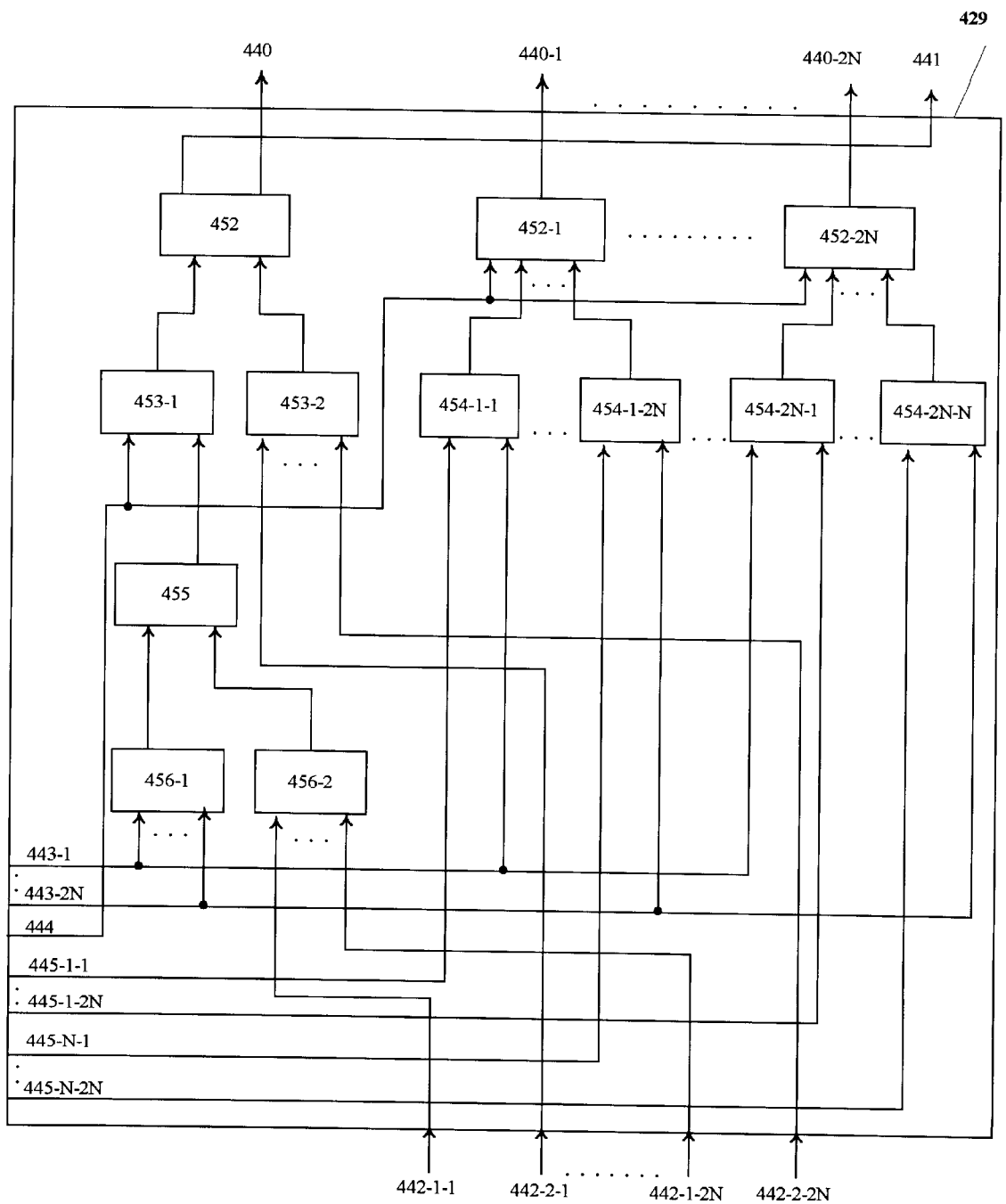
FIG. 32 is a diagram of a receiving control unit of the control unit in FIG. 30.

Receiving control unit 429 (FIG. 32) contains trigger 452, a group of "OR" elements 452-1 ... 452-2N, the first and the second "OR" elements 453-1 and 453-2, 2N groups of N "AND" elements 454-1-1 ... 454-1-N to 454-2N-1 ... 454-2N-N, and "AND" elements 455, 456-1 and 456-2.

Receiving control unit 429 contains first control output 440, a group of receiving control outputs 440-1 ... 440-2N, second control output 441, 2N pairs of inputs containing the first and the second inputs of status transmission 442-1-1 and 442-2-1 to 442-1-2N and 442-2-2N, a group of control inputs 443-1 ... 443-N, zeroizing input 444, and N groups of 2N clearing control inputs 445-1-1 ... 445-1-2N to 445-N-1 ... 445-N-2N.

Figure 33:
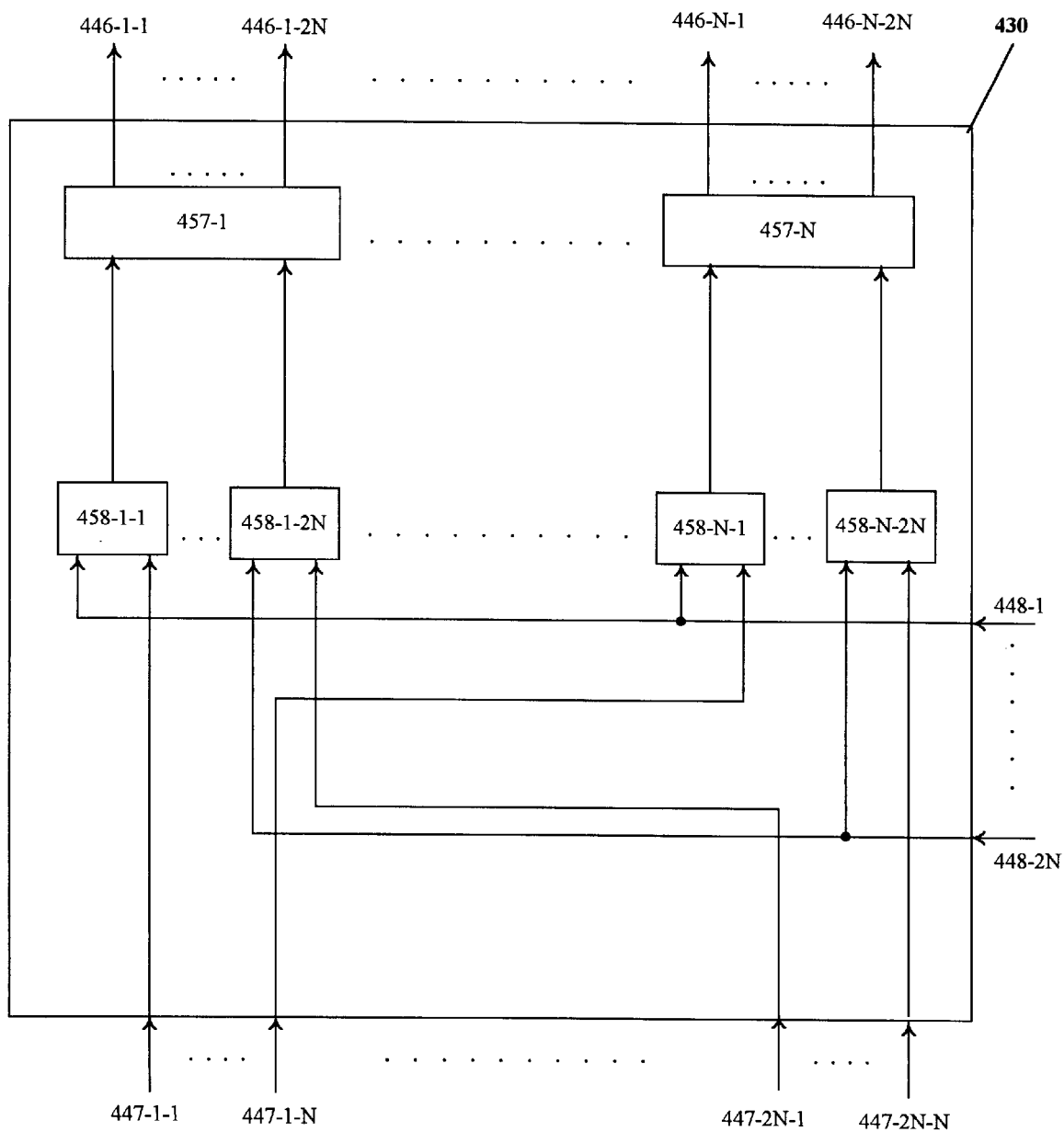
FIG. 33 is a diagram of a switching control unit of the control unit in FIG. 30.

Switching control unit 430 (FIG. 33) contains a group of priority coders 457-1 ... 457-N and N groups of 2N "OR" elements 458-1-1 ... 458-1-2N to 458-N-1 ... 458-N-2N.

Switching control unit 430 contains N groups of 2N control outputs 446-1-1 ... 446-1-2N to 446-N-1 ... 446-N-2N, 2N groups of N priority control inputs 447-1-1 ... 447-1-N to 447-2N-1 ... 447-2N-N, and a group of control inputs 448-1 ... 448-2N.

Figure 34:
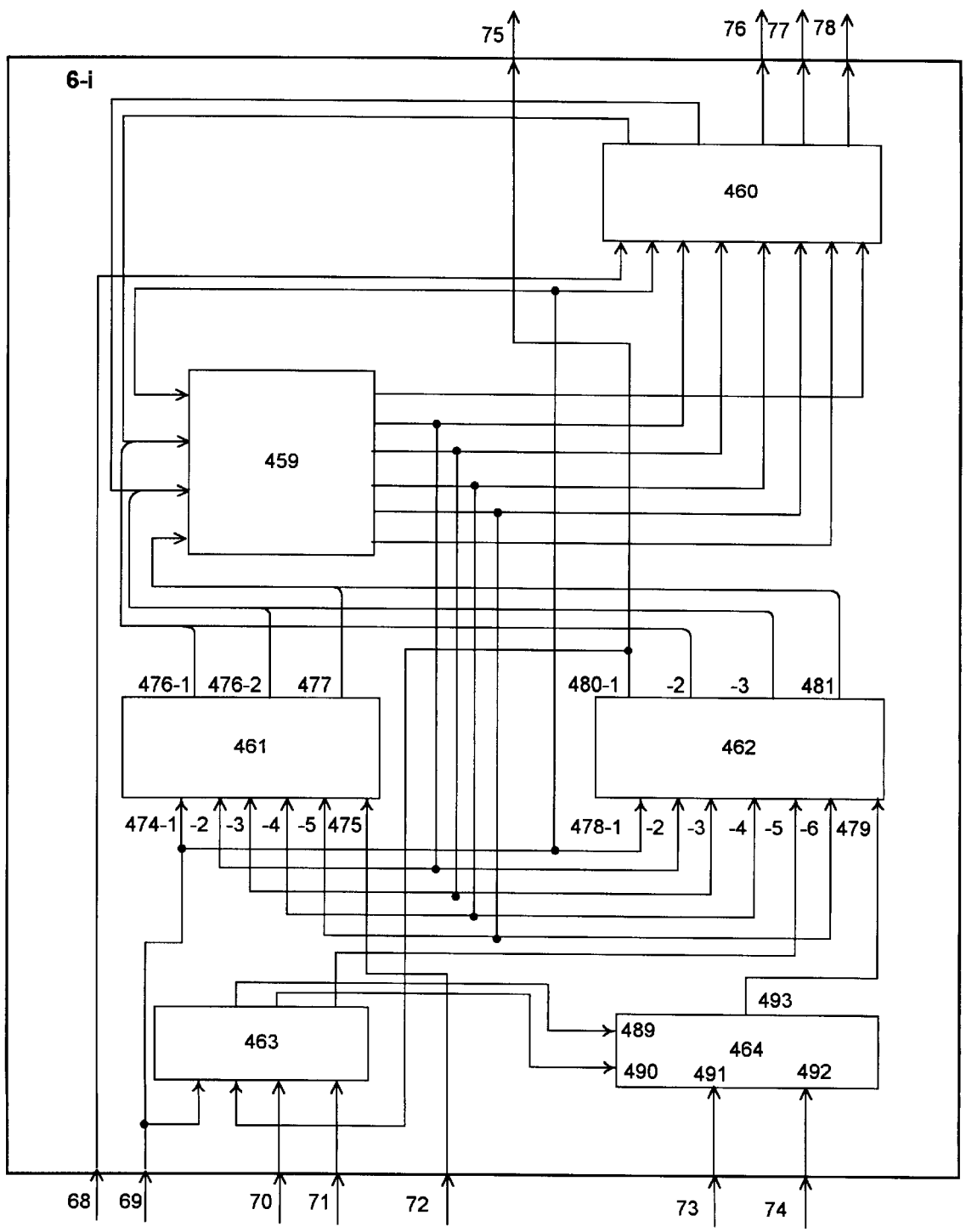
FIG. 34 is a diagram of a fragment routine processing unit of the system in FIG. 1.

Each fragment routine processing unit 6-i (FIG. 34) contains executive unit 459, output register unit 460, loading register unit 461, input register unit 462, control unit 463, and switch 464.

Loading register unit 461 contains the first to fifth control inputs 474-1 ... 474-5, information input 475, first and second control outputs 476-1 and 476-2, and information output 477.

Input register unit 462 contains the first to sixth control inputs 478-1 ... 478-6, information input 479, first to third control outputs 480-1 ... 480-3 and information output 481.

Switch 464 contains first control input 489, second control input 490, first information input 491, second information input 492, and information output 493.

Executive unit 459 (FIG. 35) contains microprocessor 494, memory 495 and exchange bus 496. In place of these units a standard microprocessor set, such as one based on elements of the type Intel 80386, can be used.

Executive unit 459 contains the first to third control inputs 465-1 ... 465-3, information input 466, information output 467, and the first to fifth control outputs 468-1 ... 468-5.

Figure 36:
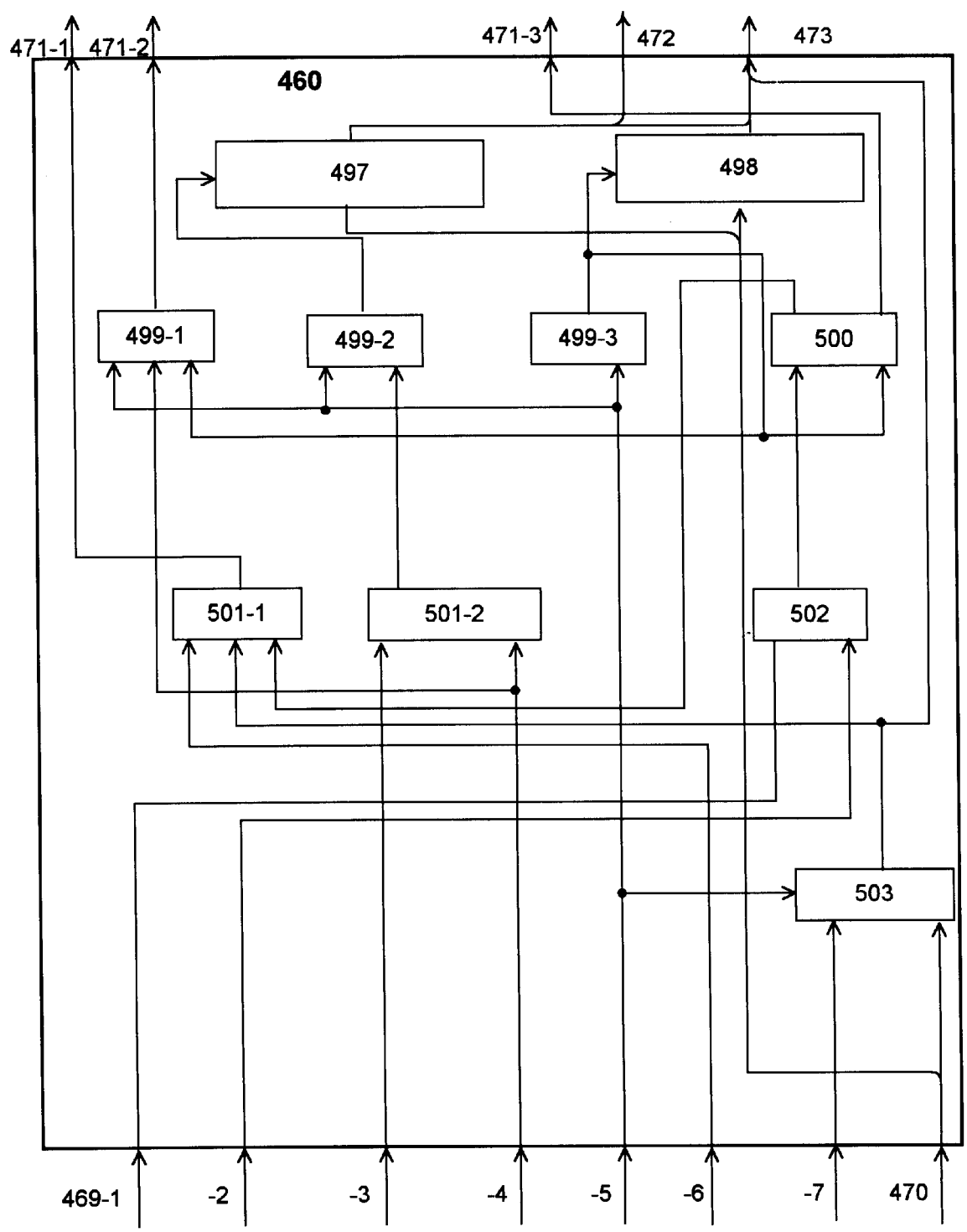
FIG. 36 is a diagram of an output register unit of the processing unit in FIG. 34.

Output register unit 460 (FIG. 36) contains first and second registers 497 and 498, "AND" elements 499-1 ... 499-3, trigger 500, first decoder 501-1, second decoder 501-2, "OR" element 502 and third register 503.

Output register unit 460 contains the first to seventh control inputs 469-1 ... 469-7, information input 470, the first to third control outputs 471-1 ... 471-3, address output 472, and information output 473.

Figure 37:
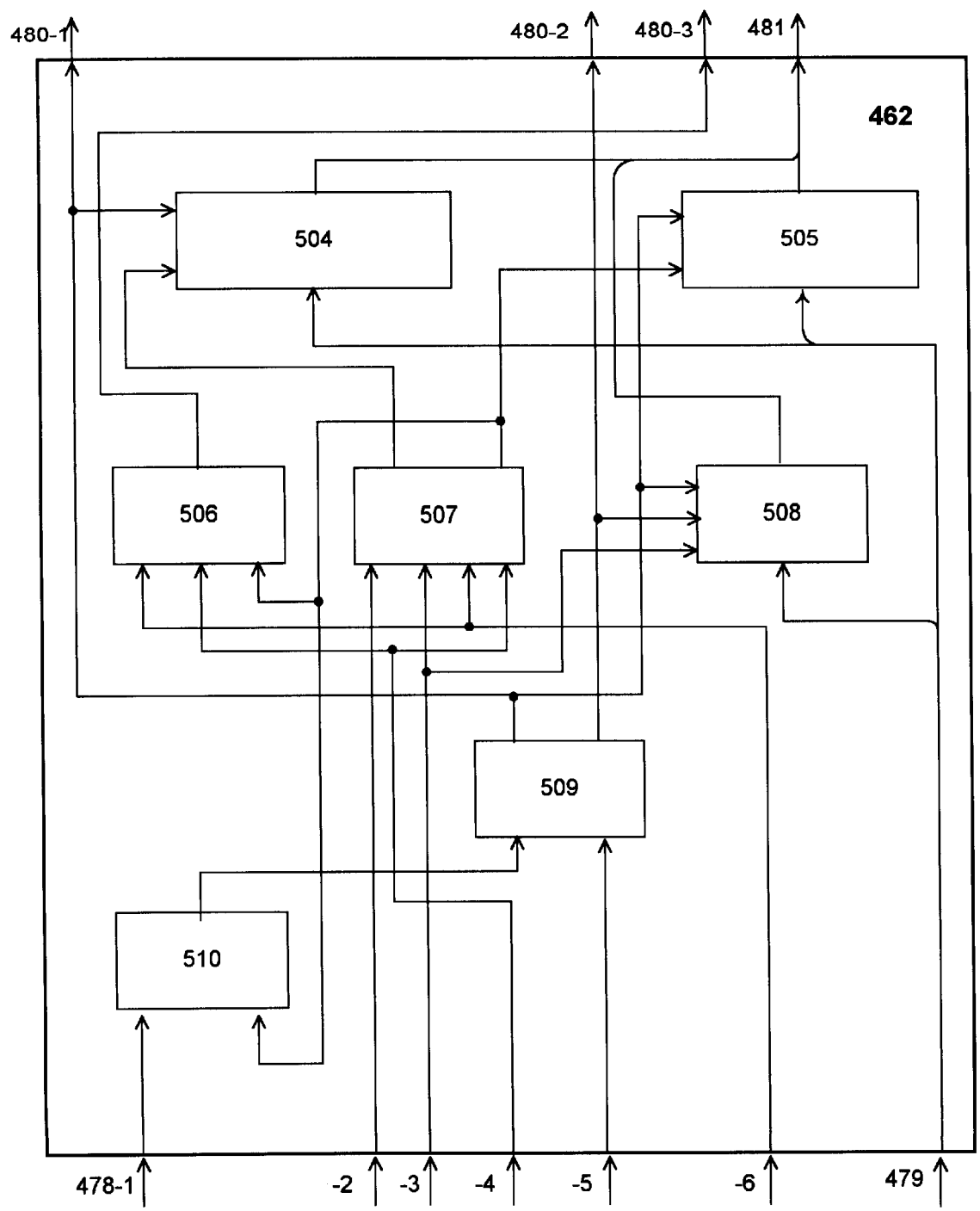
FIG. 37 is a diagram of an input register unit of the processing unit in FIG. 34.

Input register unit 462 (FIG. 37) contains registers 504 and 505, "AND" element 506, decoder 507, register 508, trigger 509 and "OR" element 510.

Loading register unit 461 has an analogous structure.

Figure 38:
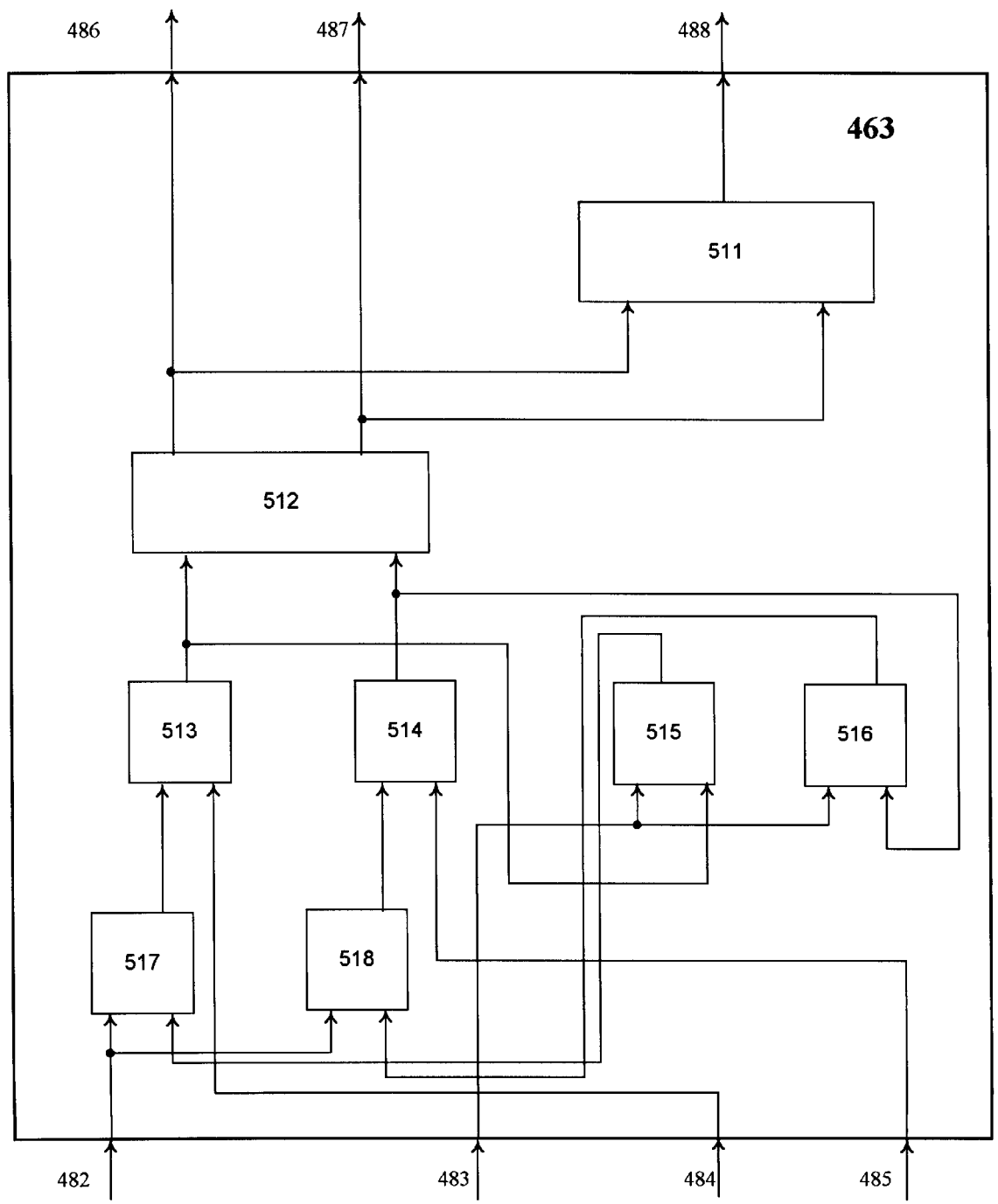
FIG. 38 is a diagram of a control unit of the processing unit in FIG. 34.

Control unit 463 (FIG. 38) contains "OR" element 511, priority coder 512, triggers 513 and 514, "AND" elements 515 and 516, and "OR" elements 517 and 518.

Control unit 463 contains first to fourth control inputs 482 ... 485 and first to third control outputs 486 ... 488.

Figure 39:
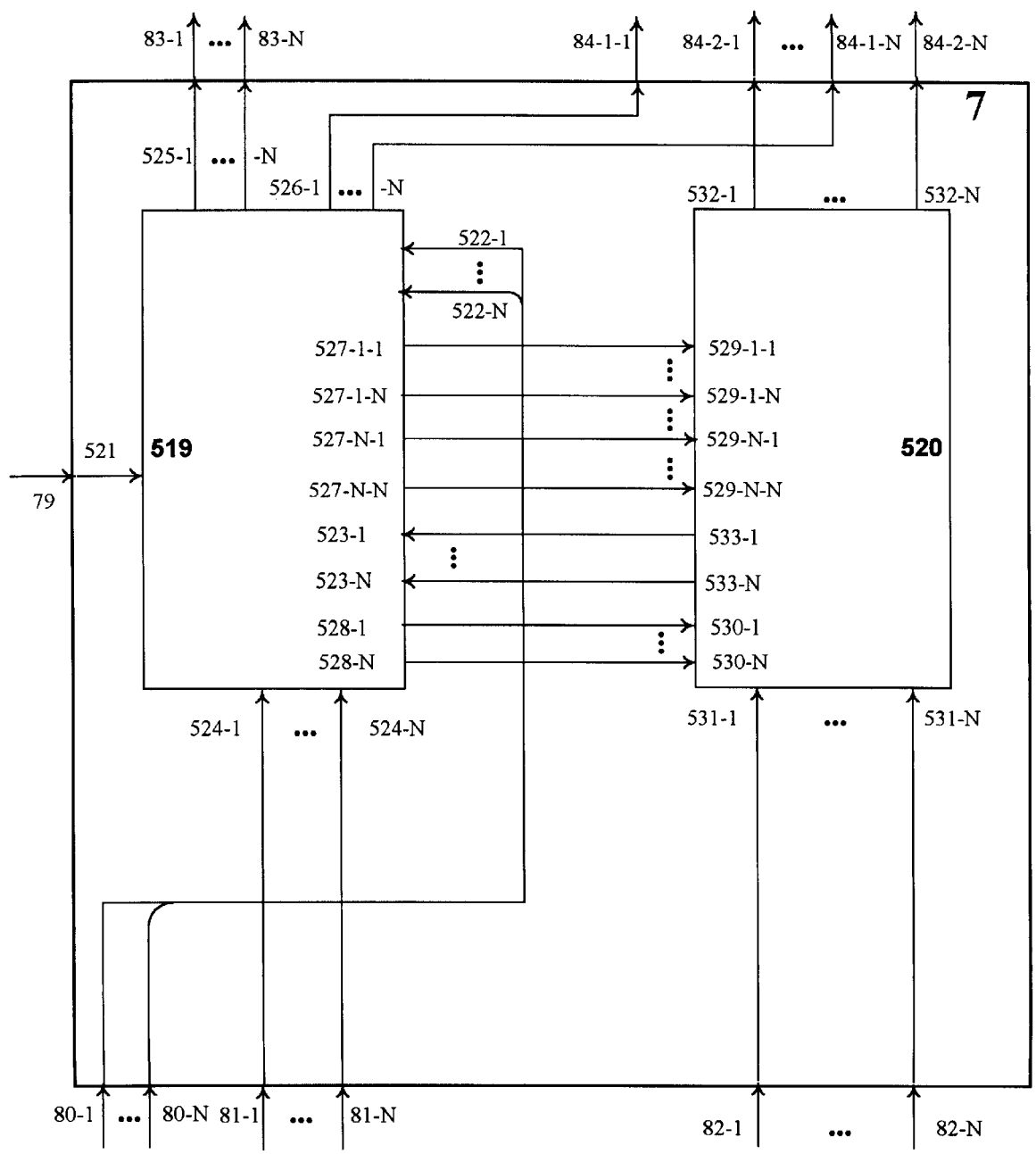
FIG. 39 is a diagram of a first additional switch of the system in FIG. 1.

First additional switch 7 (FIG. 39) contains control unit 519 and switching unit 520.

Control unit 519 contains control input 521, first group of control inputs 522-1 ... 522-N, second group of control inputs 523-1 ... 523-N, third group of control inputs 524-1 ... 524-N, first group of control outputs 525-1 ... 525-N, second group of control outputs 526-1 ... 526-N, N third groups of control outputs 527-1-1 ... 527-1-N to 527-N-1 ... 527-N-N, and fourth group of control outputs 528-1 ... 528-N.

Switching unit 520 contains N first groups of control inputs 529-1-1 . . . 529-1-N to 529-N-1 . . . 529-N-N, second group of control inputs 530-1 . . . 530-N, group of information inputs 531-1 . . . 531-N, group of information outputs 532-1 . . . 532-N, and group of control outputs 533-1 . . . 533-N.

Control unit 519 and switching unit 520 have internal structures similar to the corresponding structures of control unit 303-1 and switching unit 304-1 of second switch 3 (see FIGS. 16–23).

Figure 40:
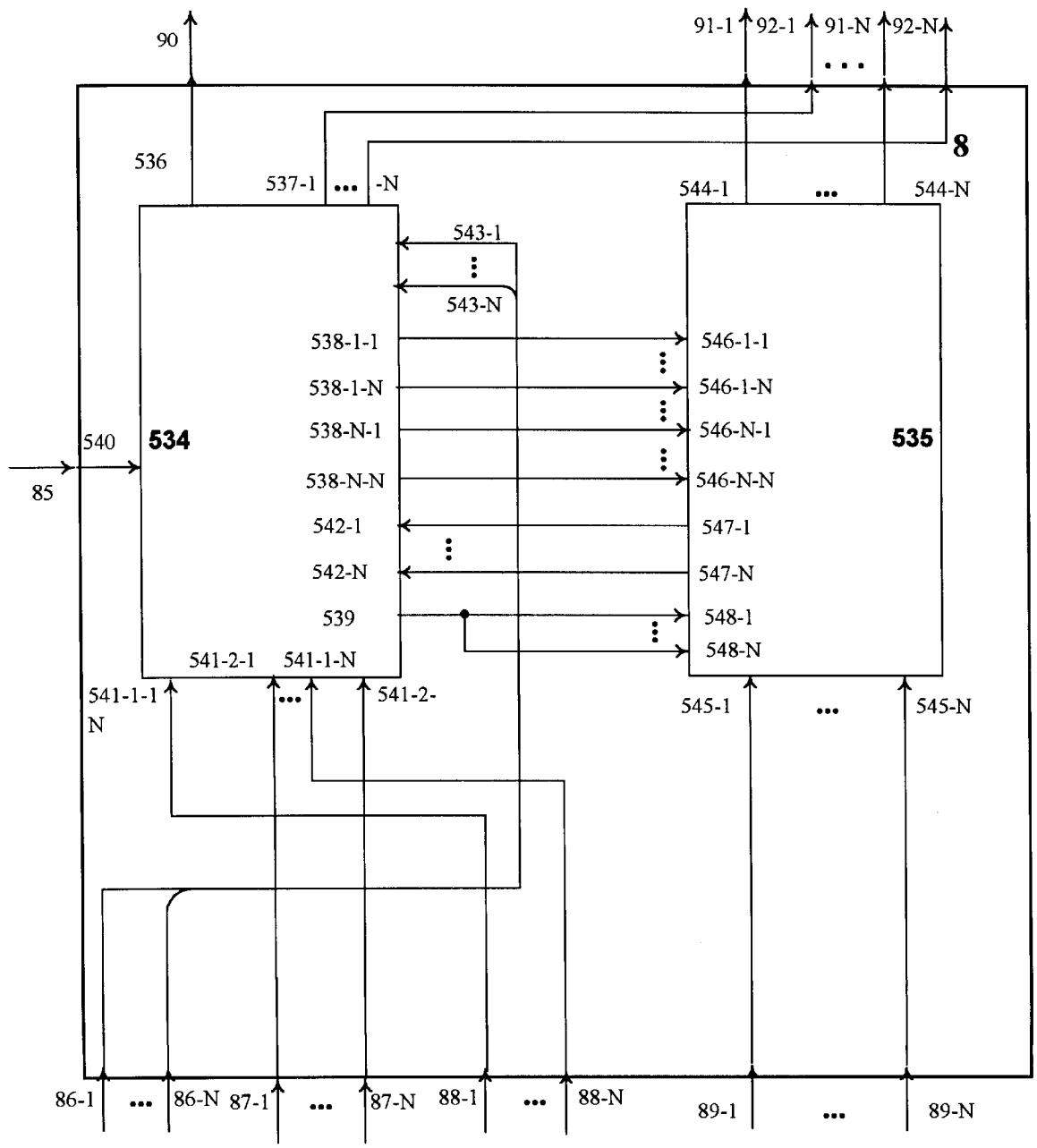
FIG. 40 is a diagram of a second additional switch of the system in FIG. 1.

Second additional switch 8 (FIG. 40) contains control unit 534 and switching unit 535 which have internal structures similar to the corresponding structures of control unit 414 and switching unit 415 of first switch 2 (see FIGS. 29–33).

Control unit 534 contains control output 536, group of control outputs 537-1 . . . 537-N, N groups of channel switching control outputs 538-1-1 . . . 538-1-N to 538-N-1 . . . 538-N-N, receiving control output 539, zero setting input 540, N pairs of inputs containing a control input 541-1-i and an address input 541-2-i (i=1 . . . N), first group of control inputs 542-1 . . . 542-N, and second group of control inputs 543-1 . . . 543-N.

Switching unit 535 contains group of information outputs 544-1 . . . 544-N, group of information inputs 545-1 . . . 545-N, N groups of switching control inputs 546-1-1 . . . 546-1-N to 546-N-1 . . . 546-N-N, group of control outputs 547-1 . . . 547-N, and group of receiving control inputs 548-1 . . . 548-N.

Figure 41:
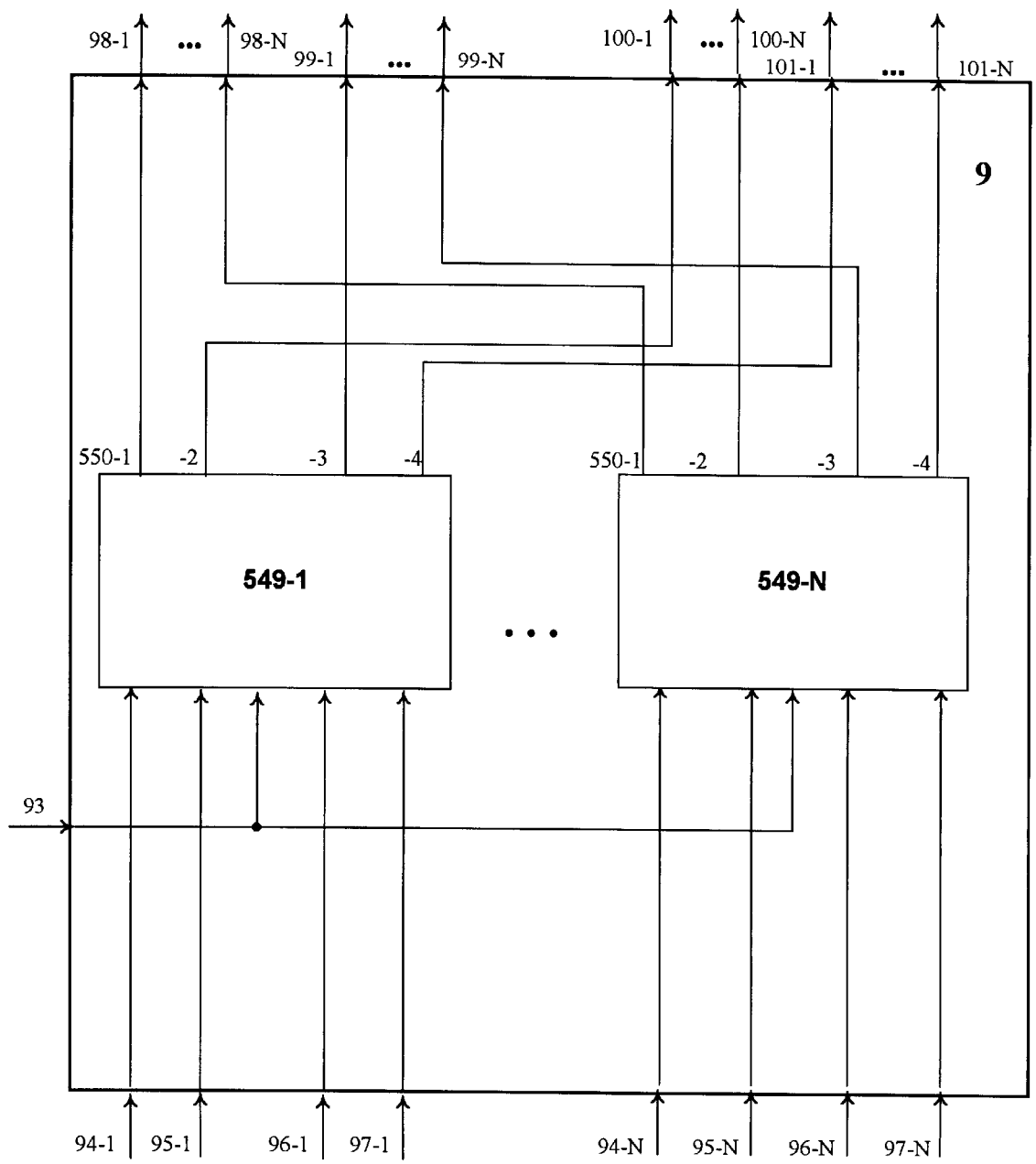
FIG. 41 is a diagram of an additional buffering block of the system in FIG. 1.

Additional buffering block 9 (FIG. 41) contains group of buffer units 549-1 . . . 549-N.

Figure 42:
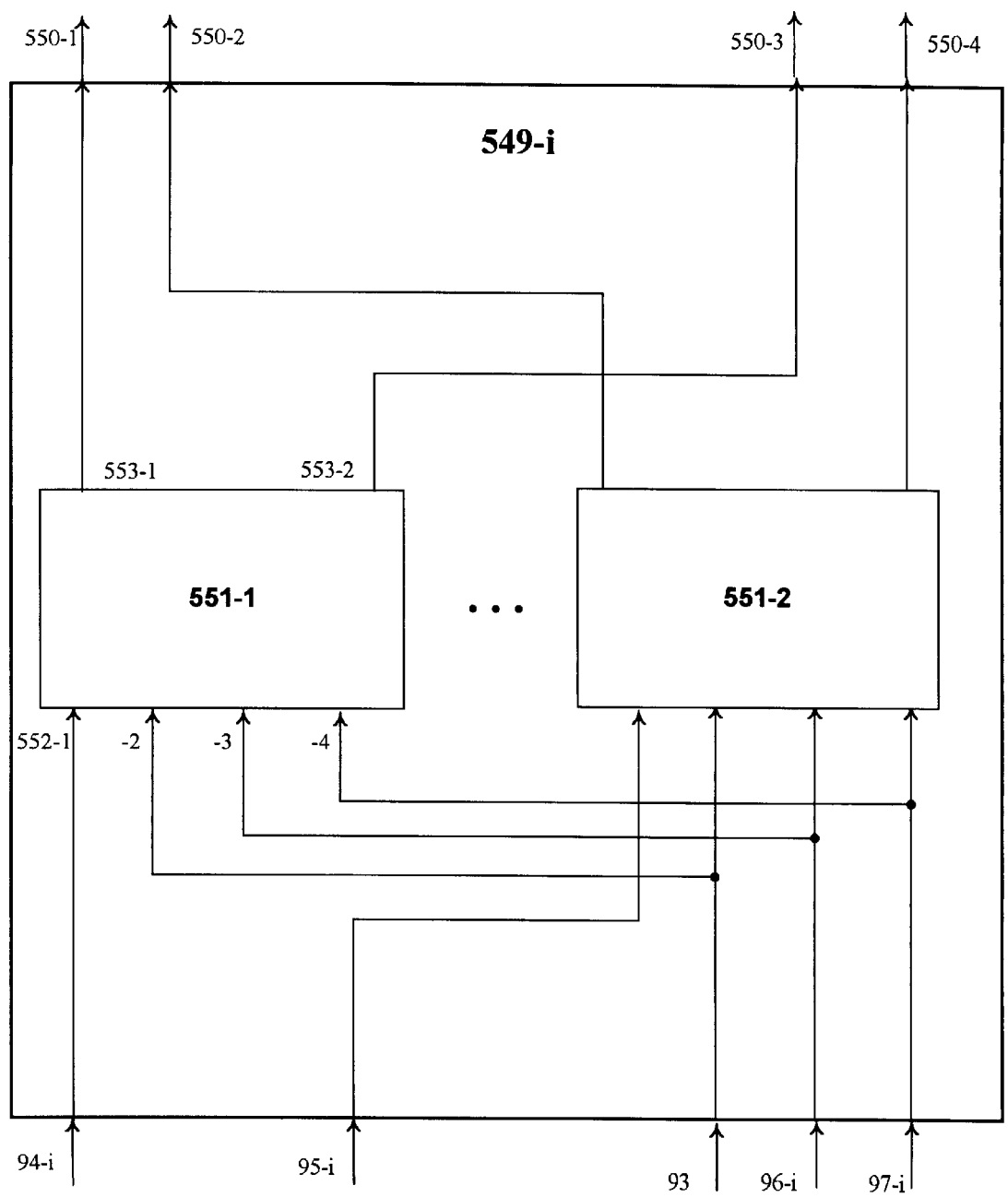
FIG. 42 is a diagram of the buffer unit of the additional buffering block in FIG. 41.

Each buffer unit 549-i (FIG. 42) contains first control output 550-1, second control output 550-2, first information output 550-3, second in with the corresponding input of the first group of control inputs 94-1 . . . 94-N, a second control input connected with the corresponding input of the second group of control inputs 95-1 . . . 95-N, a third control input connected with control input 93, a fourth control input connected with the corresponding input of the third group of control inputs 97-1 . . . 97-N, and an information input connected with the corresponding input of the group of information inputs 961 . . . 96-N.

Each buffering unit 549-i contains the first and the second buffers 551-1 and 551-2. Buffer 551-1 is used for temporary storage and transmission of starting packages of fragment processing, and buffer 551-2 is used for temporary storage and transmission of packages of additional addresses to fragments of routines. Both buffers have the same structure and configuration, similar to the structure and configuration of buffers 391-1 and 391-2 of the corresponding buffer unit 389-i, and differ only in the internal operational logic means of identification of input packet type (see FIGS. 26–28).

Figure 43:
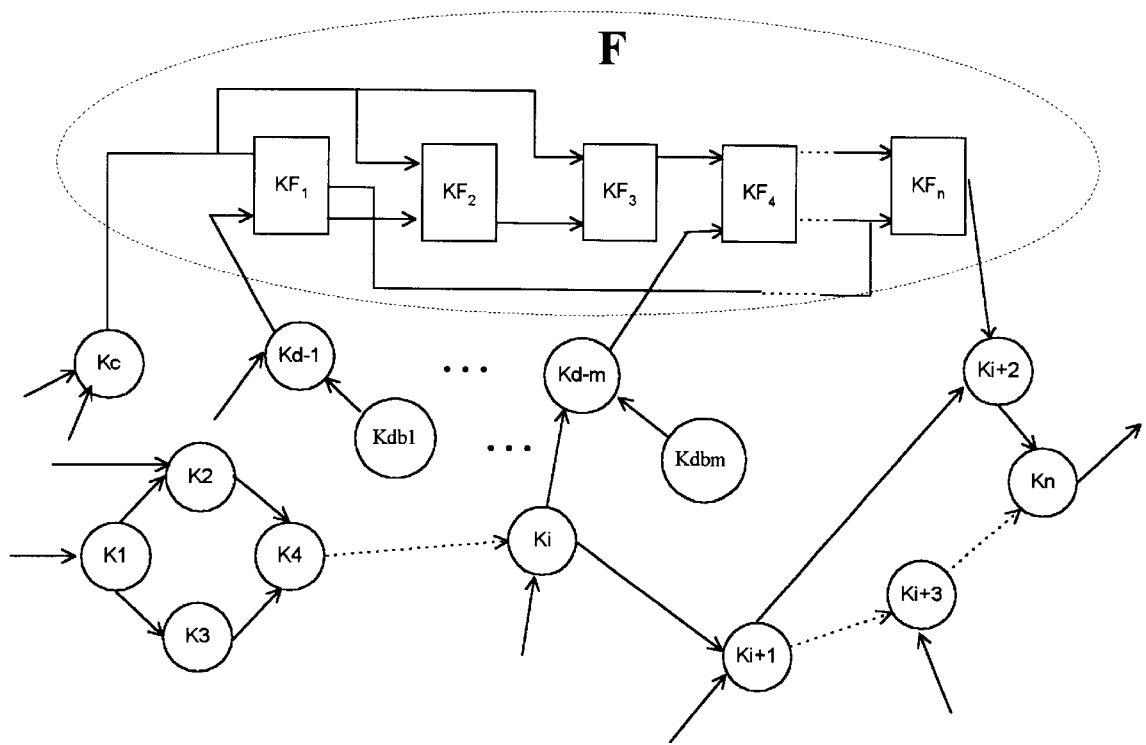
FIG. 43 represents the general appearance of a computation graph.

The principles of computational organization under data flow control assume that the algorithm for solving a task is represented as a graph of the computation process. The graph consists of operations (instructions) on data (operands) and links (directions) by which the data (results) are transmitted from one instruction to another (FIG. 43).

Data processing according to the order defined by the graph is carried out as the data prepared for processing appear at the instruction inputs. The completion of pairs of data related to a particular instruction is performed in memory, which seeks for them by a key. Generally, a key is a code consisting of instruction number bits, an index, an iteration and so on. The best operational realization of such memory, considering volume and speed, would be based on the utilization of optical elements, and considering an increase in performance, it would be optimal to break its whole volume into separate modules.

Each instruction has a number K-i which can be used for allocation in command (instruction) memory, a code of operation (COP-i), and a "destination address" K-j to which the result of processing is related.

Furthermore, an instruction has attributes (signs), determining the conditions of its processing or its type. An instruction can be double-input or single-input, depending on how many operands (one or two) it processes, which is determined by the operation code. An instruction can be double-address or single-address, depending on the number of destinations (to the input of how many instructions) to which its result is transmitted. For example, in FIG. 43, the instruction K1 is a single-input, double-address instruction; the instructions K2 and K-4 are double-input, single-address instructions; and instructions K3 is a single-address, single-input instruction.

Operations, determined by the COP of a given instruction, can be carried out with numeric data (operands) and with supplementary (or service) data (instruction words). The first functional group of instructions utilizes arithmetic operations (operand processing operations), and the second group utilizes instruction word processing operations.

Figure 44:
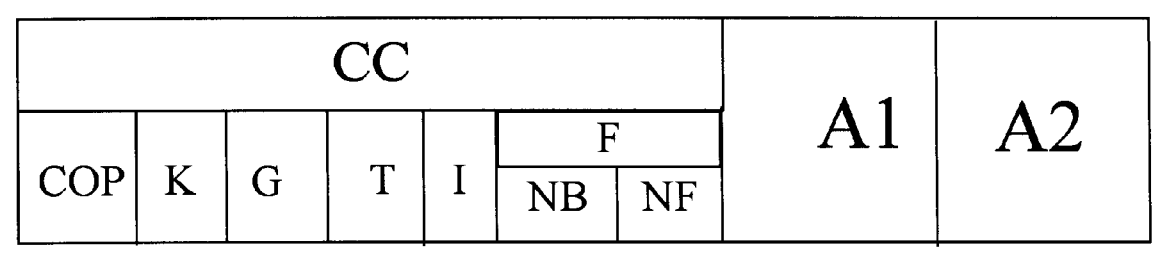

In order to organize the graph processing, instructions and data are represented as information objects consisting of multi-bit words, where the corresponding groups of bits form the fields with the necessary functional assignment (FIG. 44).

Information processing is carried out by executive devices of two different types, which receive the information in the form of operand packets and instruction words packets. Generally a packet includes a status word and two data words, which either are operands or contain supplementary data. A packet of a single-input instruction contains a status word and only one data word.

A status word (CC) contains the following basic groups of functional bits (fields):

COP—code of operation (or instruction);

K—number of instruction;

G—number of generation;

T—number of iteration;

I—index.

F—field of fragment

NB—number of processing block of fragment

NF—number of fragment

The functional fields of a status word can de used in different ways. In particular, the key group of bits for data seeking (searching) in the associative memory modules is determined by the fields K, G, T, I. When searching for input data of a fragment, the field F is added. The field COP also may contain bits indicating the instruction type (single- or double-address, single- or double-input) and the packet type (packet of instruction words or packet of operands).

If an instruction has two outputs, then its processing result will be accompanied by two status words, corresponding to two destinations for transmission of the outputs.

Bit groups of attributes, determining the type of destination instruction, are stored in command memory and are retrieved with its number and code of operation.

Instructions and data that are parts of marked fragments (F) (FIG. 43) are stored in memory 495 of executive unit 459 of the corresponding processing unit and do not occupy space in the associative memory.

The computer system (FIGS. 1, 45, 46) executes both main running routines and marked fragment routines of the program, which is loaded through the first and the second information inputs 10 and 11, and returns the result of processing through the second information output 15. The system executes main running routines by means of data flow control of the computation process and marked fragment routines by means of the von Neumann principle of data processing.

Figure 11:
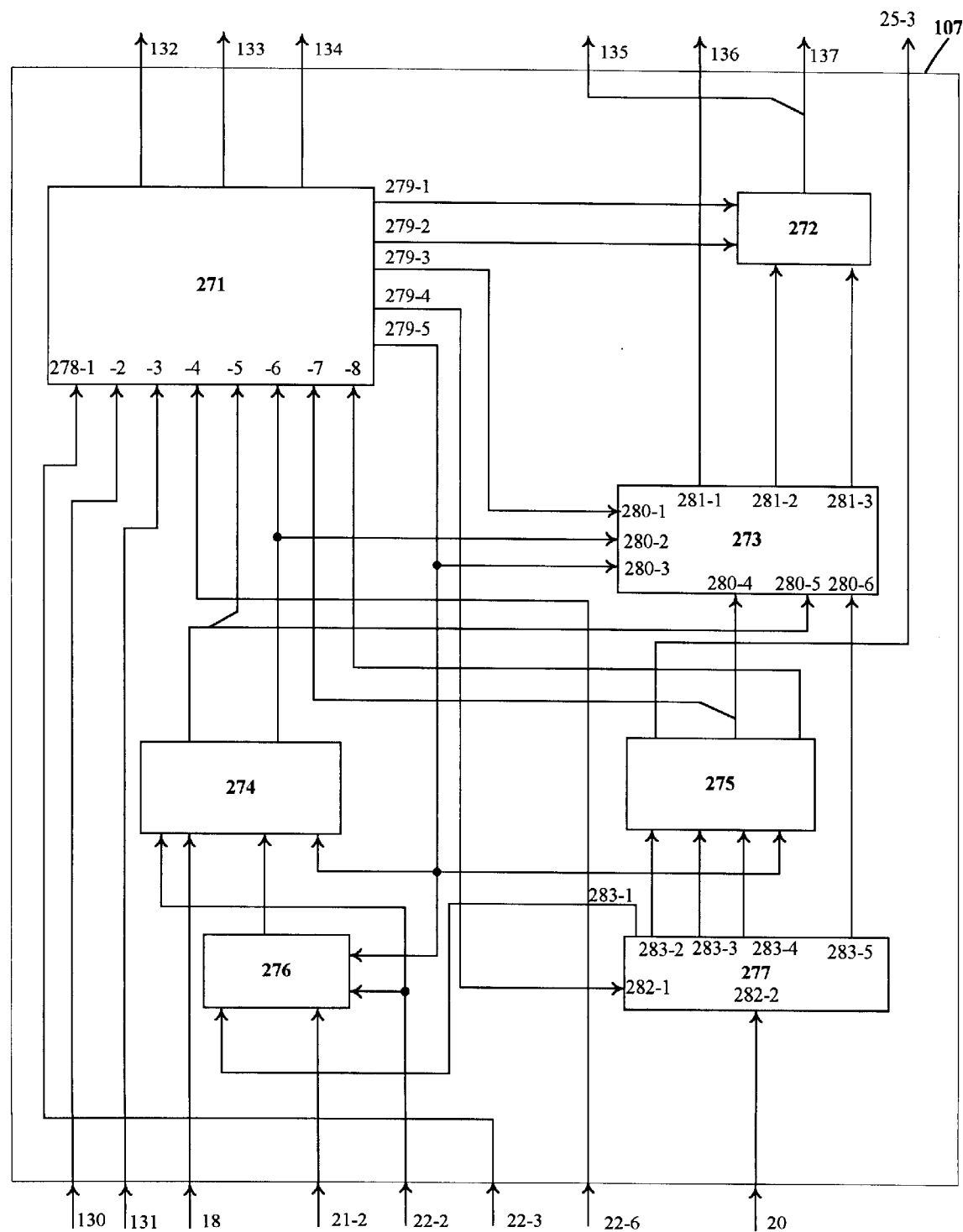
FIG. 11 is a diagram of the executive device for operand processing of the processor unit in FIG. 2.
Figure 35:
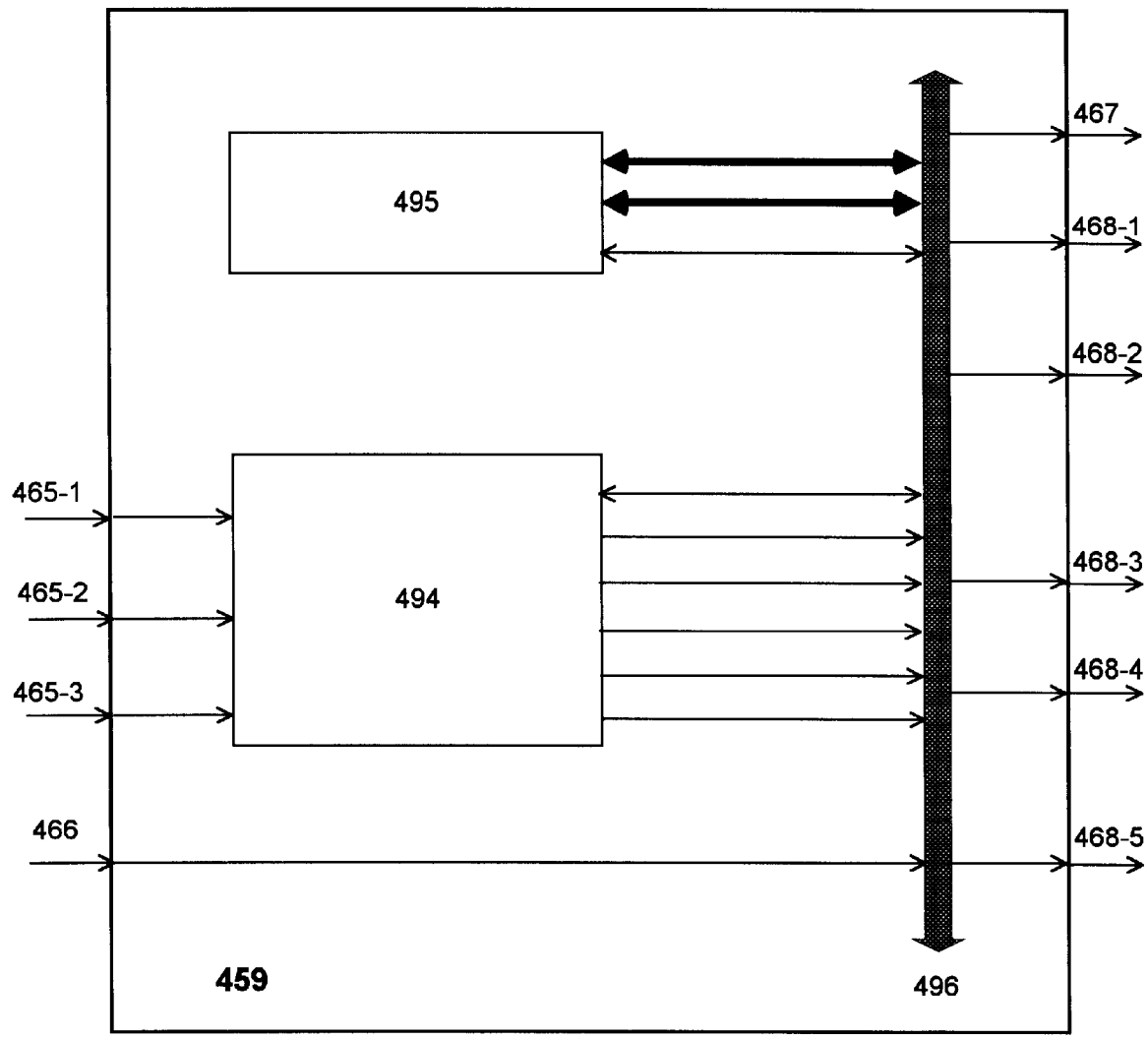
FIG. 35 is a diagram of an executive unit of the processing unit in FIG. 34.

The system realizes its own parallelism of the computational process, represented by the graph, by simultaneously processing all the prepared instructions. All the instructions for the main running routines of the program being executed are stored in command (instruction) memory 146 and 274 for the executive devices 106 and 107 of each of the processor units 1-i. Memory 146 contains all the instructions for instruction word processing, and memory 274 contains all the instructions for operand processing. Instructions and data for the fragment routines are stored in memory 495 of executive unit 459. (FIGS. 5, 11, 35).

Instruction loading (FIGS. 5 and 11) is carried out through the first and the second information inputs 17 and 18 and through the loading switches 148 and 276, for the executive devices 106 and 107, respectively; and (FIG. 35) through information input 466 and bus 496 for the executive unit 459.

The system is started by transmitting starting packets of instruction words and operands from an external (not shown on FIG. 1) system through input 12.

The starting packets with the corresponding control signals are transmitted to the inputs of the third group of information inputs 42-1 . . . 42-N of buffering block 5. The total number of inputs used will be determined by the starting conditions of a particular program.

Buffering block 5 is used to smooth peaks of the input queries on the inputs of the second switch 3. The use of buffering block 5 in the starting process is its additional function.

Figure 25:
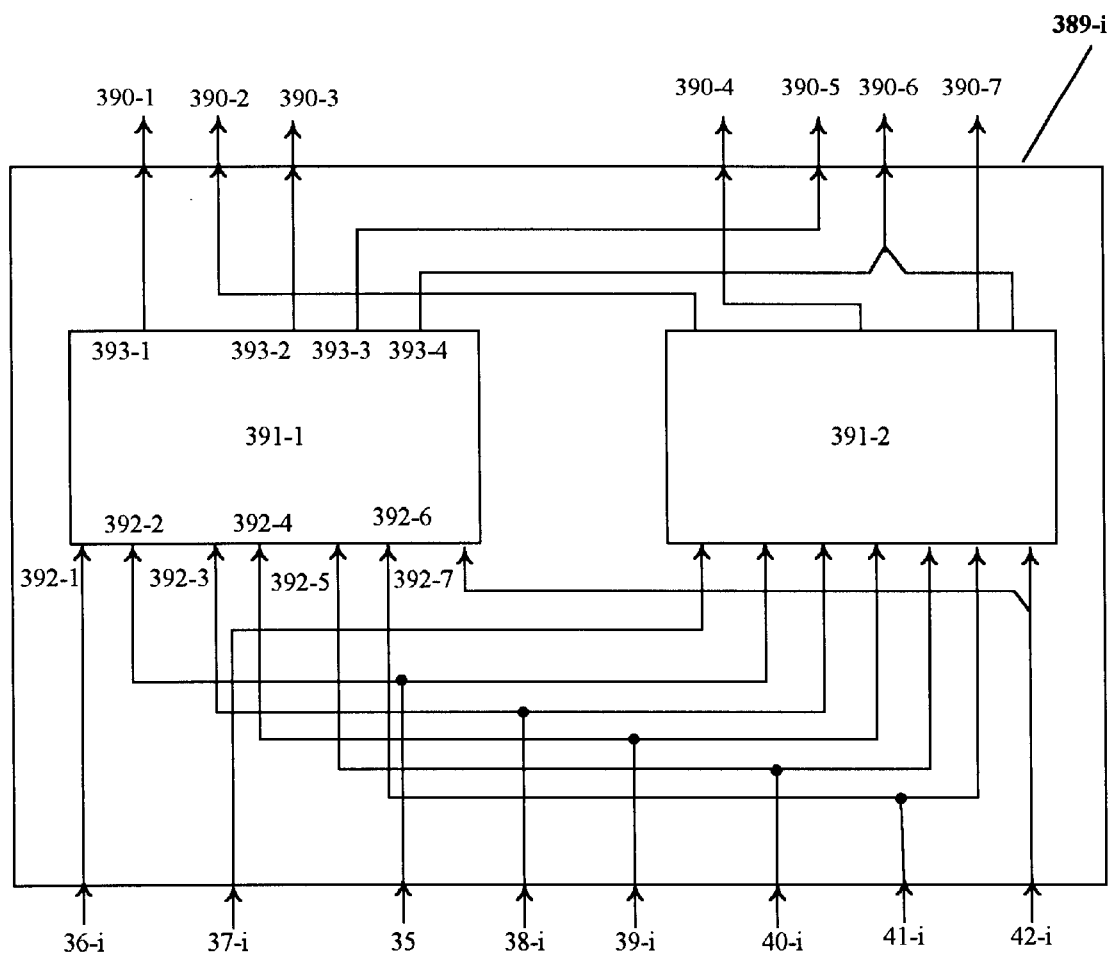
FIG. 25 is a diagram of a buffering unit of the buffering block in FIG. 24.
Figure 26:
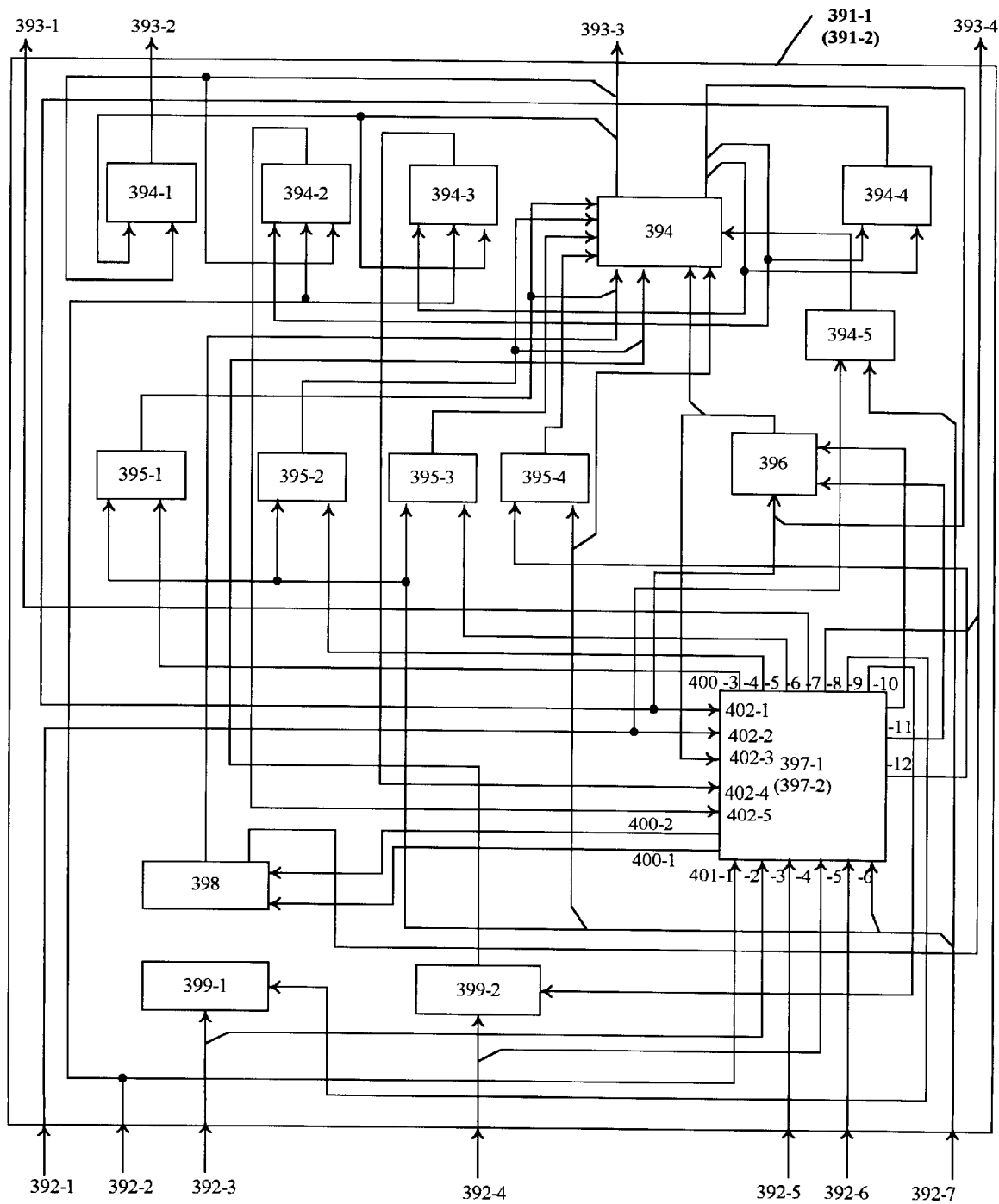
FIG. 26 is a diagram of a buffer of the buffering unit in FIG. 25.

Starting packet bits are transmitted to the information input of the buffering unit 389-i, which, in this case, conducts the starting functions, and further on to the external exchange input 392-7 of buffers 391-1 and 391-2 (FIG. 25). From the buffers 391-1 and 391-2, the starting packets are transmitted to the fourth information input of output switch 394 (FIG. 26). The switching in the output switch 394 is controlled through its fourth control input, to which the corresponding signal is transmitted from control output 400-12 of control unit 397-1 (397-2) through the "AND" element 395-4. This control signal is formed (FIG. 27) at the output of the decoder 406-1-3 (406-2-3), to the input of which the coded bit group determining the type of the starting packet is transmitted. Depending on the type of starting packet, the switch 394 control signal will be formed either in buffer 391-1 (for instruction word receiving) or in buffer 391-2 (for operand receiving).

If the starting packet contains operands, then the bits of the packet from output 393-3 of buffer 391-2 are transmitted (through the second information output of unit 389-i and the i-th output of the third group of information outputs 49-1 . . . 49-N of buffering block 5) to the i-th input of the second group of information inputs 31-2-1 . . . 31-2-N of second switch 3.

The information on the i-th output of the third group of information outputs 49-1 . . . 49-N of buffering block 5 is accompanied by the strobe of transmission (signal of "significance"), which is a control signal of an exchange query, and is transmitted from the i-th output of the fourth group of the control outputs 48-1 . . . 48-N of buffering block 5 to the i-th input of the fourth group of control inputs 30-1 . . . 30-N of second switch 3.

The main function of the second switch is to distribute all received packets over its free outputs.

Figure 15:
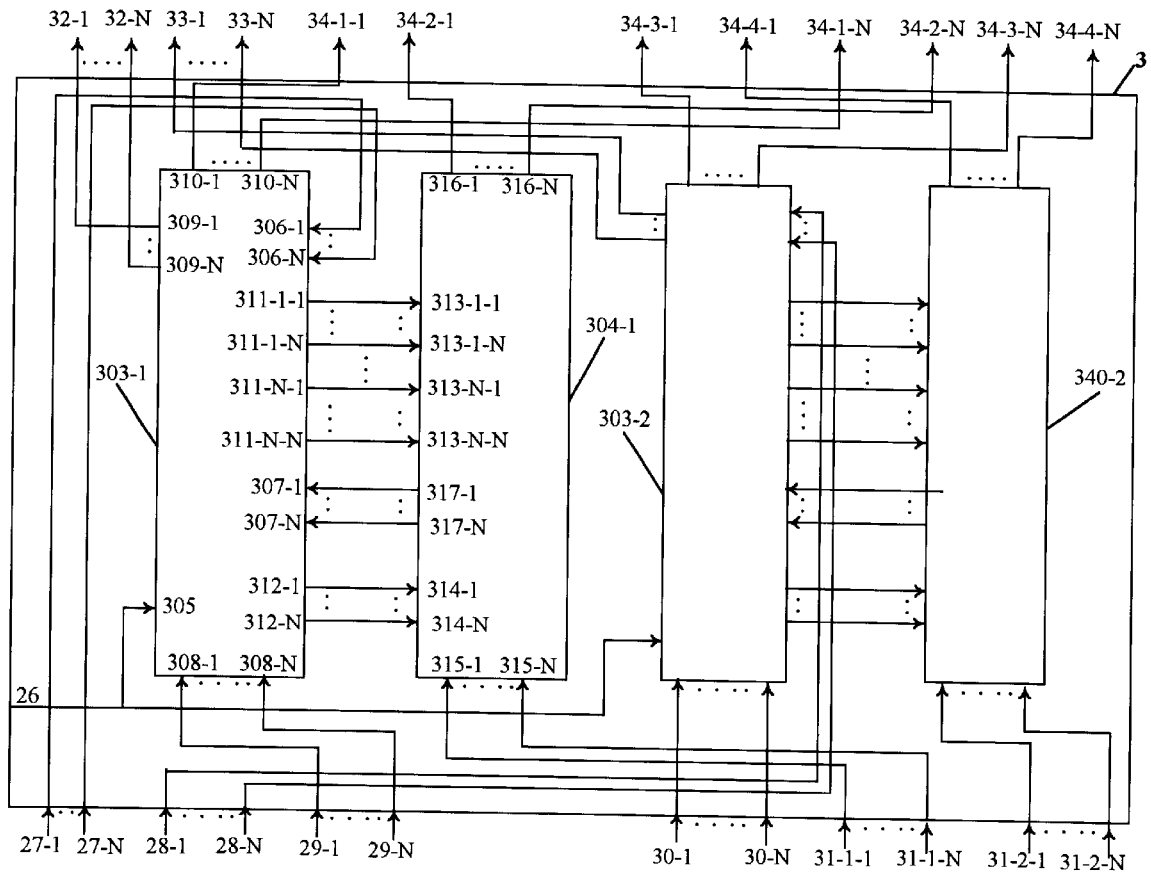
FIG. 15 is a diagram of a second switch of the system in FIG. 1.
Figure 16:
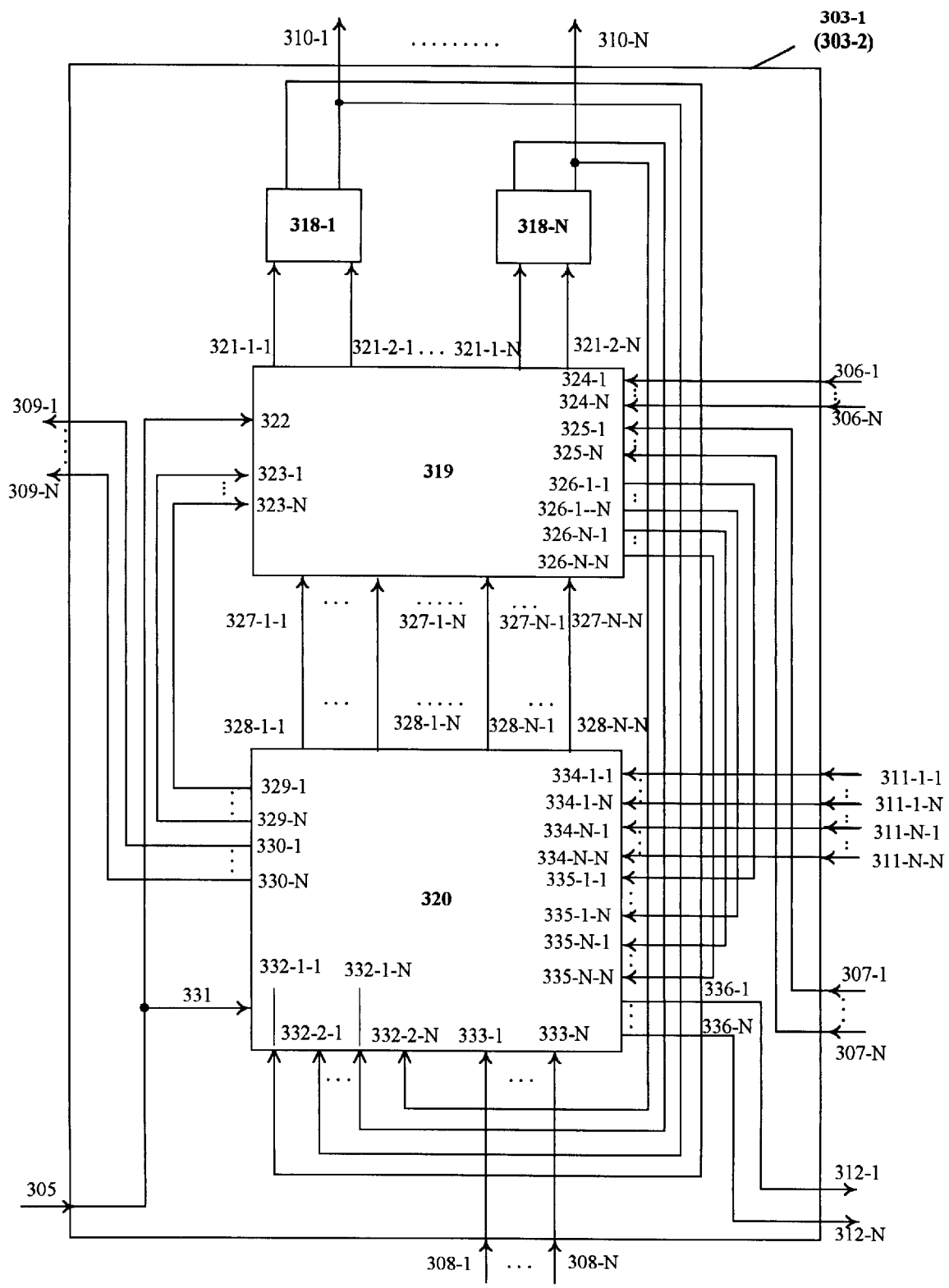
FIG. 16 is a diagram of a control unit of the switch in FIG. 15.
Figure 17:
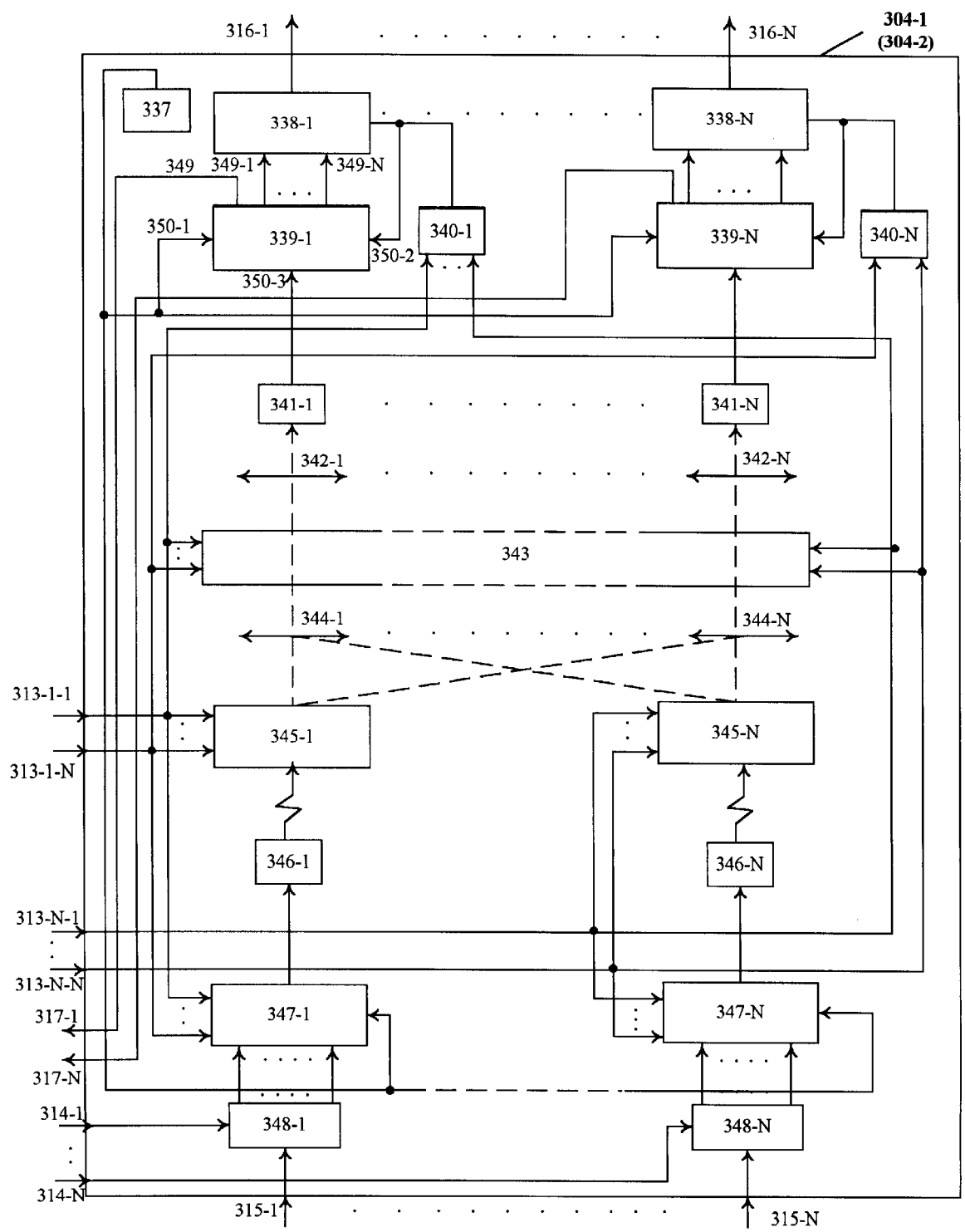
FIG. 17 is a diagram of a switching unit of the switch in FIG. 15.

Transmission strobe and the bits of the operand packets, transmitted respectively to the i-th inputs of the fourth group of control inputs 30-1 . . . 30-N and to the i-th inputs of the second group of the information inputs 31-2-1 . . . 31-2-N of the second switch, are transmitted respectively to input 306-i of control unit 303-2 and input 315-i of switching unit 304-2 (FIGS. 15, 16, 17).

Operand packet bits, transmitted to input 315-i of switching unit 304-2, are received by input register 348-i. the receiving control signal is formed at output 312-i of control unit 303-2.

Switching, including the transmission of packet bits from input 315-i of switching unit 304-2 to its information output 316-j, corresponding to the first "free" output register from the group 338-1 . . . 338-N, is carried out with the help of a spatial optical system.

From the output of register 348-i, the parallel code of the packet bits is transmitted to inputs 353-1 . . . 353-N of transformer-transmitter 347-i. Serial code, formed on output 351, is transmitted to the laser emitter 346-i. The laser signal corresponding to the serial code (through the optical system, which includes the controlled deflector 345-i, a group of optical lens rasters 344-1 . . . 344-N, controlled optical transparency 343, and a group of optical lens rasters 342-1 . . . 342-N) is transmitted to the input of photoreceiver 341-j. From the output of photo-receiver 341-j, the serial code of the input packet is transmitted to the information input 350-3 of the transformer-receiver 339-j. A parallel code corresponding to the bit groups of the packet input at 315-i of switching unit 304-2 is formed on the outputs of register 338-j. And, a signal which determines the end of the formation of the output parallel code is formed on the output 349 of the unit 339-j.

Switching unit 304-2 (FIG. 17) provides information transmission from any input 315-1 . . . 315-N to any output 316-1 . . . 316-N. The transmission is determined by a free register from the register group 338-1 . . . 338-N, which means "free address" switching regime. Signals controlling the corresponding information transformation and switching of the spatial optical system are transmitted to inputs 313-1-1 . . . 313-N-N of switching unit 304-2 from outputs 311-1-1 . . . 311-N-N of control unit 303-2 (FIG. 15).

The formation of the signals mentioned (FIG. 16, 19, 20) is carried out in switching control block 320 when the strobe of transmission is transmitted to input 333-i from input 308-i of control unit 303-2. The strobe of packet transmission, which is formed at trigger 318-j of the group of readiness signal forming triggers, is transmitted to output 310-j of control unit 303-2 (FIG. 16).

Instruction word packet transmission is carried out in the same way with the use of identical functional structures of the buffering block 5 and the second switch 3.

Figure 2:
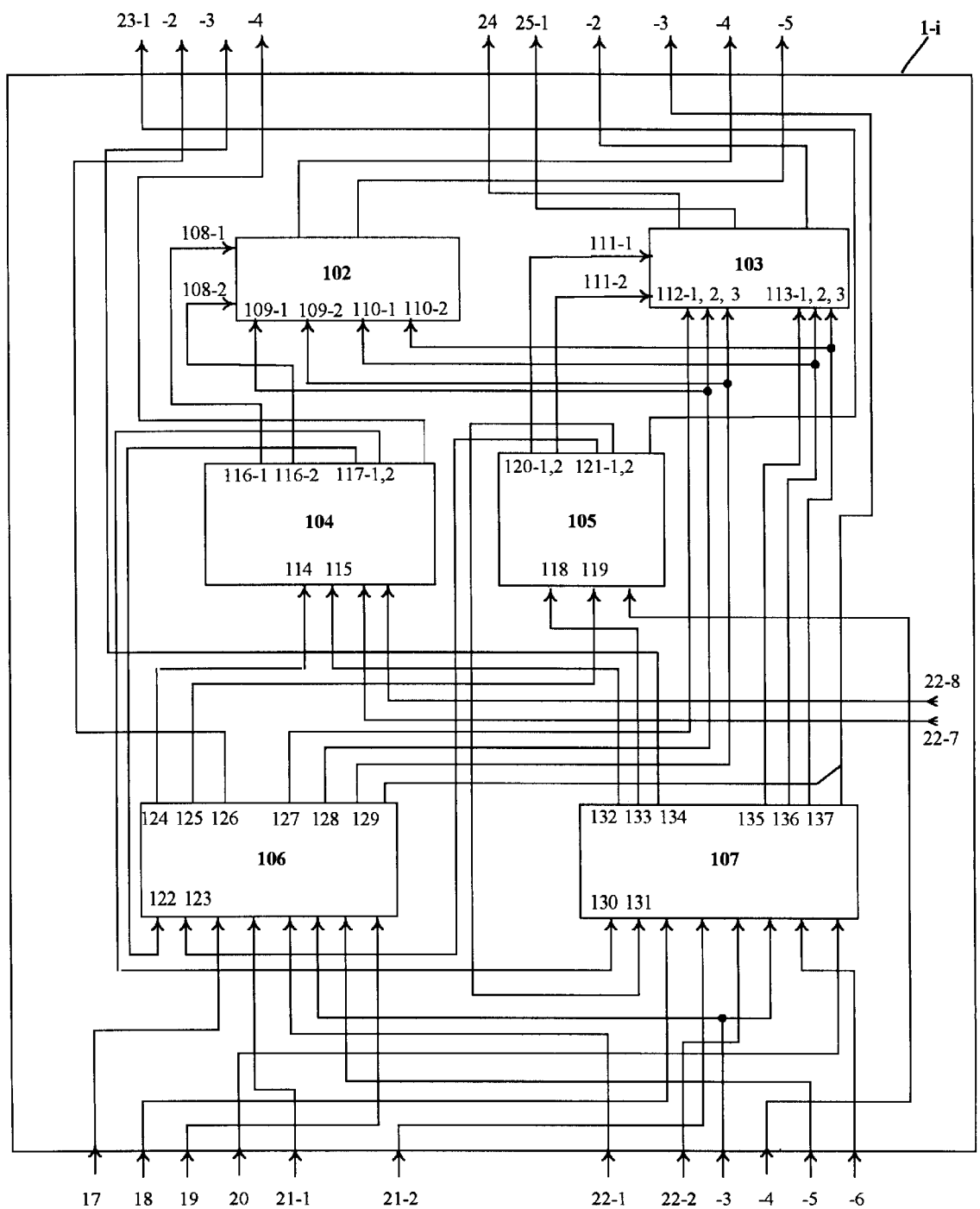
FIG. 2 is a diagram of a data flow processor unit of the system in FIG. 1.

The strobe of transmission and the bits of the operand packet are transmitted, respectively, through outputs 34-3-j and 34-4-j of second switch 3 to inputs 22-6 and 20 of the processor unit 1-j (FIG. 1, 45, 46) and to the corresponding inputs of the executive device 107 (FIG. 2).

The strobe of transmission is transmitted through the corresponding input of executive device 107 to input 278-4 of control unit 271 (FIG. 11) and the bits of the operand packet are transmitted to information input 282-2 of input register unit 277.

Functional fields of the operand packet (FIG. 13) are received by the status word register 298 and the operand registers 299-1 and 299-2 after the receiving control signal is received at input 282-1 of input register unit 277. The bits of the instruction number are transmitted from output 283-1 of input register unit 277 through the first information input of loading switch 276 to the address input of command (instruction) memory 274. The starting control signal is transmitted from output 279-5 of control unit 271 to the retrieval (reading) control input of command memory 274.

The operation code bits and the operand bits, accompanied by the starting control signal, are transmitted from outputs 283-2, 283-3 and 283-4 of input register unit 277 to the corresponding inputs of the ALU 275. The bits of the functional fields of G, T, I are transmitted to input 280-6 of output register unit 273. The bits of functional fields containing the operation code and the instruction number for which the result of computations is destined are transmitted from the information output of command memory 274 to input 280-5 of output register unit 273. This result is transmitted to the input 280-4 of the unit 273.

Inputs 280-1, 280-2 and 280-3 of output register unit 273 receive the corresponding signals that control the reception of the ALU result to the register 300. Registers 301-1 and 301-2 receive the bit fields K and COP of the subsequent instruction. And, register 302 receives bit fields G, T, and K and functional fields resulting from processing the current instruction (half-package).

The functional fields of the result of the current instruction processing (sub-packet) are formed on the outputs 281-1, 281-2 and 281-3 of the output register unit 273. These fields reflect the principles of computation represented by the computation graph and are transmitted respectively to the first information input 136 of executive device 107 and to the information inputs of output switch 272. From output switch 272 transmits, the fields received by the output register are transmitted to address output 135 and second information output 137 of executive unit 107.

Output 135 receives an information field, corresponding to a group of lower bits of the instruction number, which is placed on the register 301-1 (301-2). This group of bits identifies the number of the associative memory module, from the group of modules 4-1 . . . 4-N, allowing the sub-packets to be distributed evenly over the associative memory modules.

The functions of the output switch 272 are determined by the presence of double-address instructions, i.e. the instructions, the processing result of which is the input operand for two following instructions having different number and operation codes. This condition is realized by having two output registers 301-1 and 301-2 for instruction numbers. The content of the output registers is sequentially transmitted through switch 272 to outputs 135 and 137 accompanying the result which is transmitted to the output 136.

Control signals are transmitted from outputs 279-1 and 279-2 of control unit 271 to the control inputs of output switch 272.

Output switch 272 control signals are formed after the functional fields of the type of instruction and of the strobe of transmission are transmitted from the information and control outputs of command memory 274 to inputs 278-5 and 278-6 of control unit 271 respectively and after the signal of significance of the result is transmitted from the information output of the ALU to the input 278-7.

The functional fields of the instruction type include the following attributes: 1A (single-address instruction), 2A (double-address instruction), 1I (single-input instruction), 2I (double-input instruction), which are transmitted (FIG. 12) to the triggers 295-2 . . . 295-5. The status of the triggers influences the formation of the control signals on outputs 279-1 and 279-2 of control unit 271. The transmission strobes corresponding to the attributes of the single-input or double-input instructions, are formed on the first and second control outputs 132 and 133 of the executive device 107 (FIG. 1). And, bits of the functional fields corresponding to the attributes of the sub-packet are formed on the first and the second information outputs 136 and 137.

Referring to FIG. 2, in the single input regime, the bits of the sub-packet are transmitted from outputs 136 and 137 to the outputs 21-4 and 21-5 of the j-th processor unit through switch 102, which is controlled by the outputs 116-1 and 116-2 of unit 104. In the double-input instruction regimes, the bits of the sub-packet are transmitted from the outputs 136 and 137 to the outputs and 25-1 and 25-2 of the j-th processor unit through switch 103, which is controlled by the outputs 120-1 and 120-2 of the unit 105.

The control signals are formed when input 115 of the unit 104 and input 118 of the unit 105 receive the strobes of transmission respectively from the outputs 132 and 133 of the executive device 107. Information regarding the number of the associative memory module is transmitted from output 135 of the executive device 107 to the address output 24 of the processor unit only in the double-input instruction regime, since running a single-input instruction does not require searching for a second operand.

Figure 29:
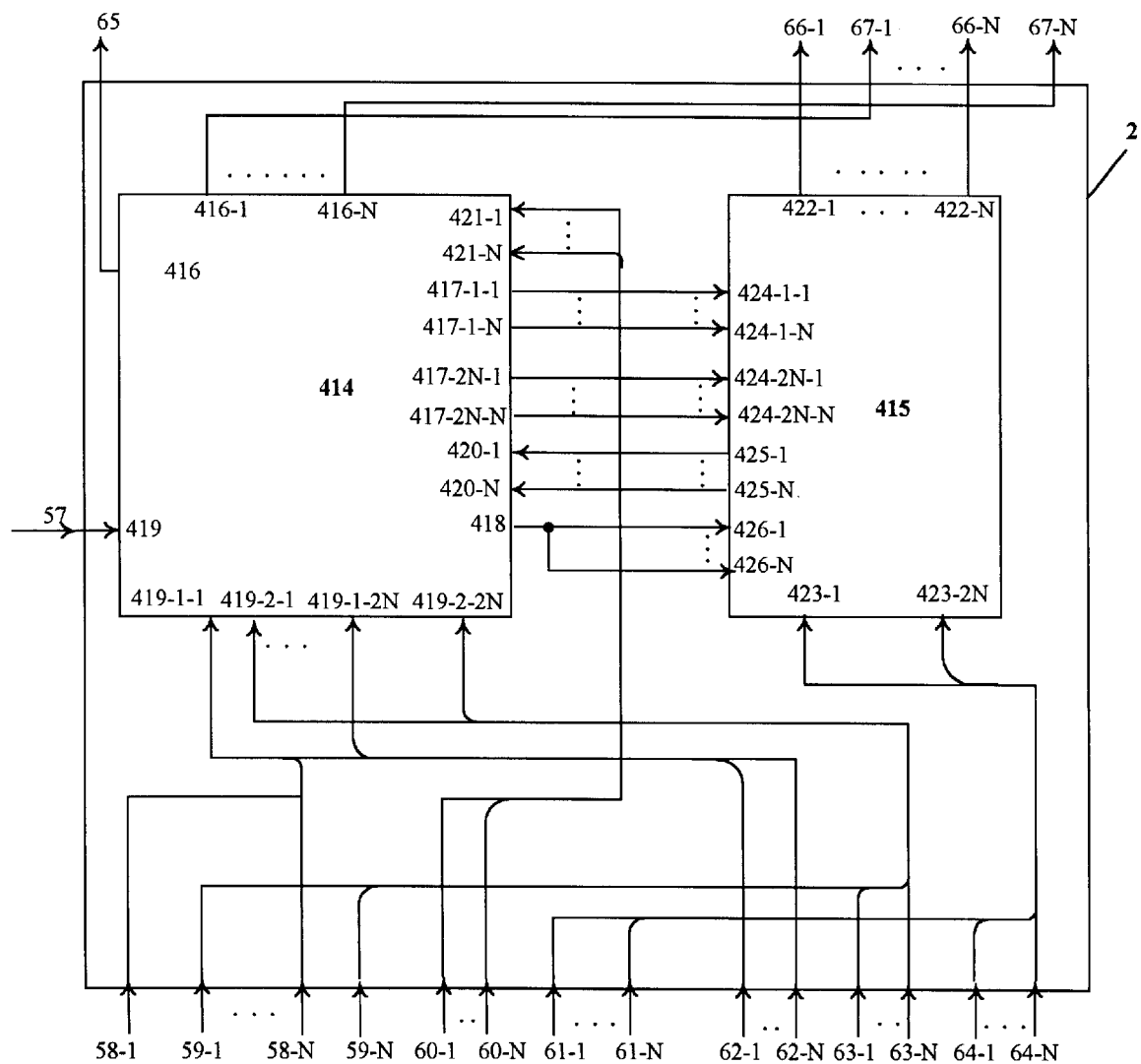
FIG. 29 is a diagram of a first switch of the system in FIG. 1.

When the result (operand) output from the corresponding executive device is one for a double-input instruction, the search for the pair operand is conducted in an associative memory module. The number of the particular module (further on referred to as "address") is determined by the bit group on the output 24 of the processor unit. Access to the group of associative memory modules 4-1 . . . 4-N is realized by means of the first switch 2 (FIG. 29).

Here, the j-th inputs of the first group of control inputs 58-1 . . . 58-N, the second group of address inputs 59-1 . . . 59-N, and the second group of control inputs 61-1 . . . 61-N of the first switch 2 receive bits (control signals) from outputs 23-1 and 24 of the j-th processor unit indicating the number of the associative memory module and from outputs 25-1 and 25-2 of the j-th processor unit indicating the functional fields of the sub-packet.

First switch 2, which includes control unit 414 and switching unit 415, provides data transmission output, unlike second switch 3, to a "fixed" address as determined by the assigned number of the associative memory module.

Figure 30:
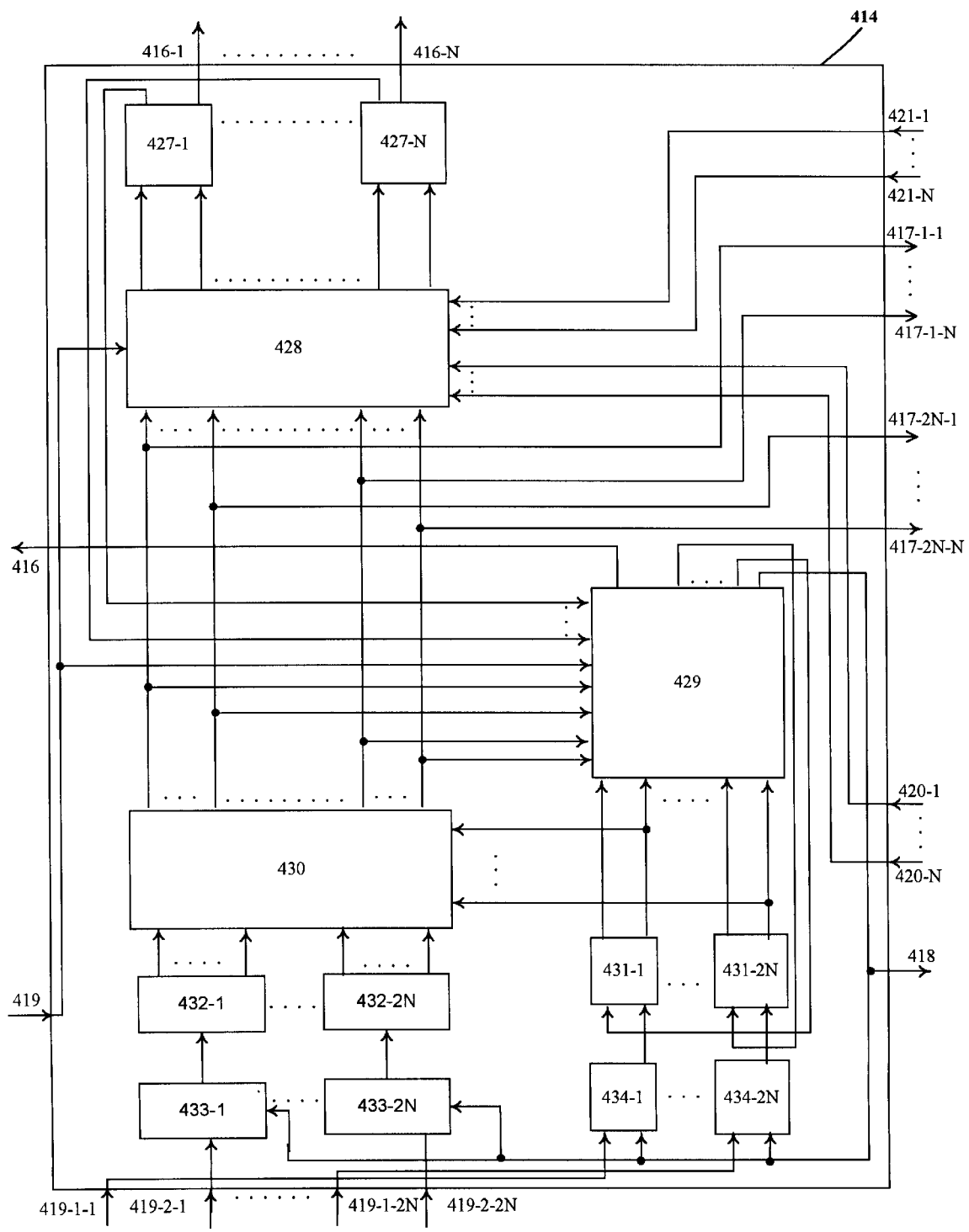
FIG. 30 is a diagram of a control unit of the switch in FIG. 29.

The switching conditions are realized in the control unit 414 (FIG. 30). Inputs 419-1-j and 419-2-j of control unit 414 receive the corresponding control information from inputs 58-j and 59-j of first switch 2. Then, the following operations are carried out: the address is received in register 433-j, query trigger 431-j is set, a position code corresponding to the k-th associative memory module is formed at the k-th output of the decoder 432-j and these signals are transmitted to the inputs 448-1 . . . 448-N and 447-1-1 . . . 447-N-N of switching control unit 430. Switching control signals are formed at outputs 446-1-1 . . . 446-N-N of switching control unit 430 and are transmitted to outputs 417-1-1 . . . 417-N-N of control unit 414.

The mentioned signals are formed at the outputs of priority coders 457-1 . . . 457-N (FIG. 33), which play the part of priority schemes, realizing the queuing of queries to each of the associative memory modules.

The control signals from the outputs 417-1-1 . . . 417-N-N of the control unit 414 are transmitted to a group of switching control inputs 424-1-1 . . . 424-N-N of the switching unit 415 The structure and functioning of switching unit 415 are totally analogous to those of the switching units 304-1 and 304-2 of second switch 3. Input 424-j-k of switching unit 415 receives a signal controlling the k-th input of the j-th deflector from the group 345-1 . . . 34N (FIG. 17), and the output 66-k of first switch 2 receives bit fields corresponding to those received at information input 61-j of first switch 2. The corresponding transmission strobe is formed at trigger 427-k (FIG. 30) and is transmitted through output 416-k of control unit 414 to output 67-k of first switch 2.

Bits of the functional fields of the sub-packet and the transmission strobe are transmitted from the outputs 66-k and 67-k of the first switch 2 to the inputs 52 and 53 of associative memory module 4-k. The bit field of the status word (as a key for associative seeking) and the bit fields of the operand and the transmission strobe are transmitted respectively to inputs 413-1, 413-2 and 412-3 of the associative memorizing unit (AMU) 408. The bit field of the status word is also transmitted to the information input of the buffering register 407. The control input of the buffering register 407 receives the transmission strobe from the second control input 53 of the associative memory module.

A sub-packet (half-packet) which does not have a pair "stays" in memory.

When the AMU contains the corresponding pair operand, the bit fields of the first and the second operands are formed at outputs 409-1 and 409-2. The bit fields of the first and the second operands, together with the bit field of the status word (at the output of register 407), are transmitted to the information input of the associative memory module 4-k. The second control output 56 of the associative memory module 4-k receives the transmission strobe which is formed at the first control output 410 of the AMU 408.

Having been formed at the information output 51 of the associative memory module k, the ensuing packet is transmitted to input 40-k of buffering block 5 and then to the corresponding input of the buffering unit 389-k. Input 41-k of the buffering unit 389-k receives the transmission strobe from the second control input 56 of the associative memory module 4-k through the corresponding input of buffering block 5.

If the received packet is an operand packet, its functional fields bits are received by the register 399-2 of the buffer 391-2, and the corresponding receiving control signal is formed at output 400-9 of control unit 397-2.

Bit fields of the packet output from register 399-2 are transmitted to the second information input of switch 394. The corresponding control input of switch 394 receives the switching control signal from the output of "AND" element 395-1. The switching control signal and the bit fields of the packet are transmitted to the first input of the switch 394 and function as a strobe of transmission which is completed at the output of the "OR" element 394-1.

If the corresponding input register 348-k in switching unit 304-2 of switch 3 is free, then input 31-2-k of switch 3 receives a packet of operands from the first output of switch 394 through output 393-3 of buffer 391-2, through output 390-6 of the buffering unit 389-k and through output 49-k of block 5. Correspondingly, the transmission strobe is transmitted to input 30-k of switch 3 from the output 48-k of buffering block 5 and the next processing cycle is run.

When reception by switch 3 is closed, as in the case when register 348-k in unit 304-2 is occupied, a signal blocking transmission is transmitted from the switching unit to the input 37-k of the buffering block 5. The signal blocking transmission is transmitted through the corresponding input of the unit 389-k to input 392-1 of buffer 391-2 and then to input 402-2 of control unit 397-2 and the input of "OR" element 394-5. At the output of the "OR" element the control signal is formed. The control signal is transmitted to the fifth control input of switch 394. Information received from the second input of switch 394 is transmitted through the second output of switch 394 and then is accompanied by the loading signal from the output 400-11 of the control unit 397-2 and transmitted to an input of the RMU 396. Information loading to RMU 396 will be carried out until the blocking signal is cleared from input 37-k of buffering block 5. When the signal is cleared and if there is no information at the registers 399-1 and 399-2 and at the fourth information input of the switch 394, the bits of the packet are transmitted from RMU 396 through the third information input of switch 394 to output 393-3 of the buffer 391-2 and to the corresponding input 49-k of buffering block 5, and through the corresponding inputs and outputs of switch 3 to the fourth information input 20 of the k-th processor unit.

If the result, obtained in executive device 107, does not require a search for the corresponding pair, which is determined by the single-inputness of the instruction, then the result of processing and the corresponding strobe of transmission are transmitted from the corresponding outputs of the switch 102 and the control unit 104 (FIG. 2) to outputs 25-4, 25-5 and 23-4 of the k-th processor unit respectively. The bit fields of the result and the corresponding control signals are formed analogously to the result of the double-input instruction. The sub-packet bits and the strobe of transmission are transmitted to the inputs 38-k and 39-k of buffering block 5.

Figure 27:
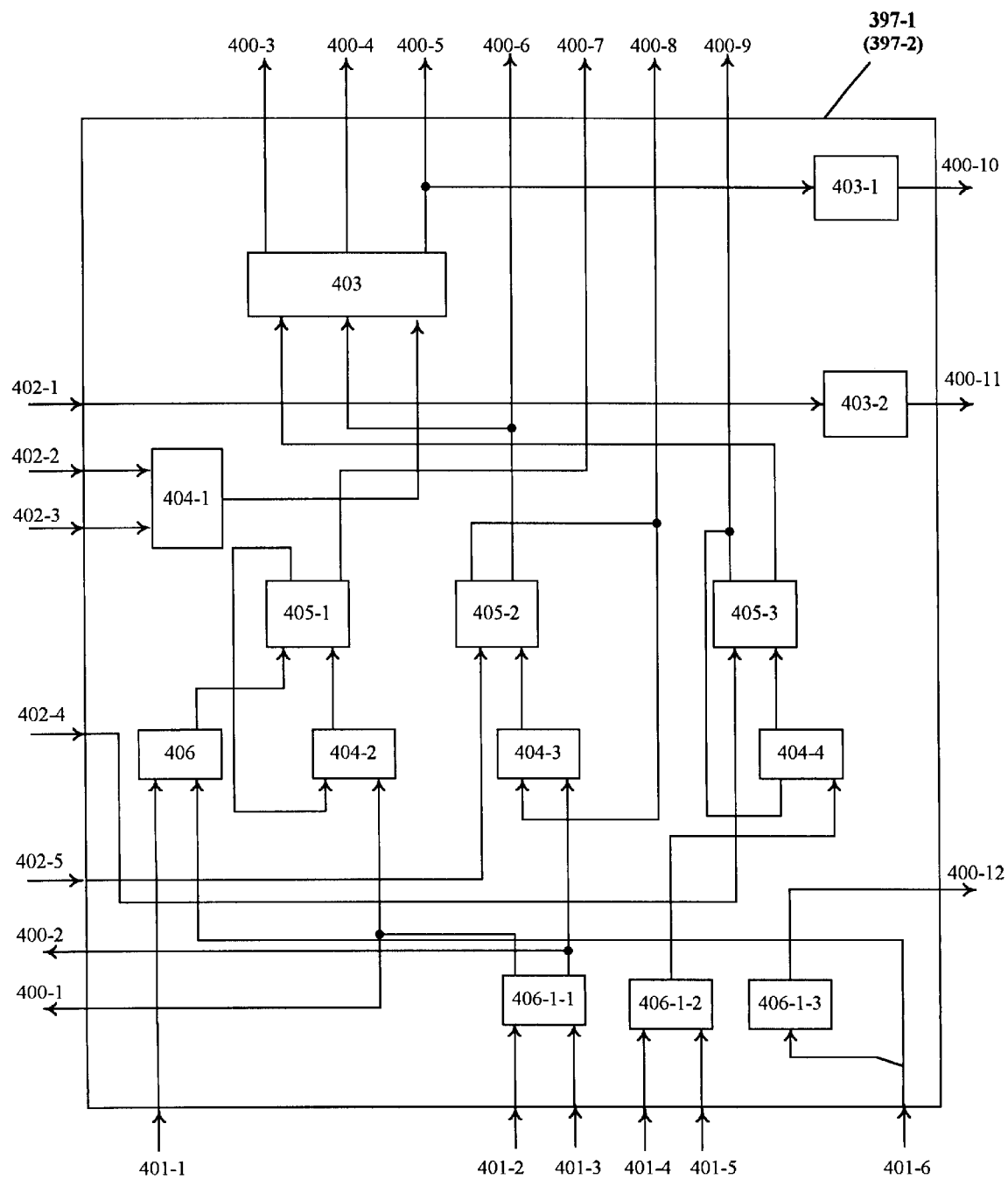
FIG. 27 is a diagram of a control unit of the buffer in FIG. 26.

If the transmitted sub-packet is an instruction word, it is received by the register 399-1 of the buffer 391-1. The corresponding control signal is formed at output 410-8 of control unit 397-1. The bits of the sub-packet are transmitted from the output of register 399-1 to the information input of switch 398. From the first information output of switch 398, the bits of the sub-packet are transmitted to the first information input of switch 394. The corresponding signal of switching control is formed at the output of "AND" element 395-2 and is received by the first control input of switch 394. A control signal is transmitted from output 400-4 of the control unit 397-1 to an input of the "AND" element 395-2 (FIGS. 26, 27).

The second information output of switch 398 is used for transmission of the computing result to the external controlling system. The corresponding control signal is formed at the first output -of the decoder 406-1. The input of decoder 406-1 receives the bits of the code determining the type of the sub-packet. Information from the second information output of switch 398 together with the strobe of transmission from output 400-7 of control unit 397-1 is transmitted to output 393-4 of buffer 391-1 and through output 390-6 of the unit 389-k and the output 47-k of block 5 to the second information output 15 of the system.

Figure 7:
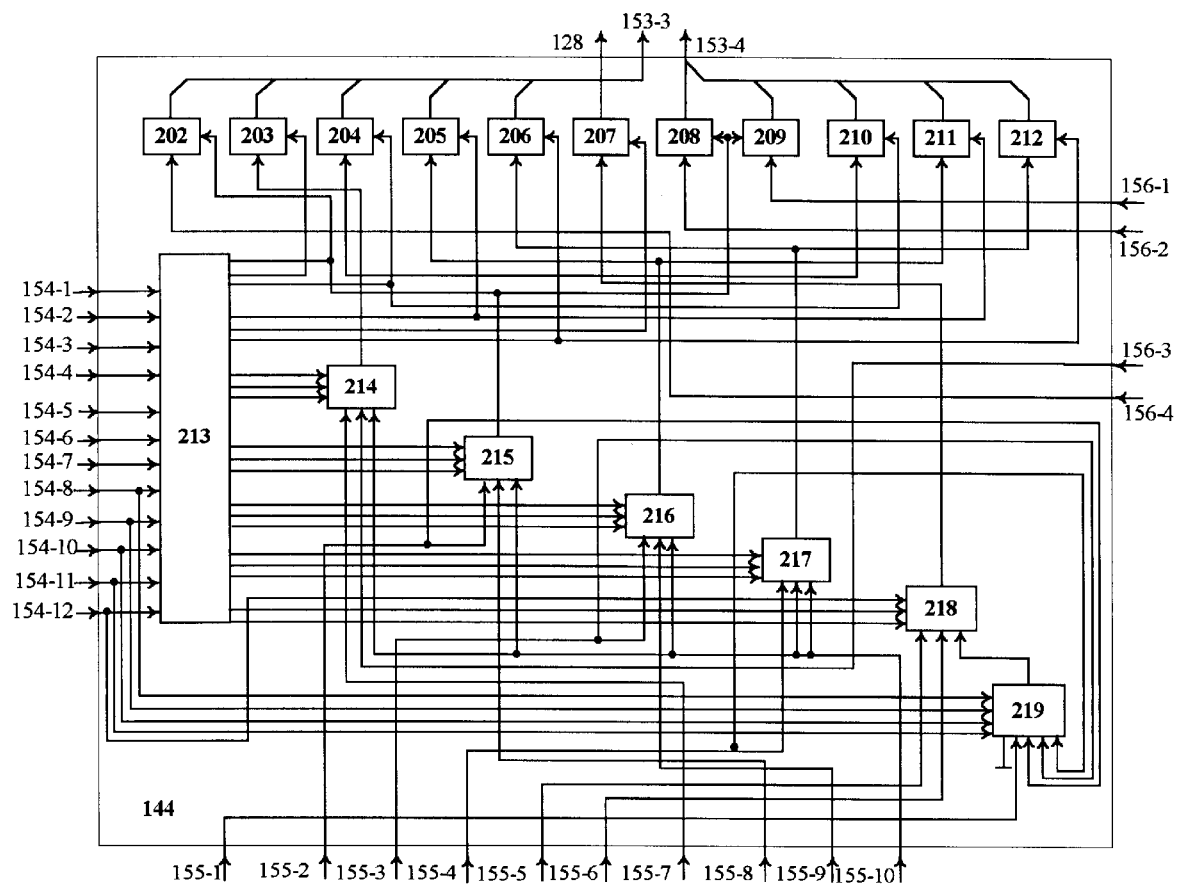
FIG. 7 is a diagram of the switching block of the device in FIG. 5.

Processing of bit fields of the package in executive device 106, including the determination by the instruction system operations of the functional fields of the status word, are realized in the switching block 144 (FIGS. 5,7). The corresponding control signals, which are formed at an output of decoder 178 are transmitted through output 152-3 of control unit 142 to inputs 154-1 . . . 154-12 of switching block 144. In block 144, the control signals of the switching group 214 . . . 219 are formed at outputs 244 . . . 263 of control unit 213 (FIG. 7). The information inputs of switching block 144 receive the bits of the functional fields of the status word, transmitted from the outputs 163-2 . . . 163-11 of the input register unit 149. The modified fields of the status and data words, formed on the registers 202 . . . 212, are transmitted through the information outputs of block 144 to the inputs 153-3 and 153-4 of the output switch 143, and from the output of switch 143 to the address and the second information outputs 127 and 129 of the executive device 106.

In addition to the operations of modification of functional fields, executive device 106 also carries out the operations of relations determination (for example, between the data values of two inputs of an instruction or between the values of separate functional bit groups). Such operations are run in ALU 147.

As for the rest, the working of the functional units of the executive device 106 is similar to the working of the corresponding units of the executive device 107. The transmission strobes and the bits of the result packet functional fields for the beginning of the ensuing computing cycle are formed on the corresponding control and information outputs 23-4, 25-4 and 25-5, 23-1, 25-1 and 25-2 of the k-th processor unit. Each processor unit processes the instructions without mutual synchronization with any of the other (N–1) processor units.

If the next package formed on information output 55 of the k-th block of associative memory is a starting package for the processing of the local part of a routine defined by fragment F, (a fragment routine), then bits of the functional fields are transmitted to buffer 551-1 in additional buffer unit 9 (see FIGS. 1; 41, 42, 45, and 46). In all other respects the further work of transmission of the starting package for fragment F is carried out according to the above mentioned transmission of a package from an output of buffer unit 5 through first additional switch 7 to the third and fourth information inputs 19 and 20 of processor device 1-i to third information input 74 of fragment routine processing unit 6-i.

The first additional switch 7 functions to select the first free unit 6-k from the group of fragment routine processing units (6-1 . . . 6-N).

The third information input 74 and fourth control input 71 of fragment routine processing unit 6-k correspondingly receive bits of the functional fields of the information package and the accompanying strobe of transmission from the information and control outputs 84-2-k and 84-1-k of the k-th group of exchange outputs of first additional switch 7.

Under the direction of output control signals received on outputs 486 and 487 of the control unit, information from input 74 of unit 6-k is transmitted through output 493 of switch 464 to input 479 of input register unit 462. Input 478-5 of input register unit 462, receives a strobe of transmission from output 488 of control unit 463. In contrast to the processor units 1-1 . . . 1-N, where each package processed is addressed to the associative memory modules 4-1 . . . 4-N, in each fragment routine processing unit definite parts (fragments) of the main routine are completely processed and only final results are transmitted to the associative memory modules 4-1 . . . 4-N.

Loading of routines (corresponding to the von Neumann principles of processing) is performed at the time of initial loading of the computer system. Both instructions and data are transmitted through the first information input 10 of the system and the first informational input 72 of fragment routine processing unit 6-i to input 475 of loading register unit 461. Then, bits of functional fields of instructions (corresponding to system of instructions of executive unit 459) and data are transmitted from output 477 of unit 461 to informational input 466 of unit 459 and are accompanied by signals of interruption from outputs 476-1 and 476-2 to inputs 465-2 and 465-3, respectively, of unit 459.

Through the exchange bus 496, under the control of microprocessor 494, instructions and data of fragments of running routines are loaded in memory 495.

After input 479 of unit 462 receives a start package of a fragment and input 478-5 receives the corresponding strobe of transmission, registers 504 and 505 receive operands and register 508 receives the status word field of F. When a strobe of transmission is present at input 478-5, trigger 509 is set and a signal of interruption is formed on output 480-2. The signal of interruption is received by input 465-2 of unit 459 together with a bit field which is received by information input 466 of unit 459 from output of register 508 under the control of a "reading" signal from the output of trigger 509 through output 481 of unit 462.

Microprocessor 494 "identifies" bit fields transmitted from output 466 of unit 459 through exchange bus 496 and transmits a group of control signals through outputs 468-1 . . . 468-4 to inputs 478-2 . . . 478-3 of unit 462. In unit 462 the corresponding signals of sequential reading and transmission of data are transmitted from registers 504 and 505 through output 481 to information input 466 of unit 459. Microprocessor 494, in accordance with the number and parameters of fragment F, starts the corresponding routing of processing which is terminated by interruption of microprocessor 494. By this interruption, microprocessor 494 forms the "vector of output" which corresponds to the current number assigned to register 503 of unit 460. The "vector of output" (accompanied by a control signal transmitted from output 468 of executive unit 459 through exchange bus 496 and output 467 of executive unit 459 to input 469-7 of unit 460) is transmitted to input 470 of unit 460 where information is written in register 503. From register 503 it is transmitted to an input of decoder 501-1. The signal of interruption is formed on an output of decoder 501-1 and is transmitted through output 472-1 to input 465-2 of executive unit 459.

Upon receipt of the signal of interruption microprocessor 494 forms a group of control signals which are transmitted through outputs 468-1 . . . 468-4 of executive unit 459 to outputs 469-3 . . . 469-6 of unit 460. These control signals direct the transmission of bit fields representing the result of processing of fragment F from output 467 of unit 459 through input 470 of unit 460 to inputs of registers 497 and 498.

The format of data in registers 497 and 498 is the same as that of a half-package resulting from the processing of instructions in processor device 1-i.

The strobe of transmission is transmitted from output 471-3 of unit 460 to output 76 of fragment routine processing unit 6-k. From output 76 of unit 6-k it is transmitted to input 62-k of the third group of control inputs of first switch 2. The address and functional field bits of half-packages resulting from the fragment routine processing are transmitted from outputs 77 and 78 of unit 6-k to input 63-k of the second group of address inputs and input 64-k of second group of information inputs of switch 2. The address indicates the number of the associative memory module 4-j where the starting instruction of the processing of fragment F was allocated. Input 52 of the associative memory module 4-j receives bit fields of half-package from output 66-j of the group of information outputs. This results in a combining of the data resulting from the processing of fragment F with the common fields of the running routine.

If processor fragment F has additional common field input of running routines Kd-1 . . . Kd-m (see FIG. 42), starting unit 6-k appends an "instruction model" Kdb-1 . . . Kdbm to enable processing. The status word field NB (see FIG. 43) contains a number corresponding to the starting unit 6-k in which the fragment routine is being processed.

Packages of additional addressing (as the data are ready) are formed on an output of associative memory module 4-j for processing of a locally selected fragment F. These packages are transmitted from information output 55 of block 4-j of associative memory to input 96-j of the group of information inputs of the additional buffer unit 9 and then to input 552-3 of buffer 551-2. The package of additional addressing is received by information input 89-j of second additional switch 8 from output 101-j of additional buffer unit 9, and address input 87-j of second additional switch 8 receives bit field NB of package corresponding to number of the starting fragment routine processing unit 6-k. As a result, output 91 of the second additional switch receives information fields of bits of the package of additional addressing which are then transmitted to second information input 73 of fragment routine processing unit 6-k. Further work is performed analogously to the transmission and processing of start package of fragment F.

Thus, the described computer system provides a high performance by means of increasing the load of the processor units and obtaining in this way a decrease of the working programs running time. Then, a high parallelism of the processor unit's working is obtained automatically and there is no need to distribute the group parallel processes between separate computational structures (executive devices) inside every running program, or between programs, which is usually carried out by a person, who may become unable to cope with this problem when the number of parallel computing structures increases.

Thus the inclusion in the computer system structure of fragment routine processing units, first and second additional switches and an additional buffer unit reduces the volume needed of the associative memory modules, performs processing by von Neumann principles of computation of locally separated parts of routines (or entire routines) which have low inner parallelism, and uses flow control for processing of the main running routines. This results in an increased performance of the system and an improved efficiency in processing routines with practically no loss of time for distribution of tasks between units for fragment processing.

What is claimed is:

1. A computer system containing N processor device, first and second switches, N devices of associative memory, buffer unit, information inputs from first to third, control input, first and second information outputs, here first control outputs and address outputs of the i-th processor device (where i=1 . . . N, and N is a positive integer) are connected with i-th input of the first group of control inputs and with i-th input of the first group of the address inputs of the first switch correspondingly, first and second information outputs of the i-th processor modules are connected with the corresponding i-th input of the first group of information inputs of the first switch, first information, address, control and second information, address and control inputs of the i-th processor device are connected with first and second information inputs of system, the control input of which is connected with control input of the first switch and with the third control input of the i-th processor device, control output of the first switch is connected with the fourth control input of the i-th processor device, the third information output of which is connected with the first information output of system, first control and information, second control and information outputs of the i-th group of outputs of exchange of the second switch are connected with fifth control and third information inputs, sixth control and fourth information inputs of the i-th processor device correspondingly, first group of control outputs of the second switch is connected with the first group of control inputs of the buffer unit, the second group of control outputs of the second switch is connected with the second group of control inputs of buffer unit, control inputs of the second switch and buffer unit and first control input of each blocks of associative memory are connected with control input of system, i-th inputs of the first and second groups of control inputs of the second switch are connected with second and third control outputs of the i-th processor device correspondingly, seventh and eighth control inputs of which are connected with i-th outputs of the first and second group of control outputs of buffer unit correspondingly, third group of control and first group of information outputs of which are connected with the third group of control inputs and first group of information inputs of the second switch correspondingly, second group of information outputs of buffer unit is connected with the second information output of system, fourth group of control inputs of the second switch is connected with fourth group of control outputs of buffer unit, i-th input of the first group of information inputs of which is connected with fourth and fifth information outputs of i-th processor device, fourth control output of which is connected with i-th input of the third group of control inputs of the buffer unit, third group of information outputs of which is connected with the second group of information inputs of the second switch, first control output of the i-th block of associative memory is connected with i-th input of the second group of control inputs of the first switch, i-th output of group of information outputs of which is connected with information input of i-th associative memory block, information and second control outputs of which are connected with i-th inputs of the second group of information and fourth group of control inputs of buffer unit, third group of information inputs of which is connected with the third information input of system and i-th output of group of control outputs of the first switch is connected with the second control input of i-th associative memory, different in that it contains units for processing of fragments of routines, first and second additional switches and additional buffer units, here the control unit of the first switch is connected with the first control input of the i-th unit for routine fragments processing, first information input of which is connected with first information input of system whose control input is connected with control inputs of first and second additional switches, additional buffer unit and second control unit of the i-th unit of routine fragment processing, third control input of which is connected with i-th output of group of control outputs of the second additional switch, i-th output of group of information outputs of which is connected with second information input of i-th unit of routine fragments processing, third information input of which is connected with information output of the i-th group of outputs of exchange of the first additional switch, control input of the i-th group of outputs of exchange of which is connected with fourth control input of i-th unit of routine fragments processing, first control output of which is connected with i-th input of the first group of control inputs of the second additional switch and i-th input of the first group of control inputs of the first additional switch, second group of control inputs of which is connected with the first group of control outputs of additional buffer unit, first group of information outputs of which is connected with the group of information inputs of the first additional switch, group of control outputs of which is connected with the first group of control inputs of the additional buffer unit, second group of control outputs of which is connected with the second group of control inputs of the second additional switch, group of address and group of information inputs of which are connected with the second group of information outputs of additional buffer unit, second group of control inputs of which is connected with control output of the second additional switch, information output and second control output of i-th associative memory block are connected with i-th inputs of group of information and third group of control inputs of additional buffer unit correspondingly and second control, address and information outputs of the i-th unit of routine fragments processing are connected with i-th inputs of third group of control, second group of address and second group of information inputs of the first switch correspondingly, computer system different in that the unit of routine fragments processing contains executive unit, unit of output registers, unit of registers of loading, unit of input registers, unit of control and switch, here the information output of executive unit is connected with information input of unit of output registers, first control input of which is connected with first control input of unit, second control input of which is connected with first control input of executive unit, second control input of unit of output registers, first control input of control unit, first control input of unit of registers of loading and with first control input of unit of input registers, first control output of which is connected with second control input of control unit and first control output of unit, first information input of which is connected with information input of unit of registers of loading, information output of which and information output of unit of input registers are connected with information input of executive unit, second control input of which is connected with first control output of unit of output registers, first control output of unit of registers of loading and second control output of unit of input registers, third control output of which, second control output of unit of registers of loading and second control output of unit of output registers are connected with third control input of executive unit, first control output of which is connected with the second control input of unit of registers of loading, second control input of unit of input registers and third control input of unit of output registers, third control output of which is connected with second control output of unit, second information input of which is connected with first information input of switch, information output of which is connected with information input of unit of input registers, third control unit of which, third control input of unit of registers of loading and fourth control input of unit of output registers are connected with the second control output of executive unit, third control output of which is connected with fourth control input of unit of input registers, with fourth control input of unit of registers of loading and fifth control input of unit of output registers, address and information output of which are connected correspondingly with address and information outputs of unit, third control input of which is connected with third control input of control unit, fourth control input of which is connected with the fourth control input of unit, third information input of which is connected with second information input of switch, first and second control input of which are connected correspondingly with first and second control outputs of control unit, third control output of which is connected with fifth control input of unit of registers of loading, sixth control input of unit of output registers are fourth control output of executive unit, fifth control output of which is connected with seventh control input of unit of output registers.

2. A computing system comprising a data flow portion of said system and a fragment routine processing unit portion of said system;

said data flow portion comprising at least one processor unit, at least one associative memory module, at least one first switch, at least one second switch, and buffering means;

each said processor unit comprising at least one first executive device and at least one second executive device, wherein each said first executive device is best suited to processing control instructions and each said second executive device is best suited to processing operands;

wherein each said first switch uses a fixed address switching regime to transmit information from a processor unit to an associative memory module;

wherein each said second switch uses a free address switching regime to transmit control instructions to a free first executive device and wherein each said second switch uses a free address switching regime to transmit operands to a free second executive device;

said fragment routine processing unit portion of said system comprising at least one fragment routine processor unit, at least one first additional switch, at least one second additional switch, and additional buffering means;

wherein, each said first additional switch uses a free address switching regime to transmit an information package from an additional buffer to a fragment routine processor unit, a. control output of each module of associative memory is connected with an input of said additional buffering means, an information output of each module of associative memory is connected with an information input of said additional buffering means, a control output of each fragment routine processing unit is connected with a control input of a first switch, an address output of each fragment routine processing unit is connected with an address input of a first switch, an information output of each fragment routine processing unit is connected with an information input of a first switch, and a control unit of a first switch is connected with a control input of each fragment routine processing unit.

* * * * *